United States Patent
Masuoka et al.

(10) Patent No.: US 9,484,268 B2
(45) Date of Patent: Nov. 1, 2016

(54) SEMICONDUCTOR DEVICE AND PRODUCTION METHOD

(71) Applicant: Unisantis Electronics Singapore Pte. Ltd., Peninsula Plaza (SG)

(72) Inventors: Fujio Masuoka, Tokyo (JP); Hiroki Nakamura, Tokyo (JP)

(73) Assignee: UNISANTIS ELECTRONICS SINGAPORE PTE LTD., Peninsula Plaza (SG)

( * ) Notice: Subject to any disclaimer, the term of this patent is extended or adjusted under 35 U.S.C. 154(b) by 0 days.

(21) Appl. No.: 14/696,700

(22) Filed: Apr. 27, 2015

(65) Prior Publication Data
US 2015/0235907 A1    Aug. 20, 2015

Related U.S. Application Data

(62) Division of application No. 14/035,371, filed on Sep. 24, 2013, now Pat. No. 9,059,309, which is a division of application No. 12/854,564, filed on Aug. 11, 2010, now Pat. No. 8,558,317.

(60) Provisional application No. 61/274,164, filed on Aug. 12, 2009, provisional application No. 61/335,026, filed on Dec. 29, 2009.

(30) Foreign Application Priority Data

Aug. 11, 2009  (JP) .................................. 2009-186518
Dec. 28, 2009  (JP) .................................. 2009-297210

(51) Int. Cl.
H01L 21/8238    (2006.01)

(52) U.S. Cl.
CPC ................ *H01L 21/823885* (2013.01); *H01L 21/823807* (2013.01); *H01L 21/823857* (2013.01)

(58) Field of Classification Search
CPC ................ H01L 21/823885; H01L 2/823857; H01L 21/823807
USPC ....... 257/222, 225, 255, 291, 292, 295, 296, 257/302, 306, 329, 369, 401, 623, E27.062, 257/E21.632; 438/199
See application file for complete search history.

(56) References Cited

U.S. PATENT DOCUMENTS 4,670,768 A     6/1987   Sunami et al.
5,244,824 A *   9/1993   Sivan ................ H01L 27/10876
                                                     257/302

(Continued)

FOREIGN PATENT DOCUMENTS

EP    0 020 929    1/1981
EP    0 334 927    12/1993

(Continued)

OTHER PUBLICATIONS

S. Watanabe et al., "A Novel Circuit Technology with Surrounding Gate Transistors (SGT's) for Ultra High Density DRAM's," IEEE JSSC, vol. 30, No. 9, Sep. 1995.

(Continued)

*Primary Examiner* — Marc Armand
*Assistant Examiner* — Sue Tang
(74) *Attorney, Agent, or Firm* — Brinks Gilson & Lione

(57) ABSTRACT

The object to provide a semiconductor device comprising a highly-integrated SGT-based CMOS inverter circuit is achieved by forming an inverter which comprises: a first transistor including; an first island-shaped semiconductor layer; a first gate insulating film; a gate electrode; a first first-conductive-type high-concentration semiconductor layer arranged above the first island-shaped semiconductor layer; and a second first-conductive-type high-concentration semiconductor layer arranged below the first island-shaped semiconductor layer, and a second transistor including; a second gate insulating film surrounding a part of the periphery of the gate electrode; a second semiconductor layer in contact with a part of the periphery of the second gate insulating film; a first second-conductive-type high-concentration semiconductor layer arranged above the second semiconductor layer; and a second second-conductive-type high-concentration semiconductor layer arranged below the second semiconductor layer.

8 Claims, 66 Drawing Sheets

(56) References Cited

U.S. PATENT DOCUMENTS

| | | | |
|---|---|---|---|
| 5,427,962 | A | 6/1995 | Sasaki et al. |
| 5,480,838 | A | 1/1996 | Mitsui |
| 5,550,084 | A | 8/1996 | Anjum et al. |
| 5,599,725 | A | 2/1997 | Dorleans et al. |
| 5,656,842 | A | 8/1997 | Iwamatsu et al. |
| 5,696,008 | A | 12/1997 | Tamaki et al. |
| 5,773,329 | A | 6/1998 | Kuo |
| 5,994,735 | A | 11/1999 | Maeda et al. |
| 6,235,568 | B1 | 5/2001 | Murthy et al. |
| 6,323,528 | B1 | 11/2001 | Yamazaki et al. |
| 6,373,099 | B1 | 4/2002 | Kikuchi et al. |
| 6,461,900 | B1 * | 10/2002 | Sundaresan ....... H01L 21/82388 257/E21.643 |
| 6,653,181 | B2 | 11/2003 | Hergenrother et al. |
| 6,867,084 | B1 | 3/2005 | Chiu et al. |
| 8,039,893 | B2 | 10/2011 | Masuoka et al. |
| 2001/0002715 | A1 | 6/2001 | Armacost et al. |
| 2002/0017687 | A1 | 2/2002 | Yamazaki et al. |
| 2002/0164858 | A1 | 11/2002 | Sayama et al. |
| 2005/0212063 | A1 | 9/2005 | Nakano et al. |
| 2006/0261406 | A1 * | 11/2006 | Chen ................. H01L 21/82382 257/329 |
| 2008/0062756 | A1 | 3/2008 | Mayor et al. |
| 2008/0070351 | A1 * | 3/2008 | Oue .................... H01L 27/1255 438/155 |
| 2009/0146194 | A1 | 6/2009 | Moselund et al. |
| 2009/0148992 | A1 | 6/2009 | Oyu |
| 2009/0189222 | A1 | 7/2009 | Shino |
| 2010/0213525 | A1 | 8/2010 | Masuoka et al. |
| 2010/0219482 | A1 | 9/2010 | Masuoka et al. |
| 2010/0244140 | A1 | 9/2010 | Masuoka et al. |
| 2010/0264484 | A1 * | 10/2010 | Masuoka .......... H01L 21/82382 257/329 |
| 2010/0308422 | A1 | 12/2010 | Masuoka et al. |
| 2011/0062521 | A1 | 3/2011 | Masuoka et al. |

FOREIGN PATENT DOCUMENTS

| | | |
|---|---|---|
| EP | 0 721 221 | 7/1996 |
| EP | 1507294 | 2/2005 |
| EP | 2 061 075 | 5/2009 |
| EP | 2 234 150 | 9/2010 |
| EP | 2 259 315 | 12/2010 |
| JP | 60-070757 | 4/1985 |
| JP | 62-045058 | 2/1987 |
| JP | 02-066969 | 3/1990 |
| JP | 02-188966 | 7/1990 |
| JP | 03-225873 | 10/1991 |
| JP | 05-291518 | 11/1993 |
| JP | 08-051203 | 2/1996 |
| JP | 2001-028399 | 1/2001 |
| JP | 2004-319808 | 11/2004 |
| JP | 2005-310921 | 11/2005 |
| JP | 2007-250652 | 9/2007 |
| JP | 2008-066562 | 3/2008 |
| JP | 2008-205168 | 9/2008 |
| JP | 2008-300558 | 12/2008 |
| JP | 2009-038226 | 2/2009 |
| JP | 2010-283181 | 12/2010 |
| TW | 502446 | 9/2002 |
| TW | I256089 | 6/2006 |
| WO | WO 2009/057194 | 5/2009 |
| WO | WO 2009/060934 | 5/2009 |
| WO | WO 2009/096464 | 8/2009 |
| WO | WO 2009/096470 | 8/2009 |

OTHER PUBLICATIONS

Office Action for U.S. Appl. No. 13/534,615 dated Feb. 15, 2013, 10 pages.

Notice of Allowance for U.S. Appl. No. 12/882,698 dated Feb. 21, 2013, 8 pages.

Chen, Yijan et al., "Vertical Integrated-Gate CMOS for Ultra-Dense IC", Microelectric Engineering, vol. 83, 2006, pp. 1745-1748.

European Search Report for European Application No. 10 00 3151 dated Mar. 5, 2012, 9 pages.

European Search Report for European Application No. 10 00 9573 dated Feb. 24, 2012, 10 pages.

European Search Report for European Application No. 2259315 dated May 3, 2011, 4 pages.

Korean Office Action (with English Language translation) for Korean Patent Application No. KR 2010-52973 dated Nov. 22, 2011, 5 pages.

Korean Office Action (with English Language translation) for Korean Patent Application No. KR 2010-52973 dated Aug. 4, 2011, 5 pages.

Notice of Allowance for U.S. Appl. No. 12/729,977 dated Jun. 5, 2012, 10 pages.

Notice of Allowance for U.S. Appl. No. 12/729,977 dated Oct. 9, 2012.

Office Action for U.S. Appl. No. 12/794,088, dated May 23, 2012, 20 pages.

Office Action for U.S. Appl. No. 12/794,088 dated Oct. 15, 2012, 22 pages.

Office Action for U.S. Appl. No. 12/882,698 dated Jul. 9, 2012, 29 pages.

Office Action for U.S. Appl. No. 12/882,698 dated Oct. 5, 2012, 17 pages.

Takato et al., "High Performance CMOS Surrounding Gate Transistor (SGT) for Ultra High Density LSIs", IEEE Electron Devices Meeting, Technical Digest; 1988, pp. 222-225 IEDM.

Wolf, S. "Silcon Processing for the VLSI Era", vol. 3—"The Submicron MOSFET", Lattice Press, Sunset Beach, California (USA), 1995.; section 4.1.1: Basics of MOSFET Operation, pp. 136-138.

Notice of Allowance for U.S. Appl. No. 13/534,615 dated Jun. 7, 2013, 9 pages.

Search Report for European Patent Application Serial No. 10 00 8387, dated Jun. 28, 2013, 6 pages.

Office Action for U.S. Appl. No. 12/854,564 dated Dec. 4, 2012, 16 pages.

Office Action for U.S. Appl. No. 12/854,564 dated Apr. 23, 2013, 14 pages.

Notice of Allowance for U.S. Appl. No. 12/854,564 dated Jul. 10, 2013, 13 pages.

Office Action for U.S. Appl. No. 14/035,371 dated Jul. 29, 2014, 4 pages.

Restriction Requirement for U.S. Appl. No. 14/035,371 dated Oct. 8, 2014, 5 pages.

Office Action for U.S. Appl. No. 14/035,371 dated Jan. 15, 2015, 10 pages.

Notice of Allowance for U.S. Appl. No. 14/035,371 dated Mar. 19, 2015, 8 pages.

* cited by examiner

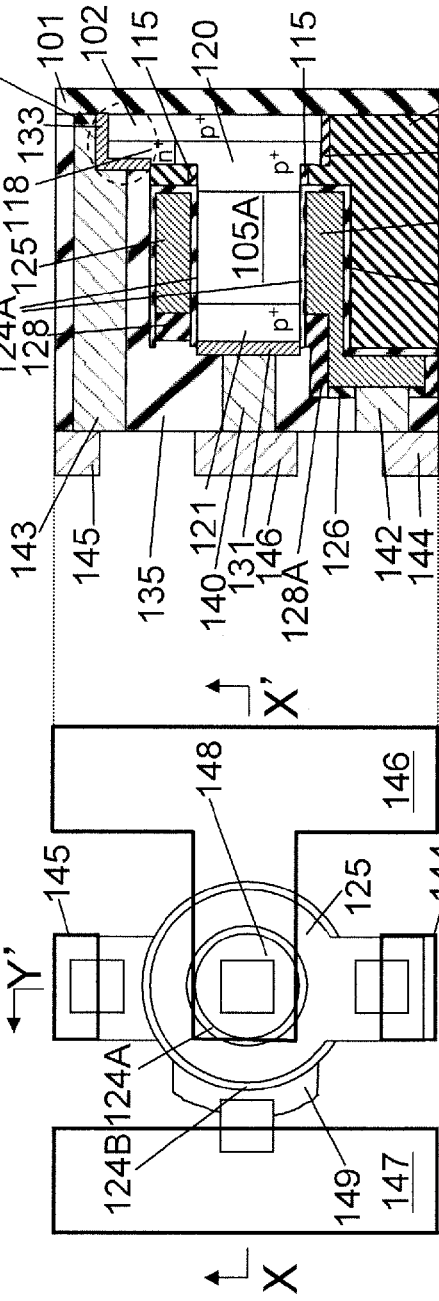
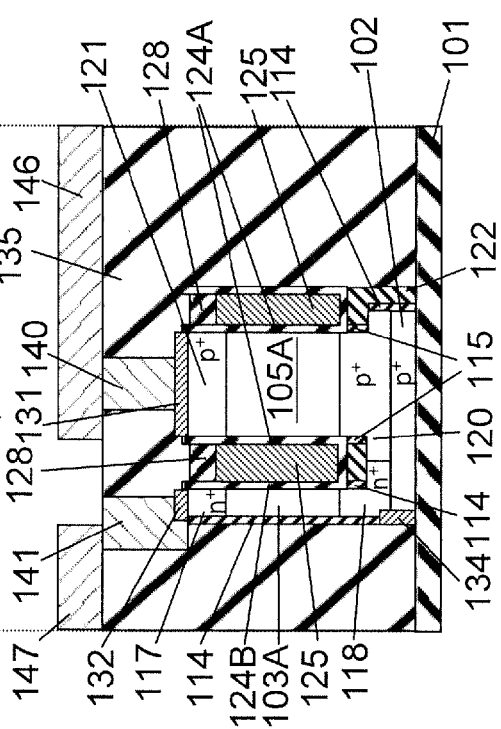

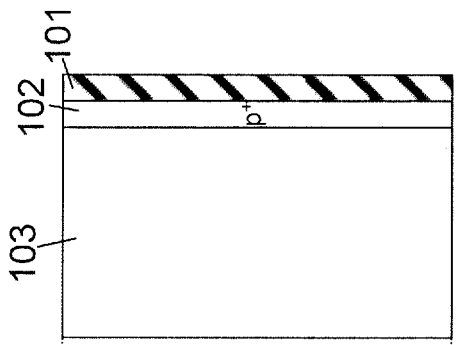
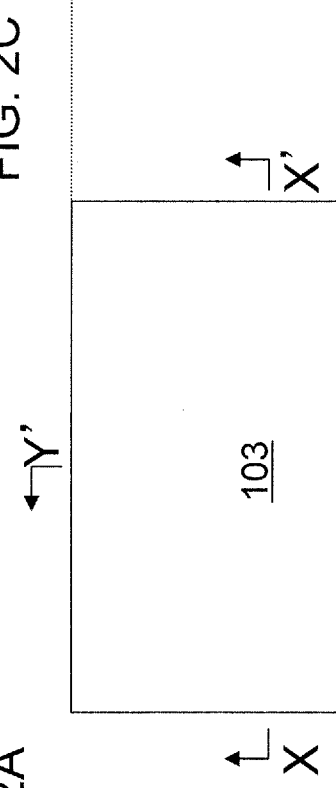
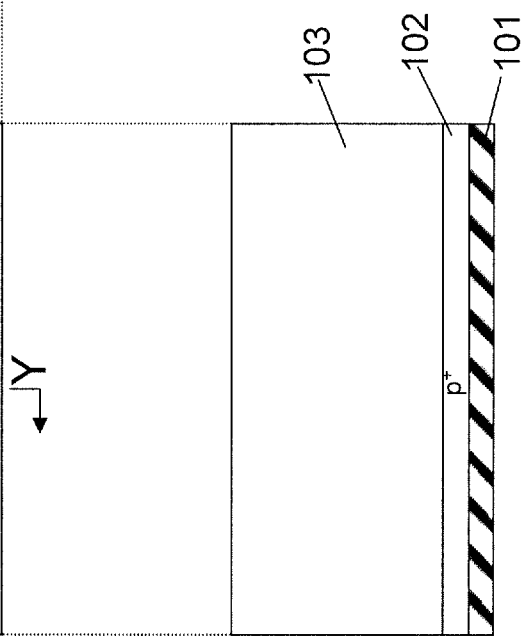

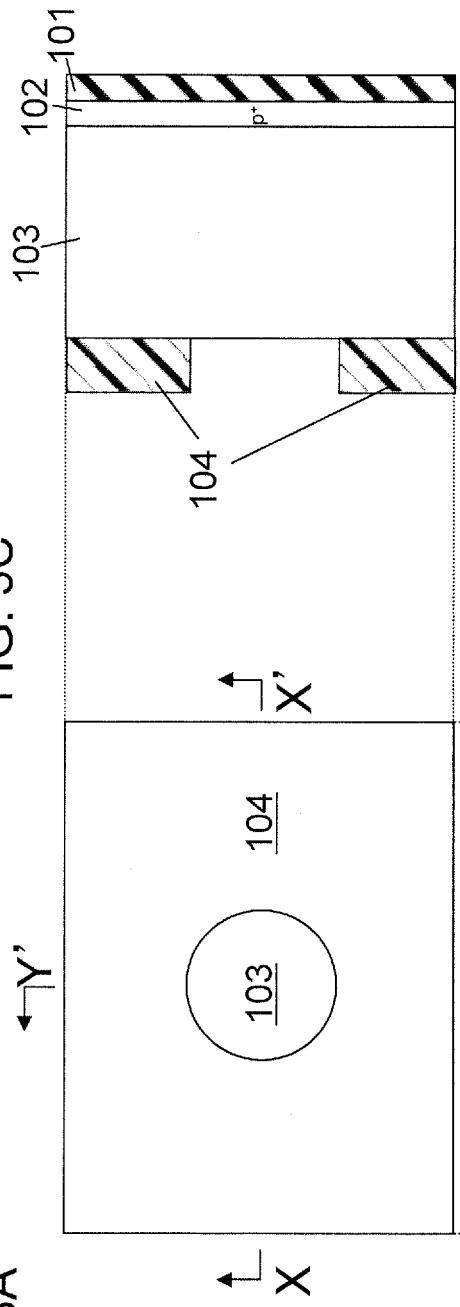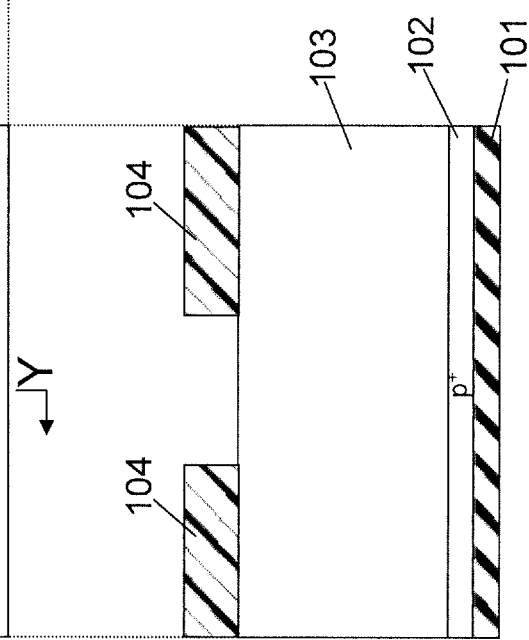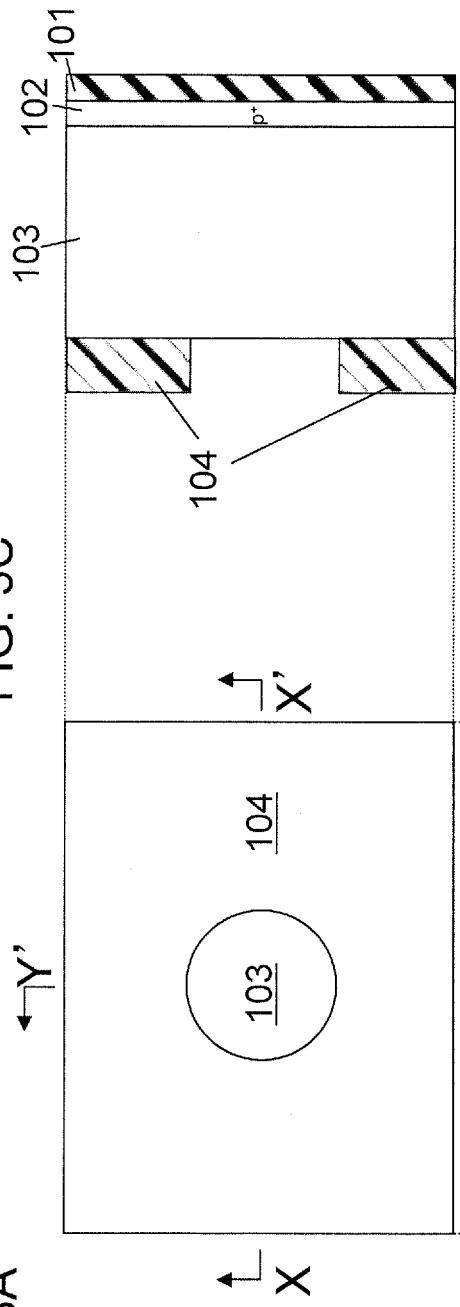

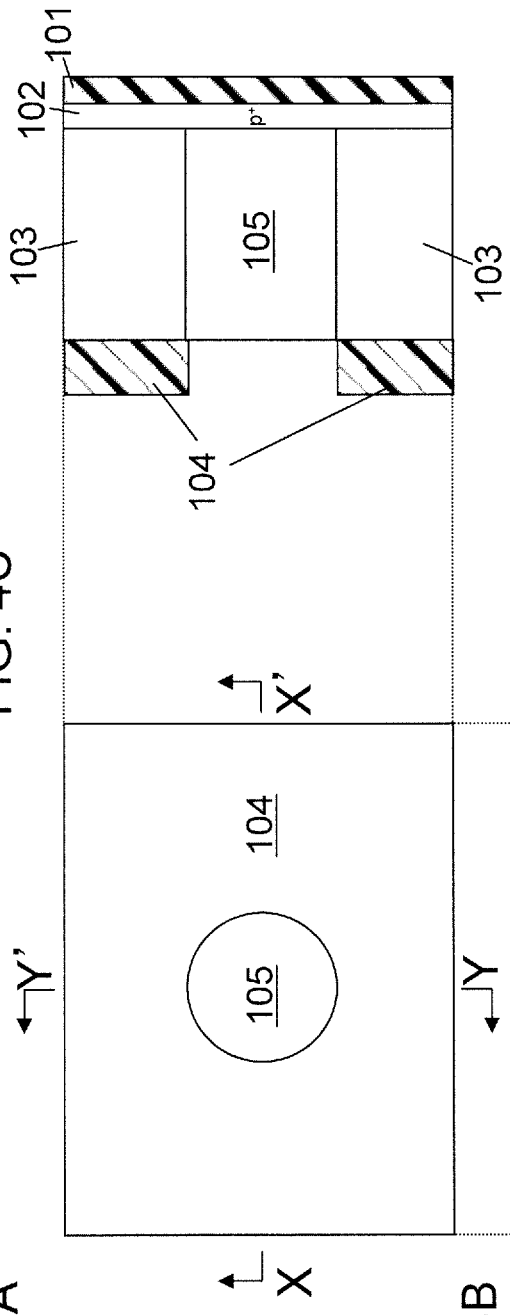
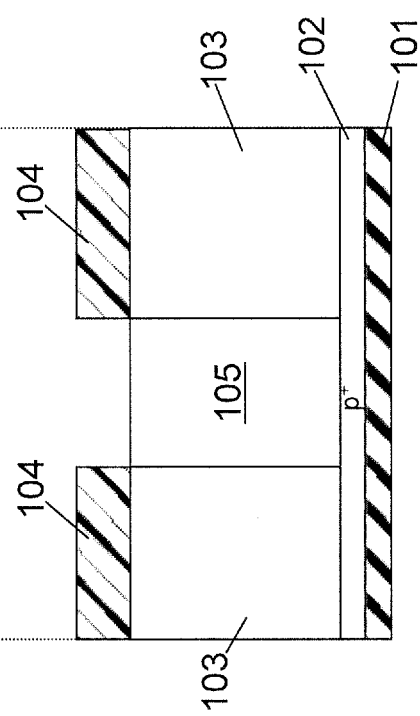
FIG. 4A  FIG. 4B  FIG. 4C

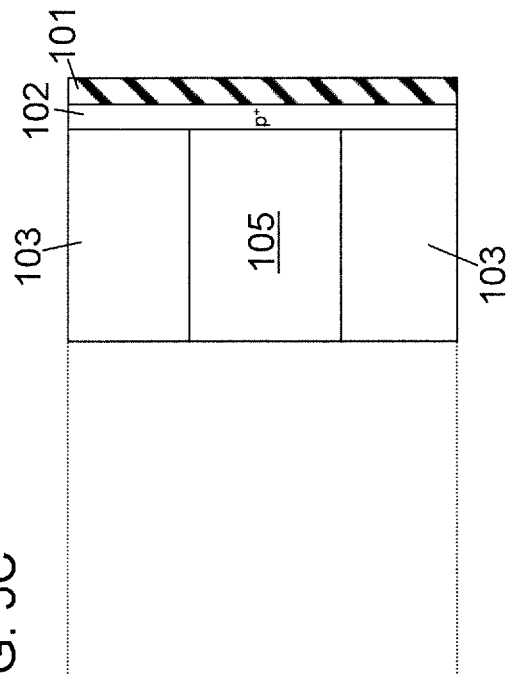
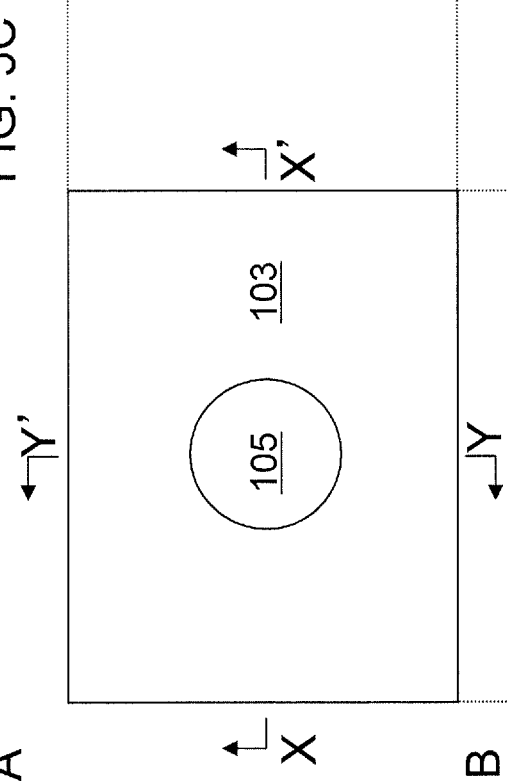
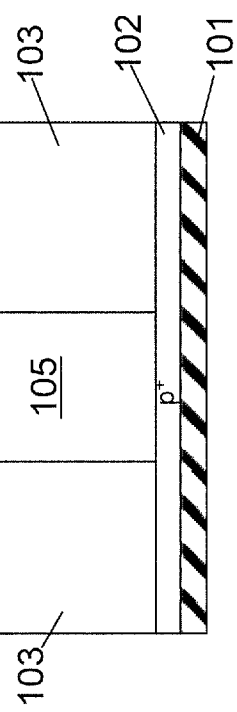

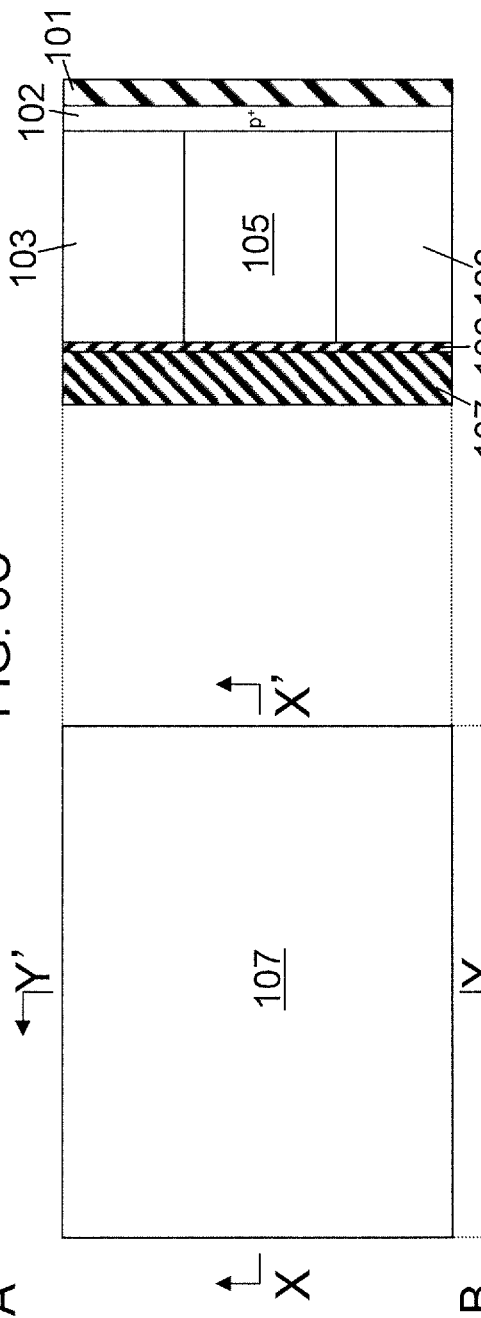

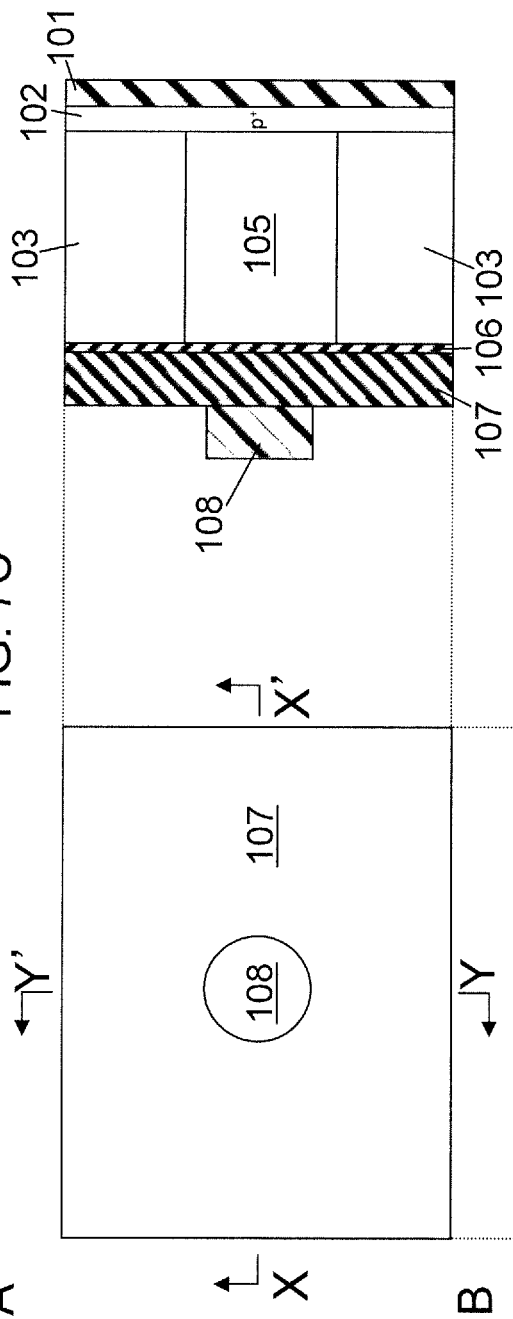
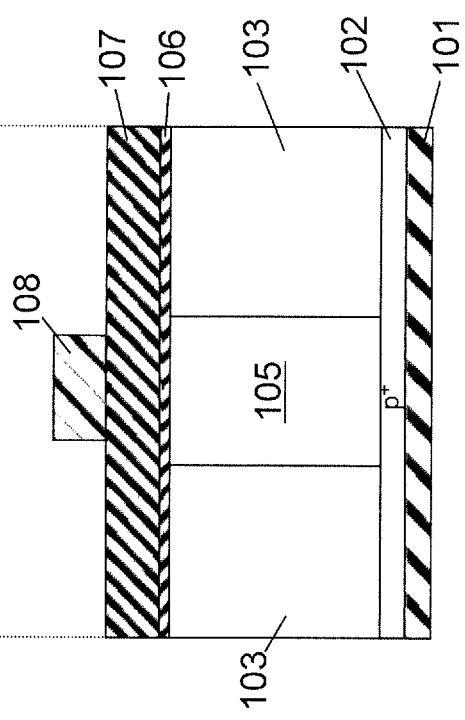
FIG. 7A
FIG. 7B
FIG. 7C

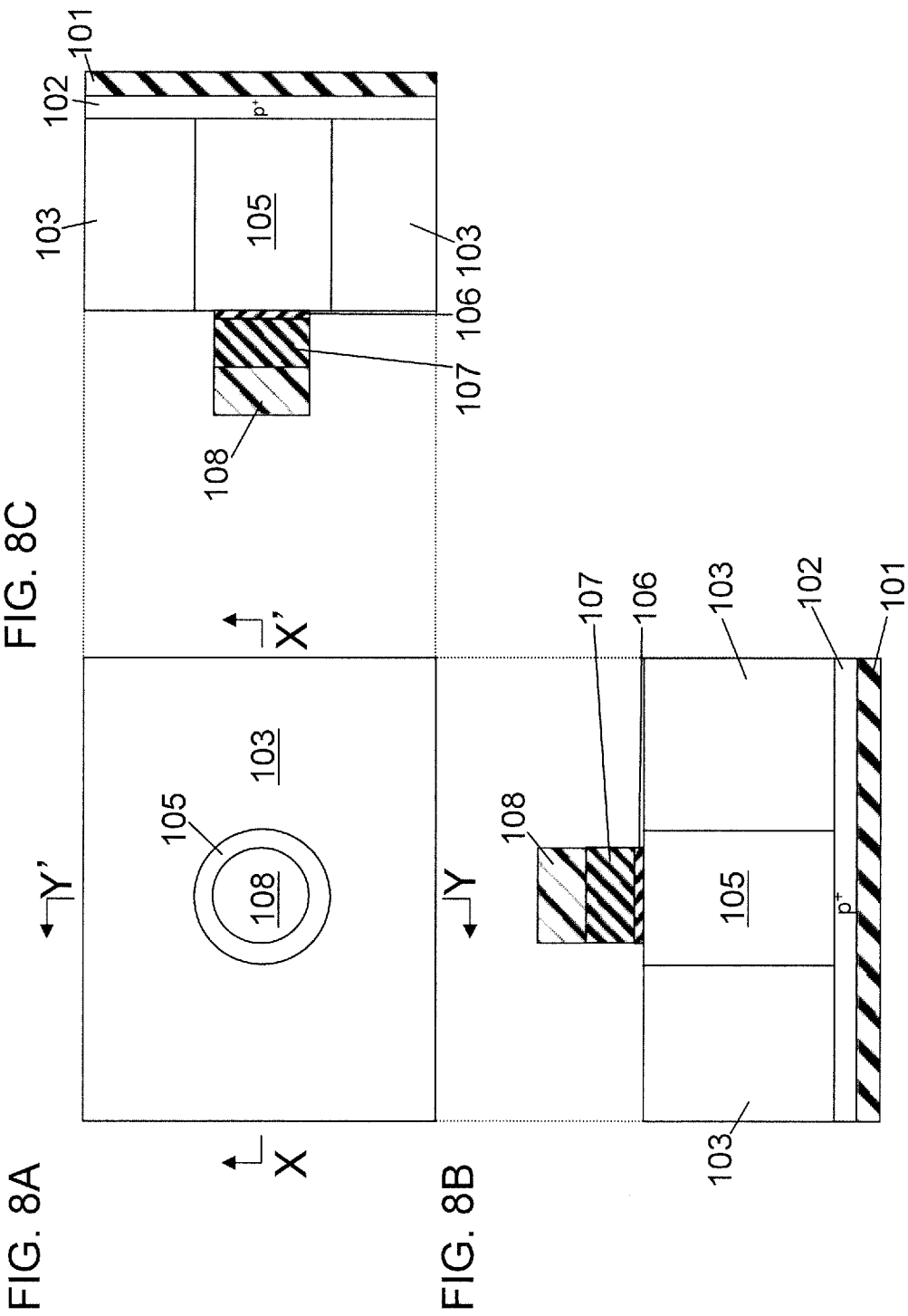

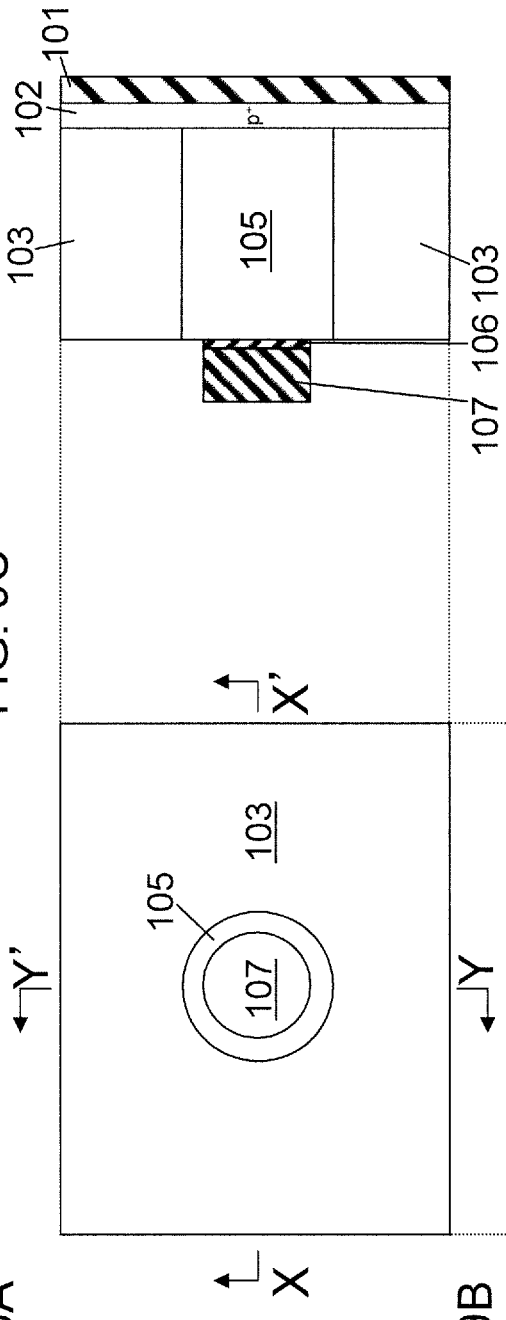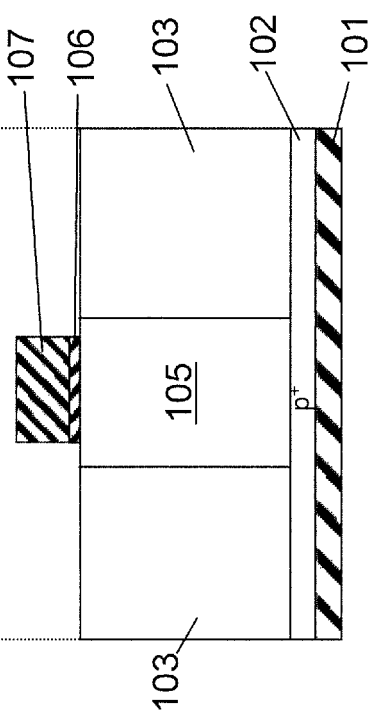

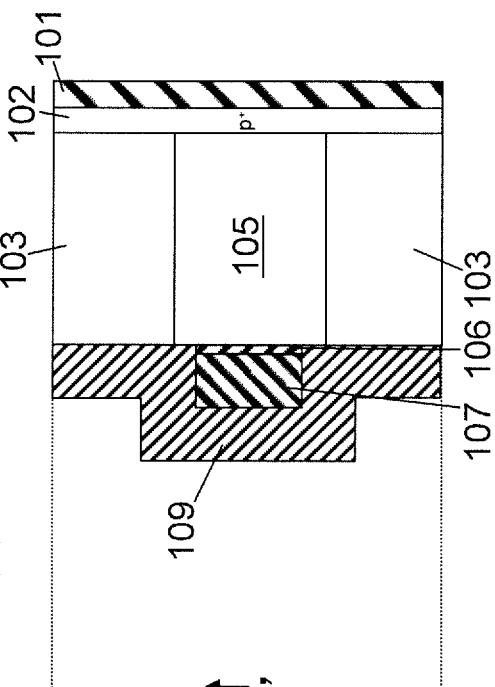
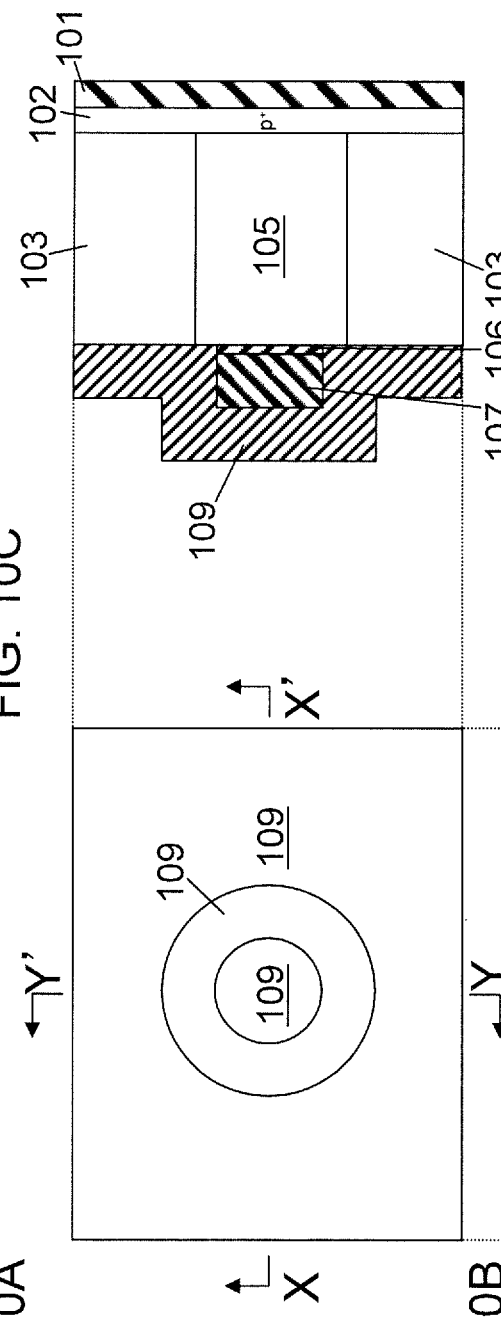
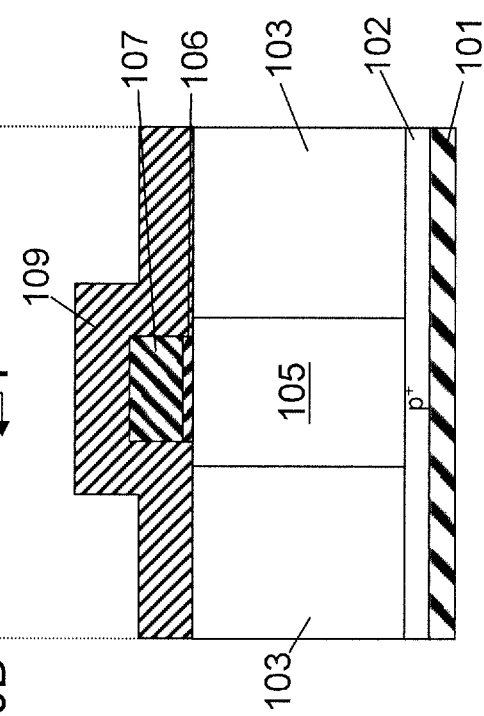
FIG. 10A
FIG. 10B
FIG. 10C

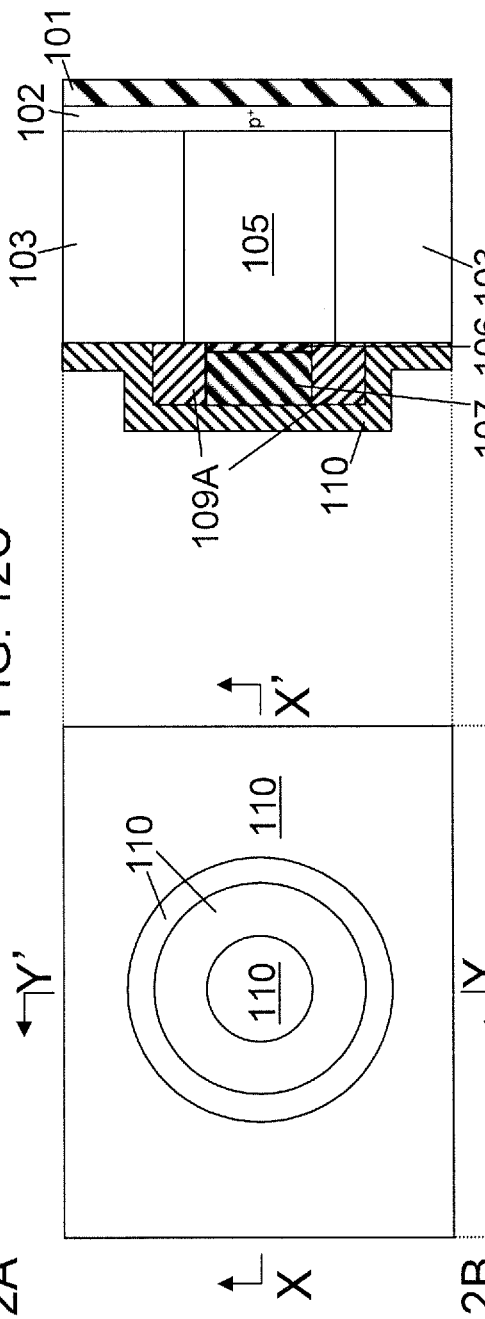
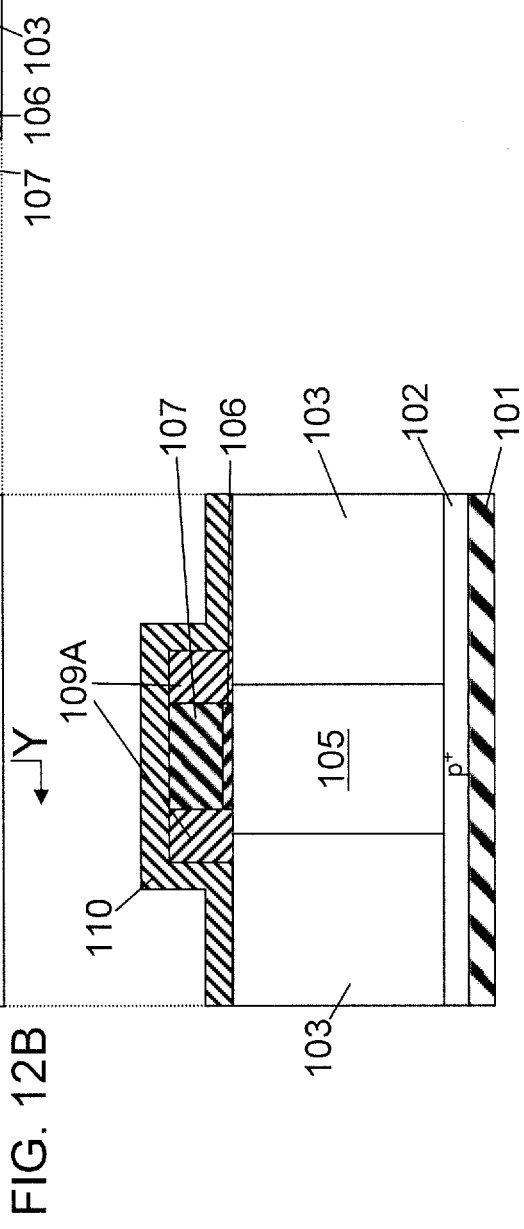
FIG. 12A
FIG. 12B
FIG. 12C

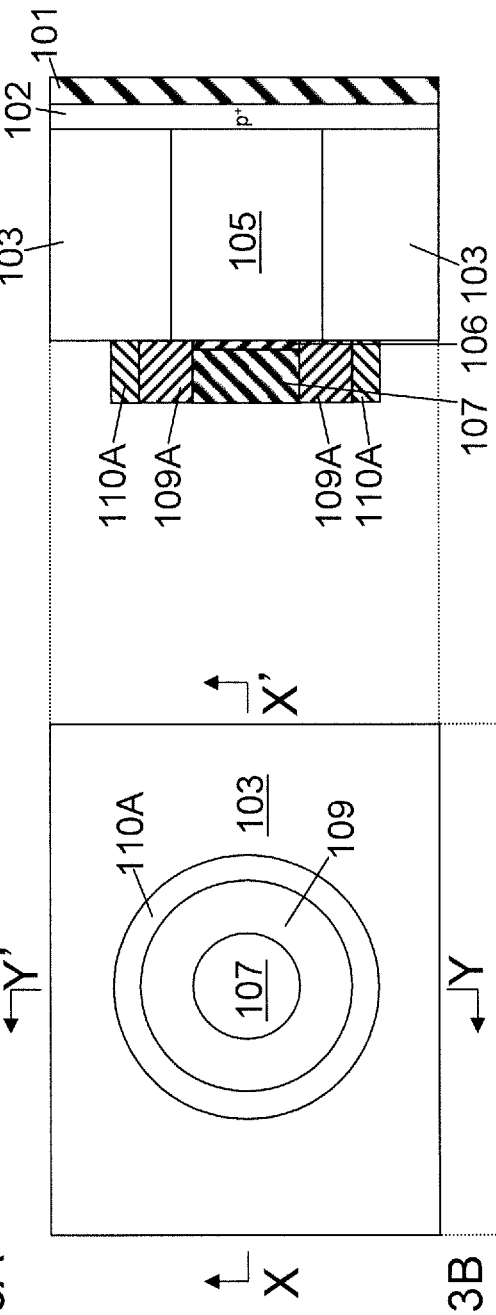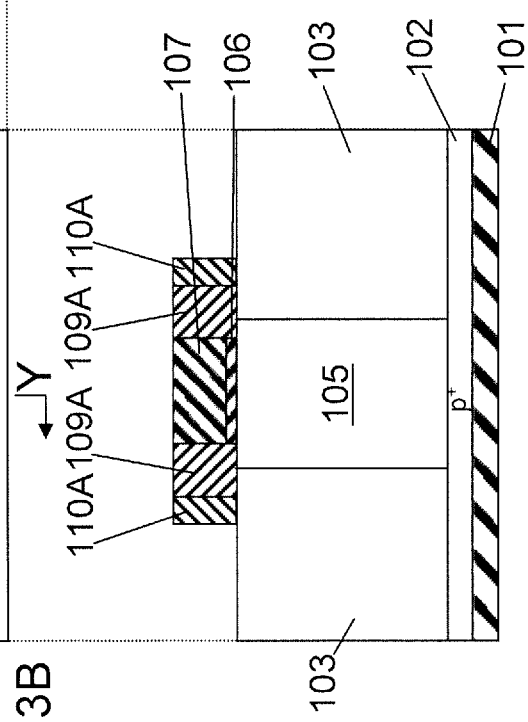

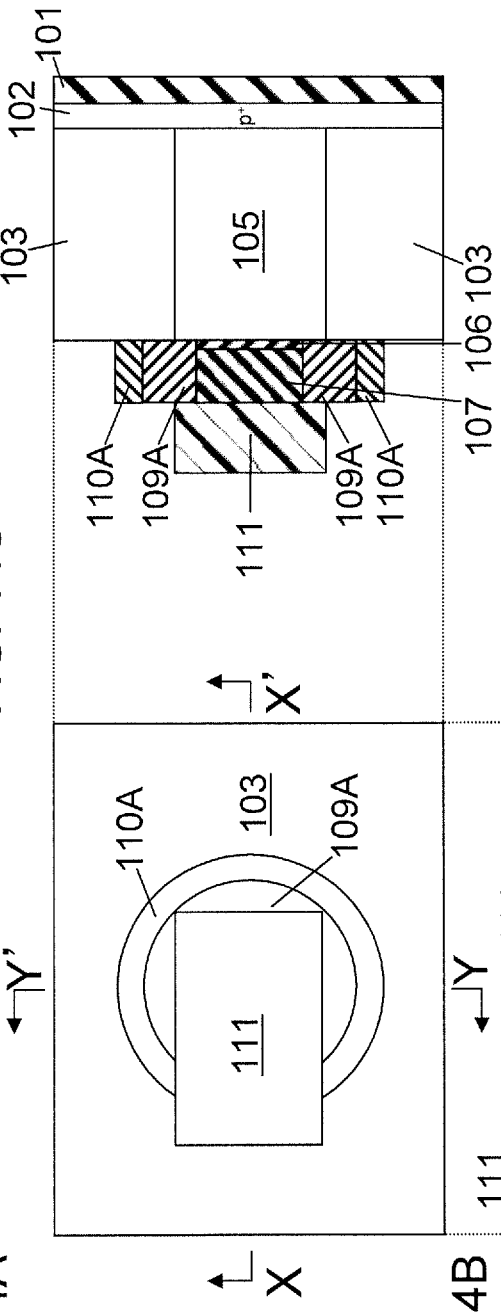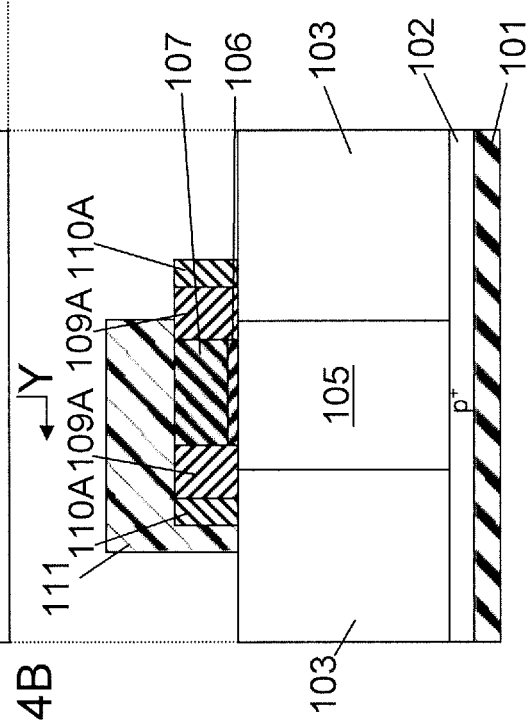
FIG. 14A  FIG. 14B  FIG. 14C

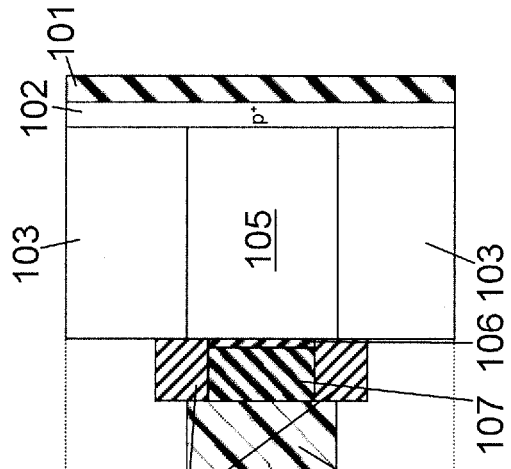
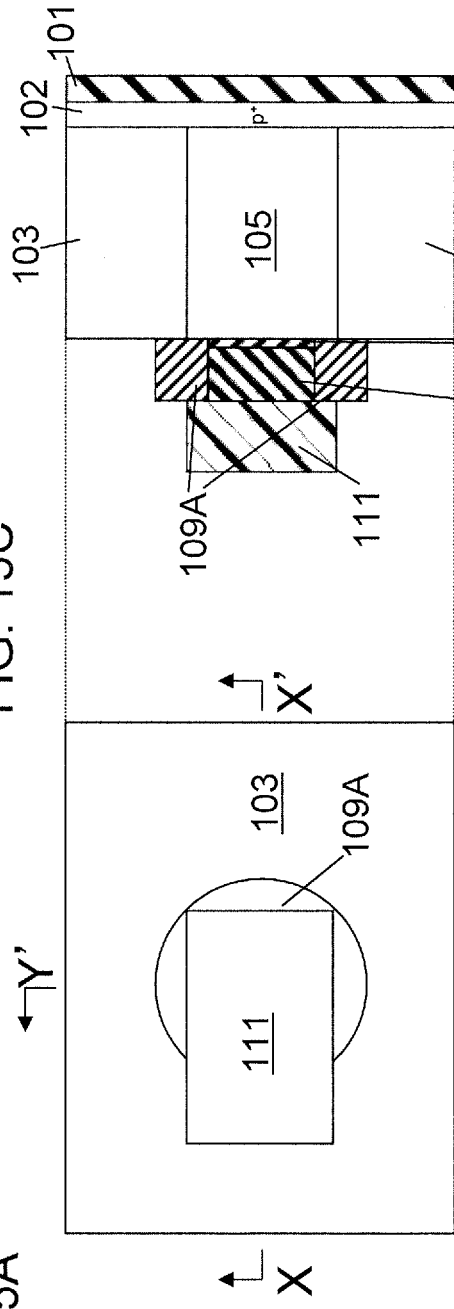
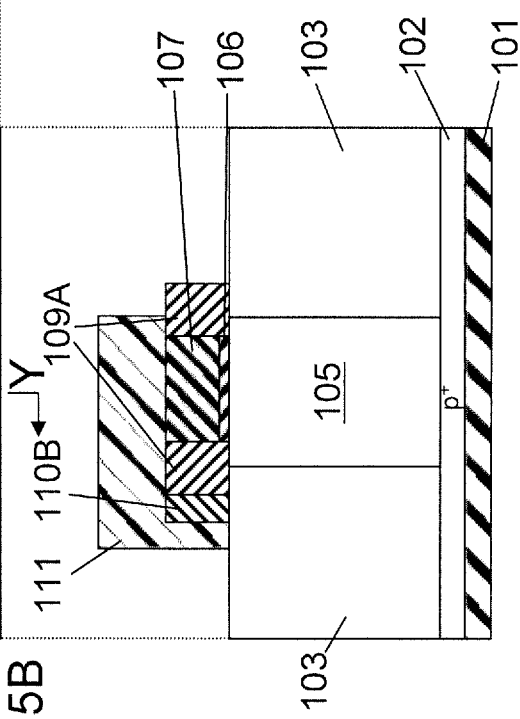

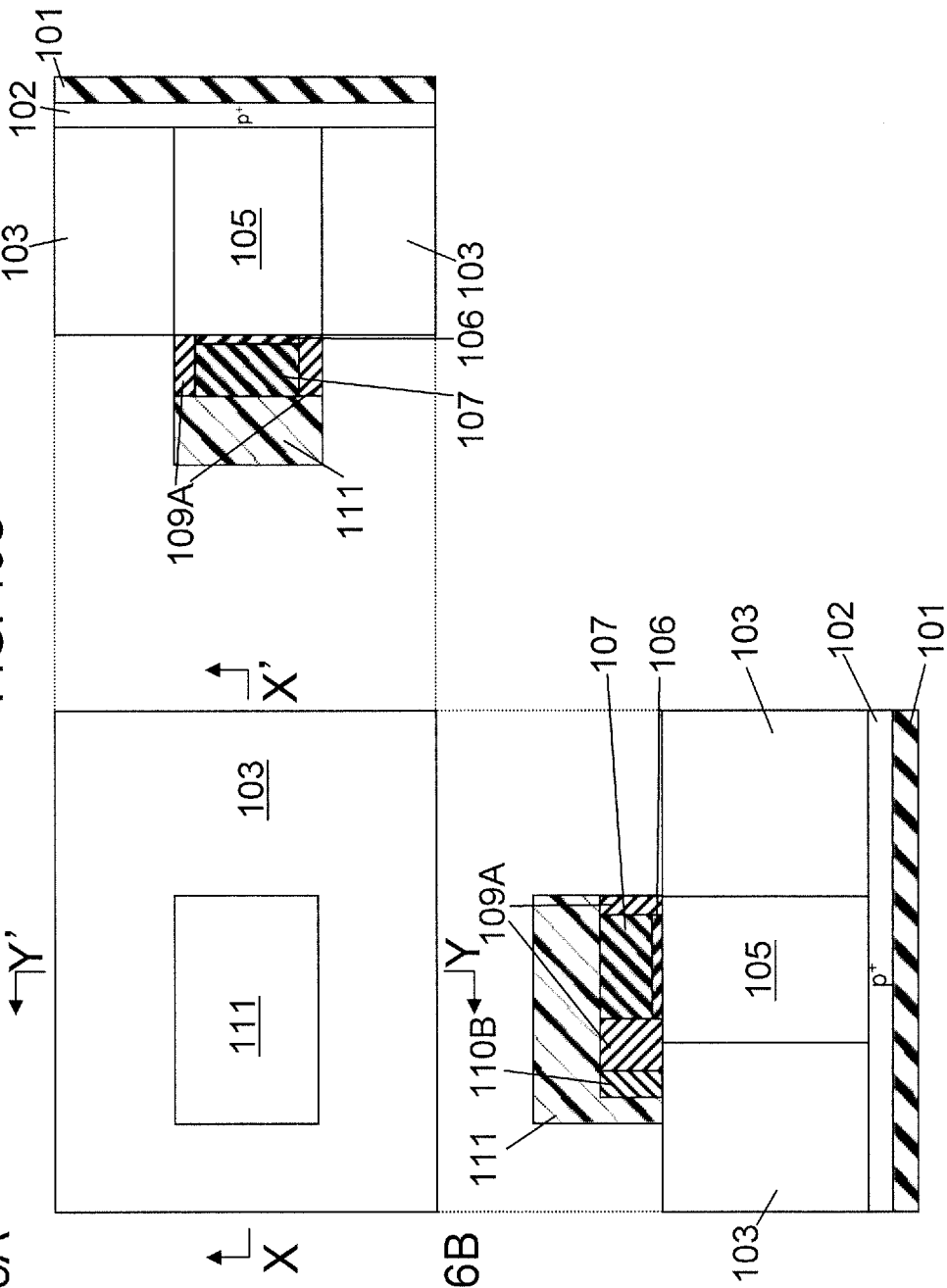

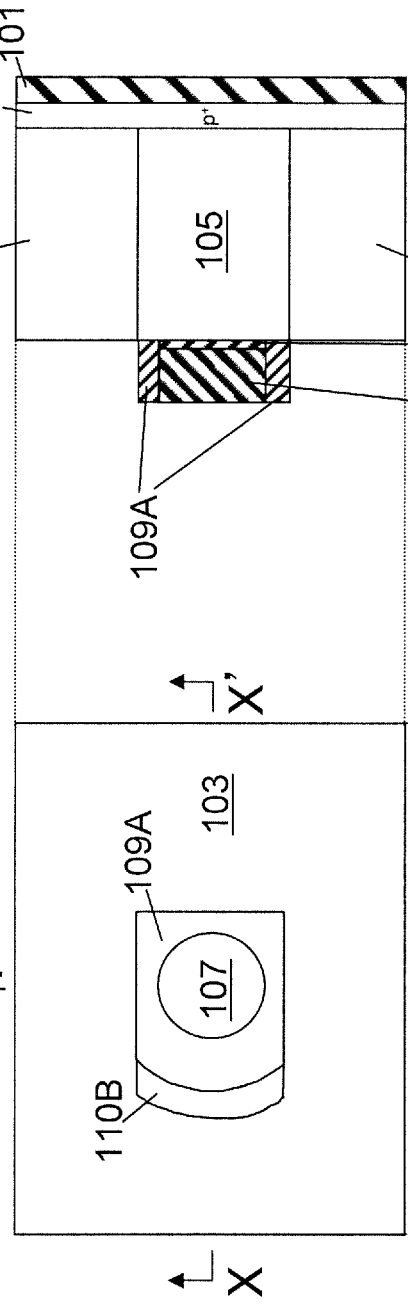

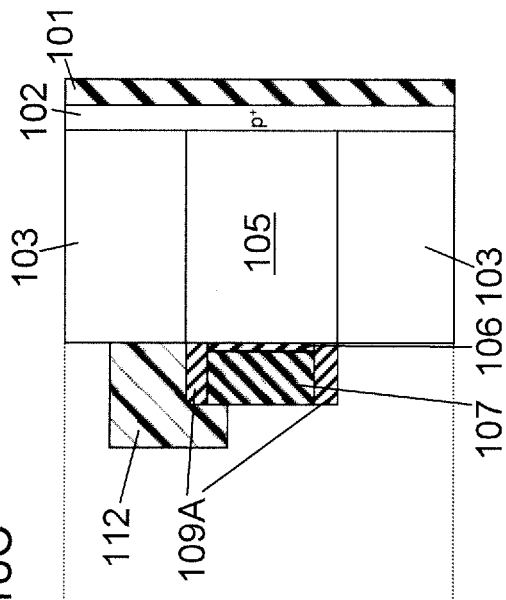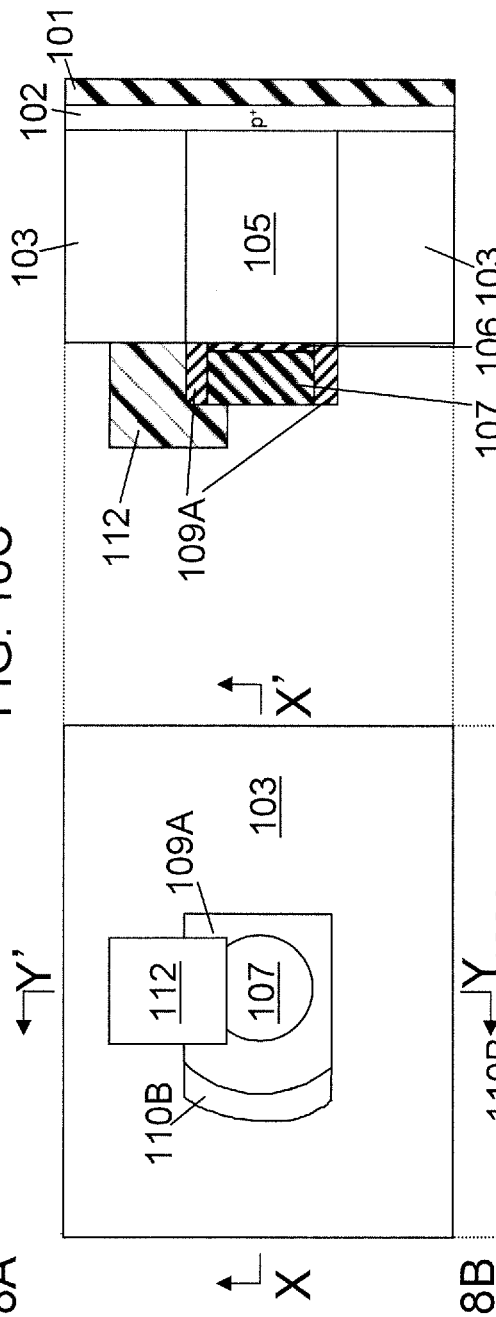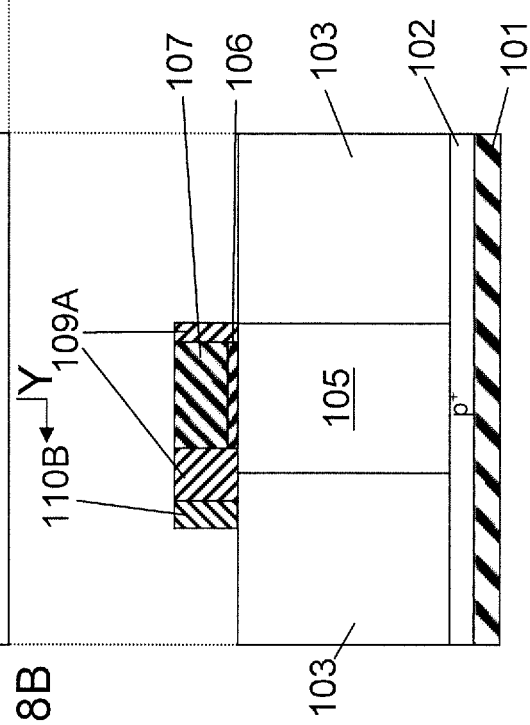

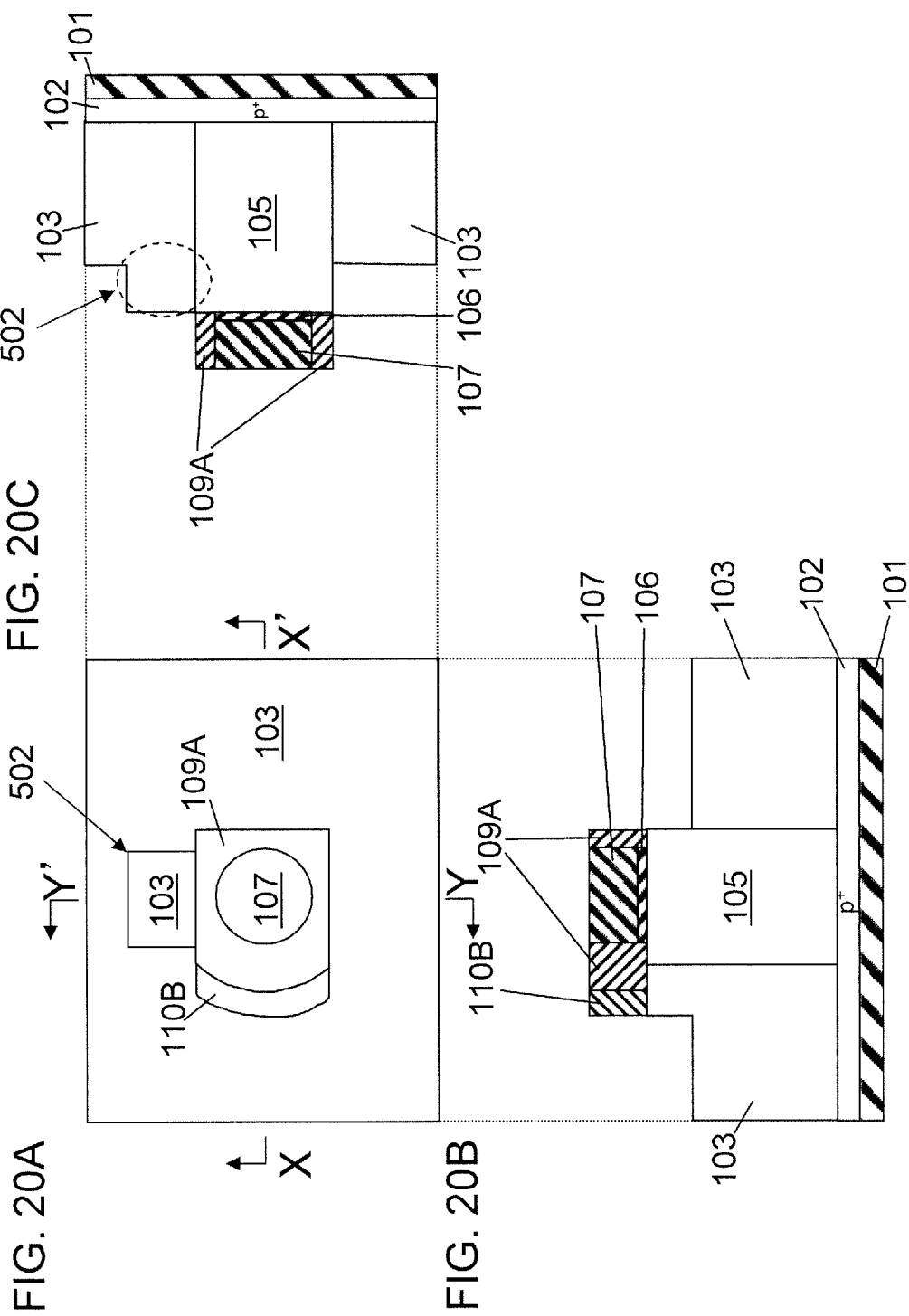

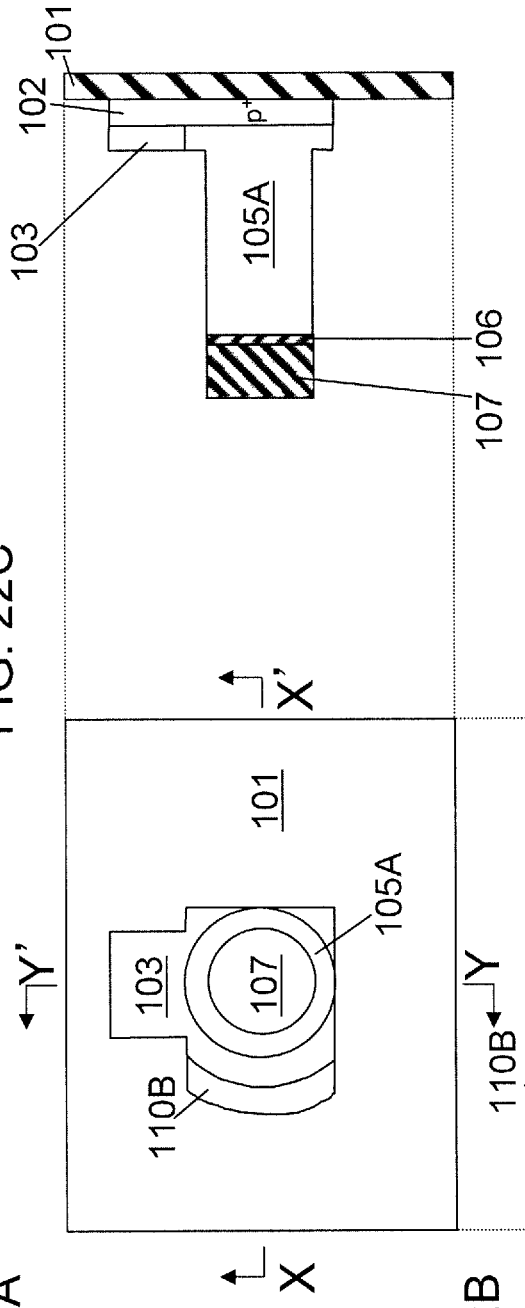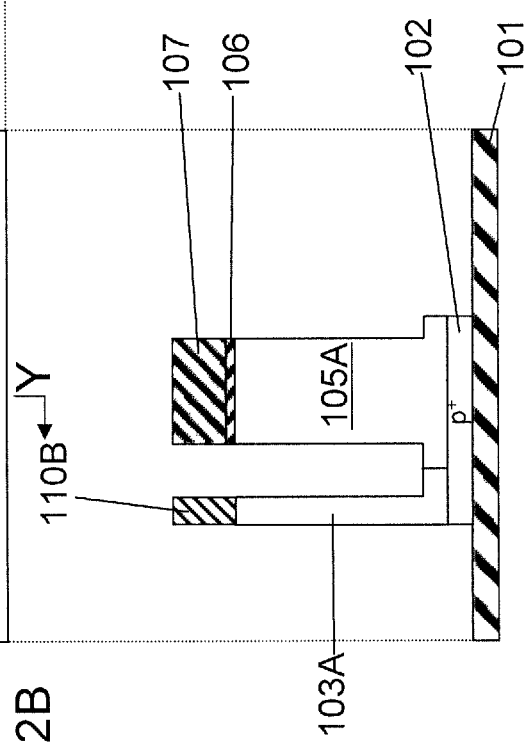

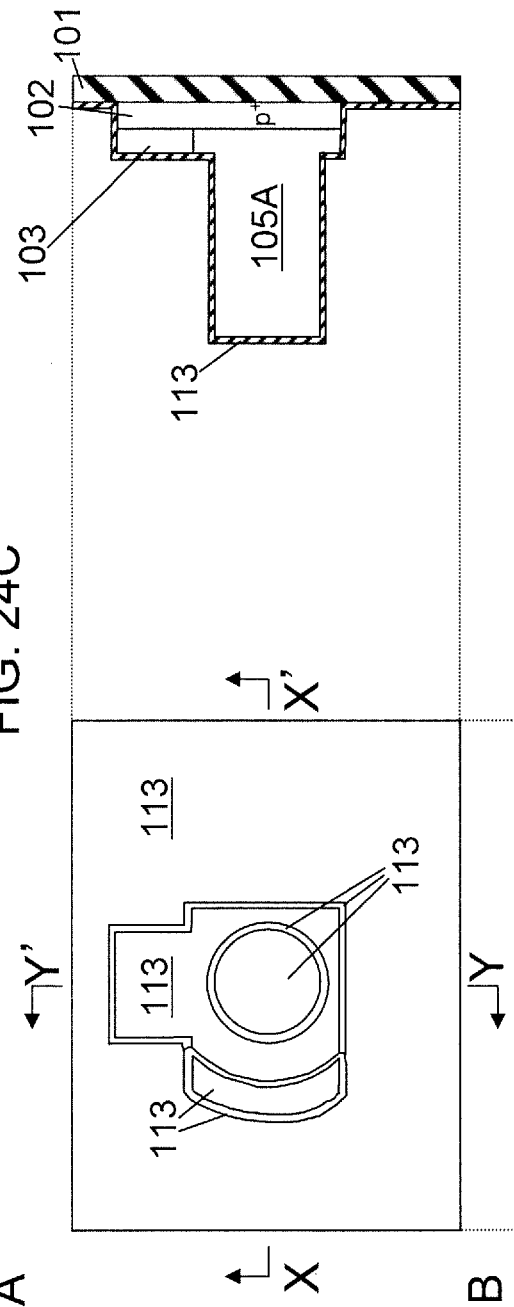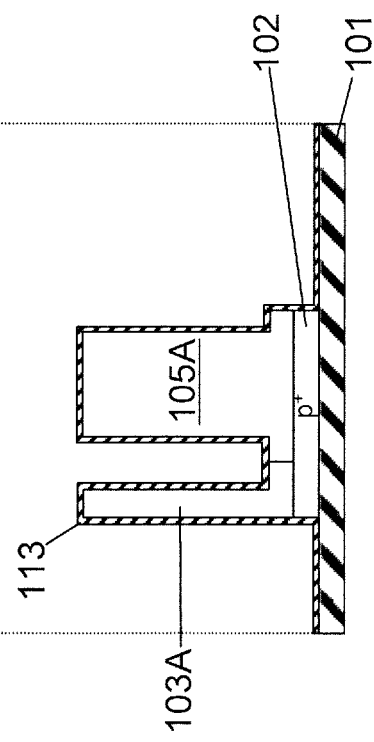

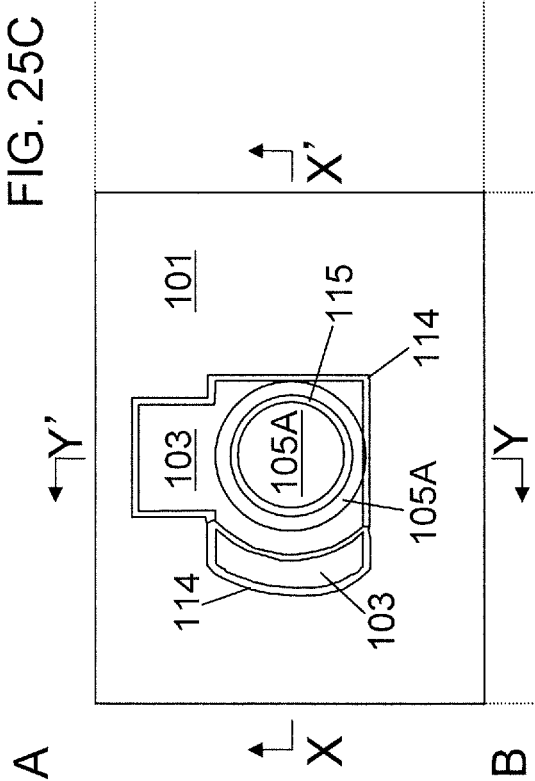
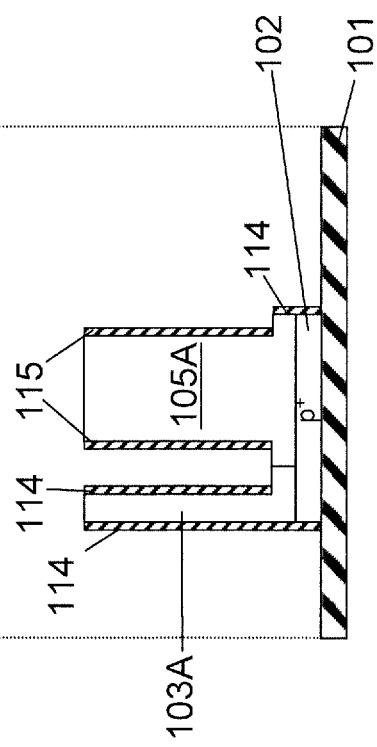
FIG. 25A
FIG. 25B
FIG. 25C

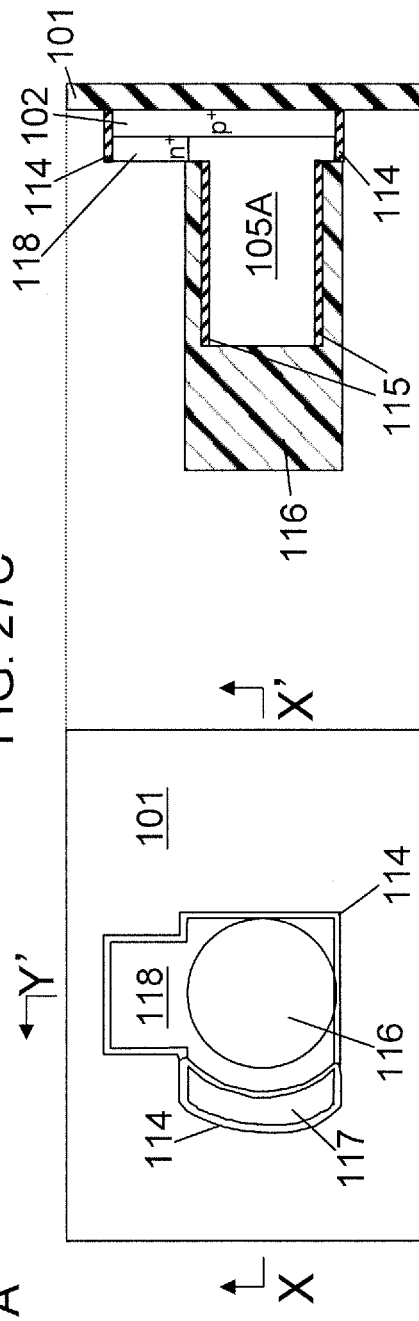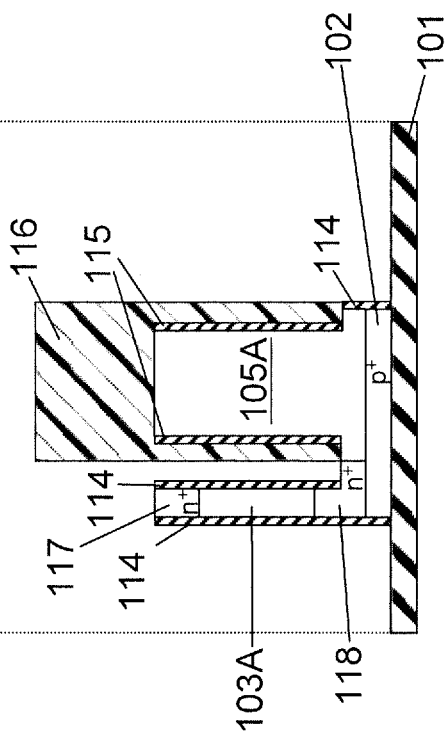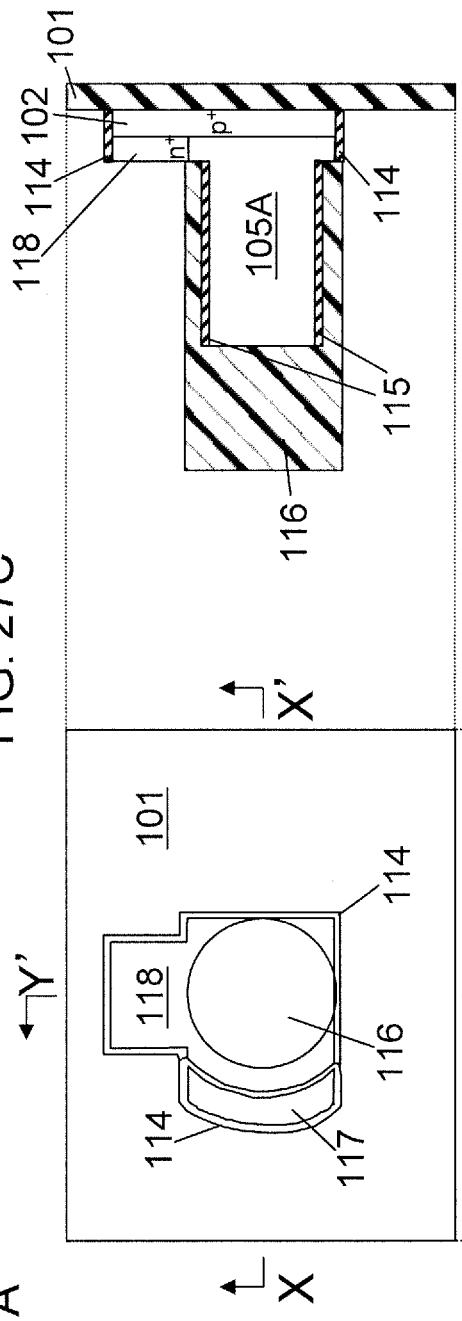

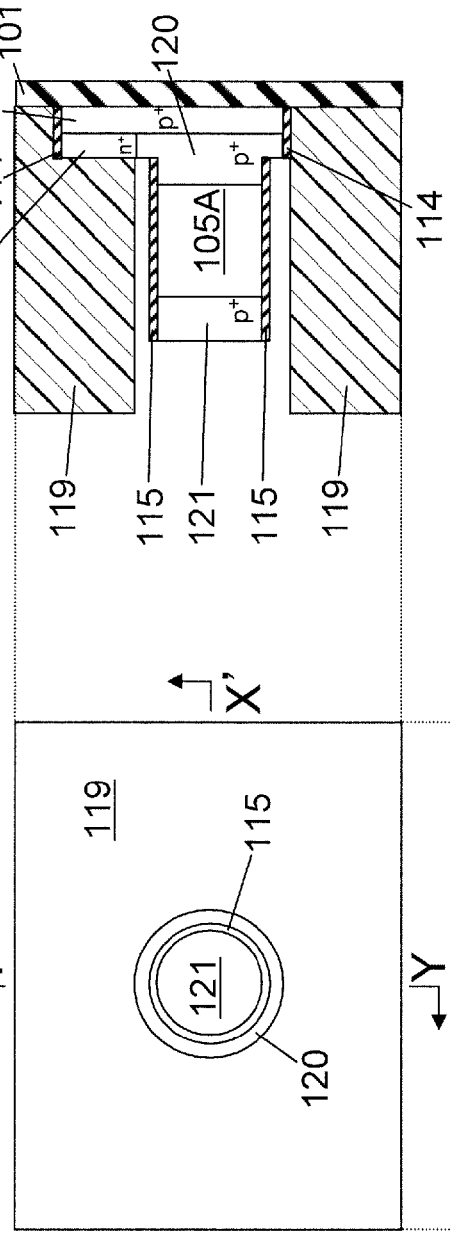
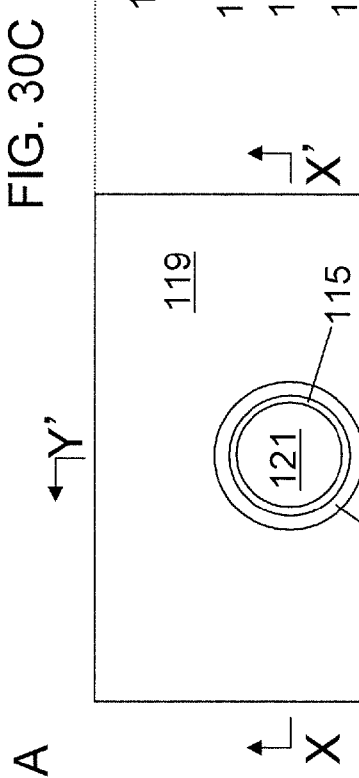
FIG. 30A
FIG. 30B
FIG. 30C

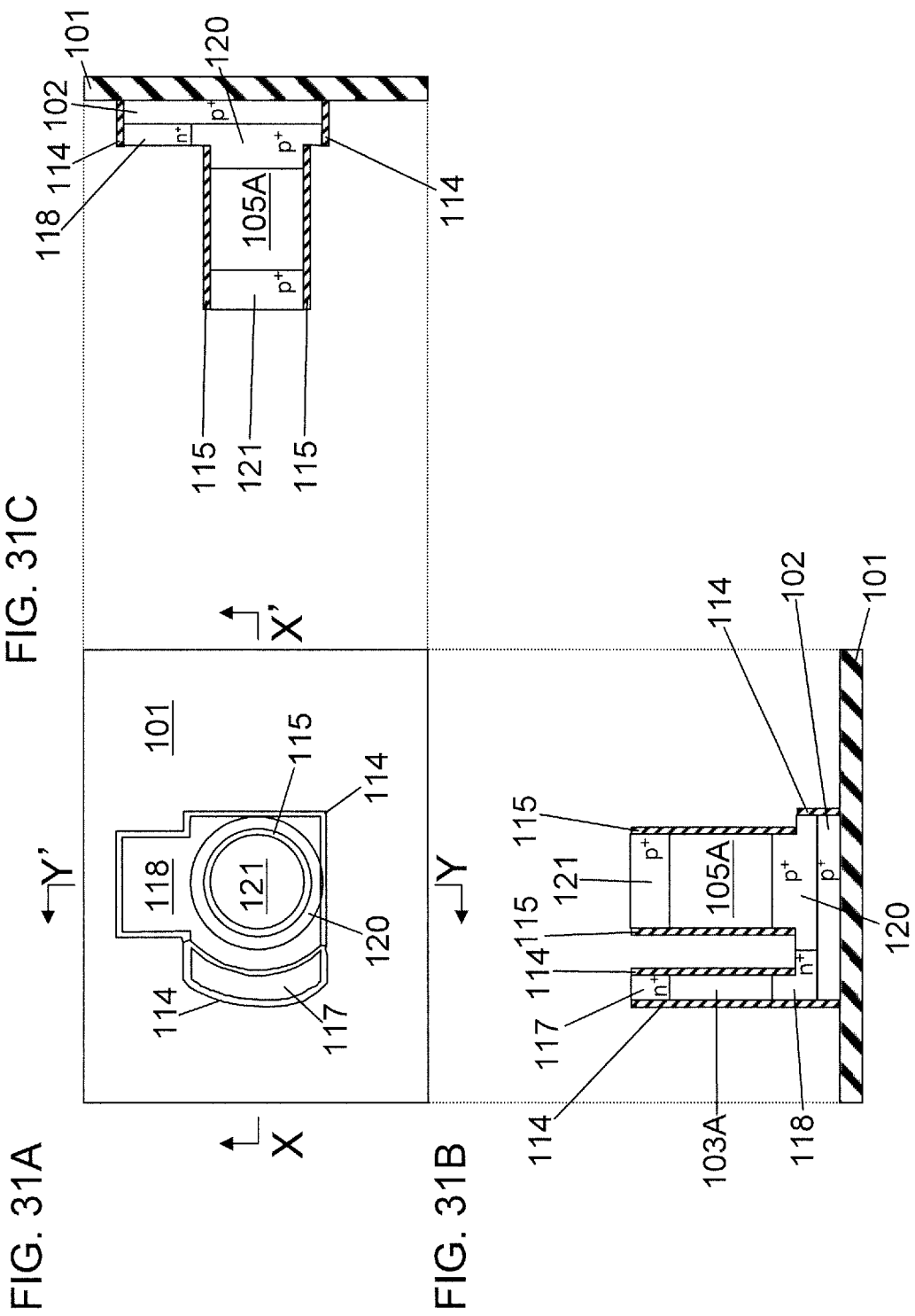

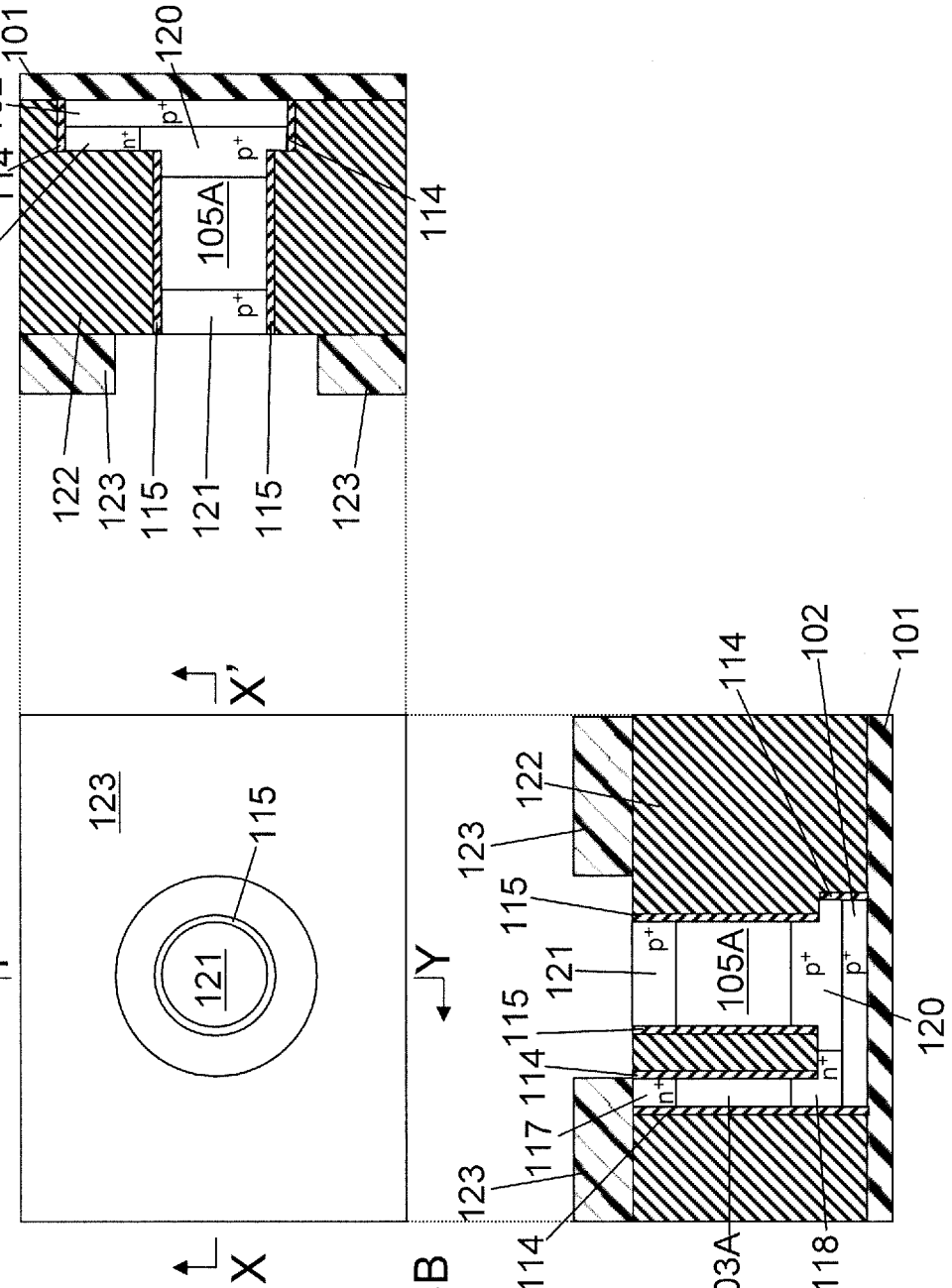

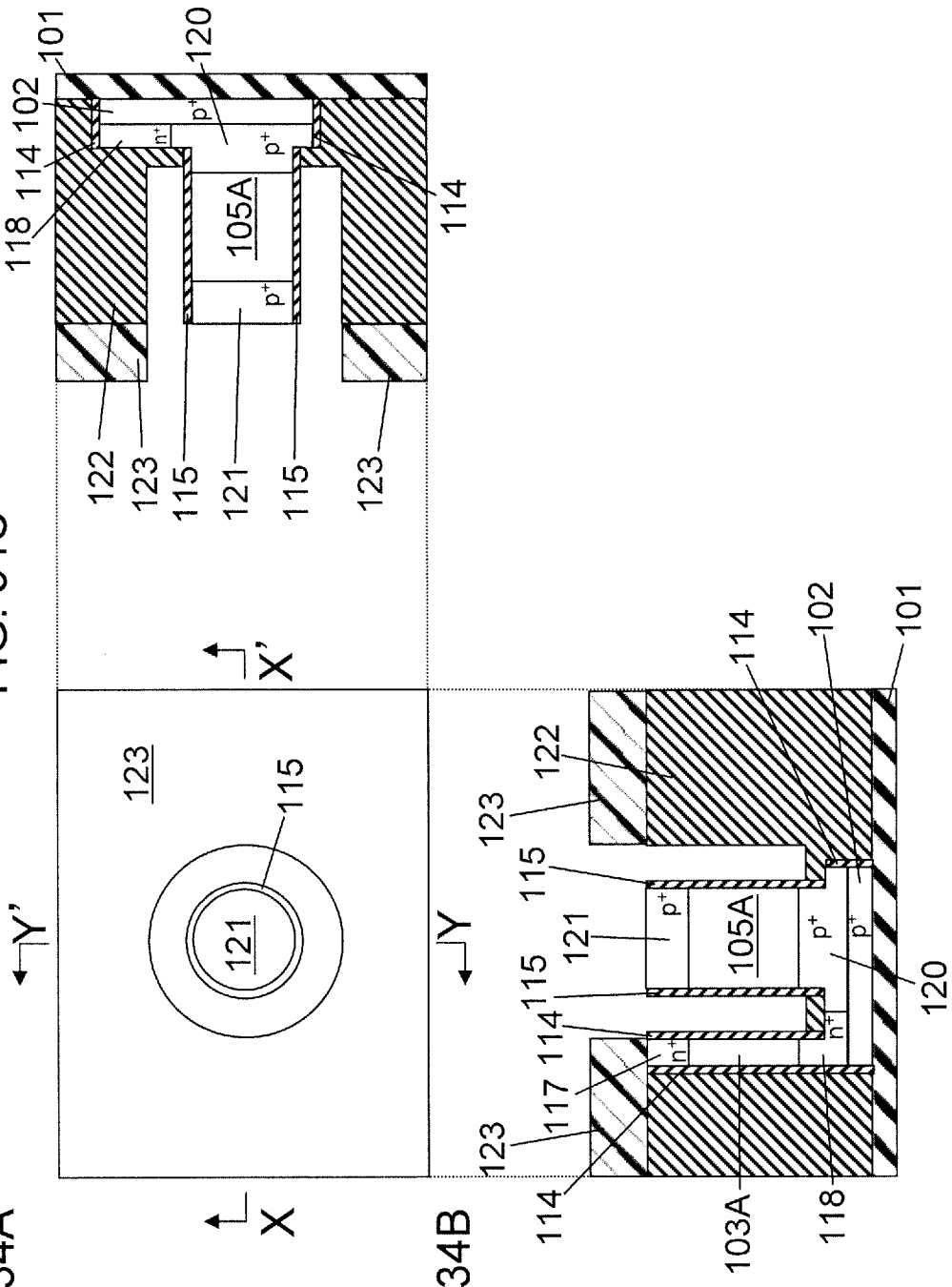

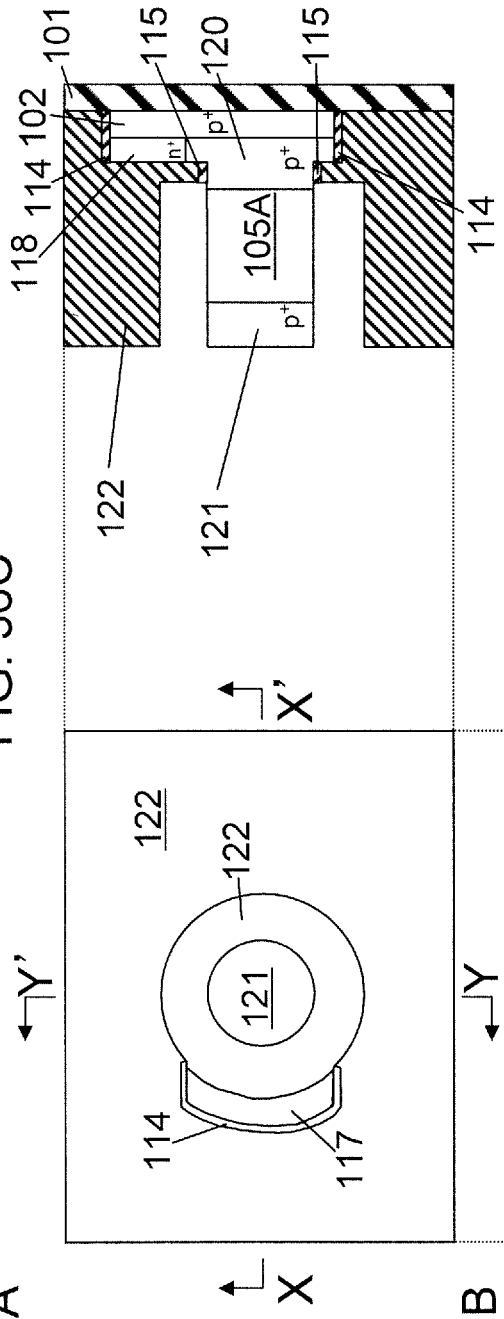
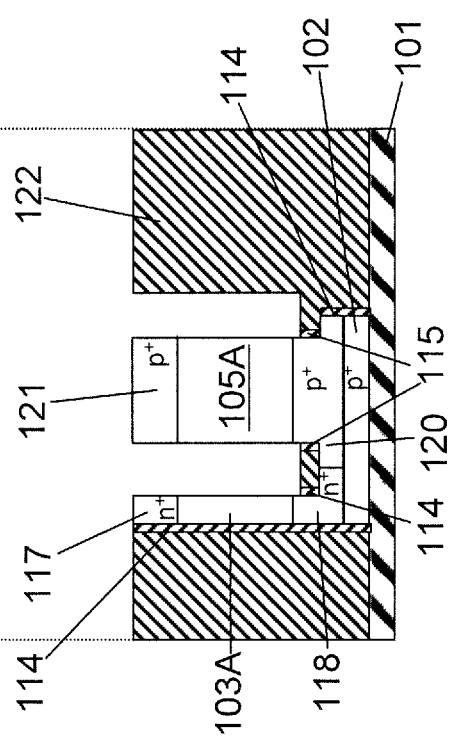

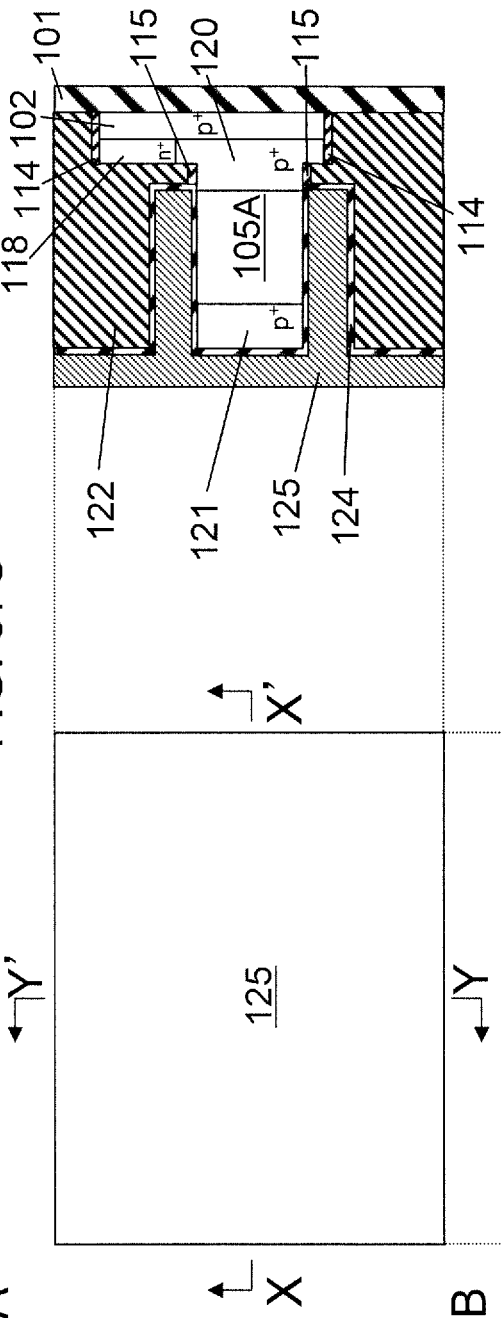
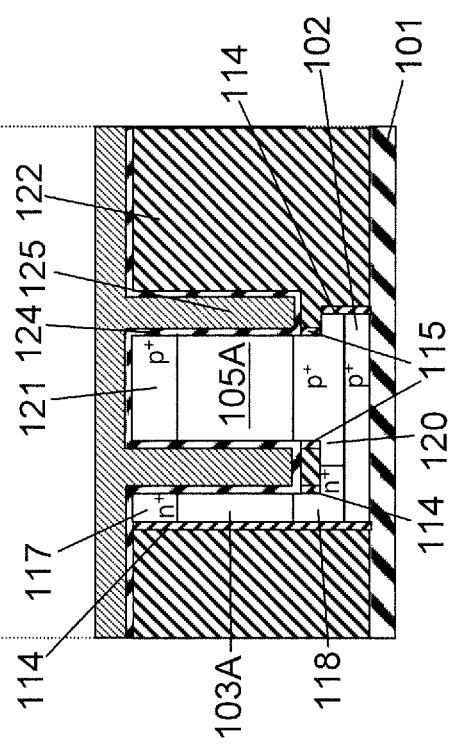

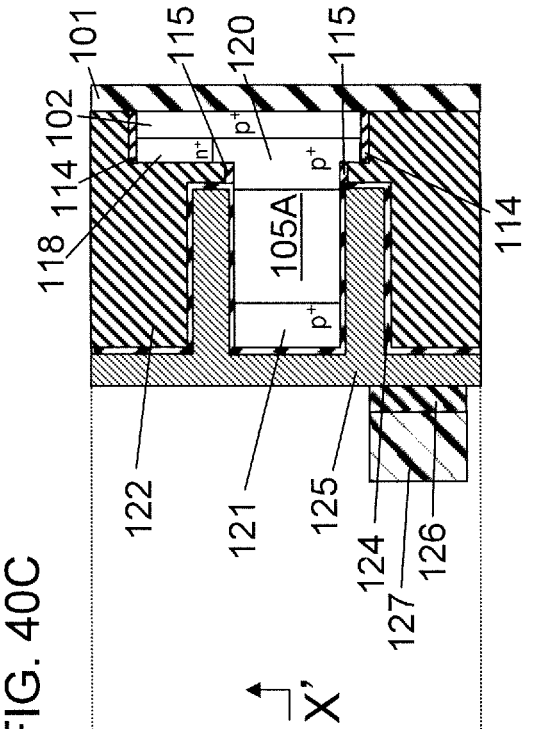
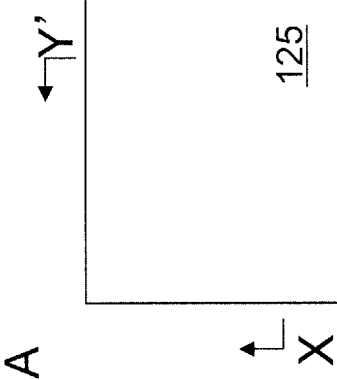
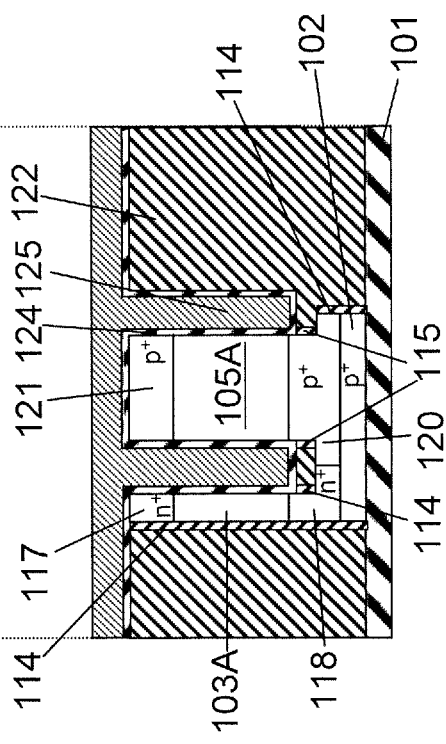
FIG. 40A
FIG. 40B
FIG. 40C

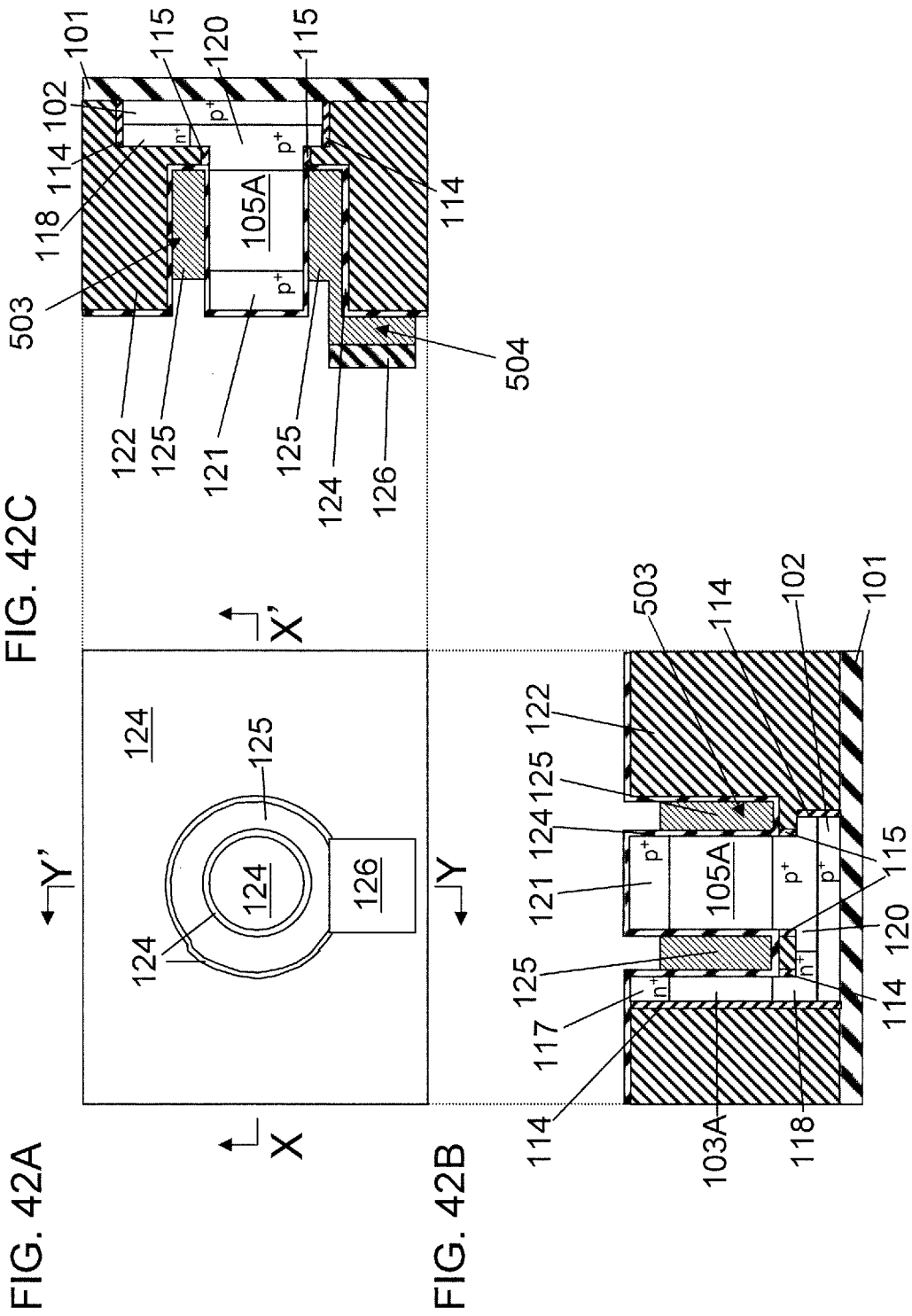

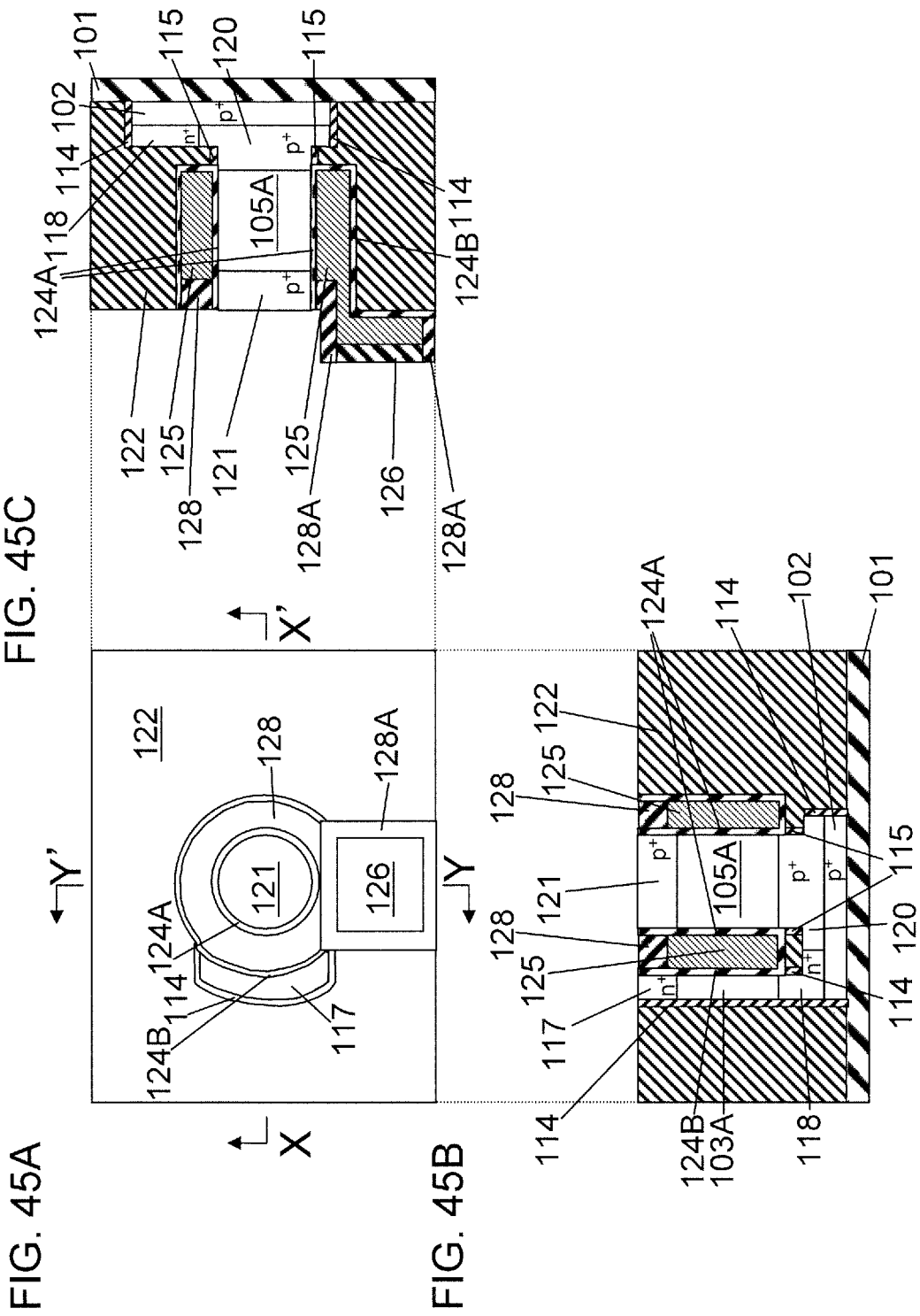

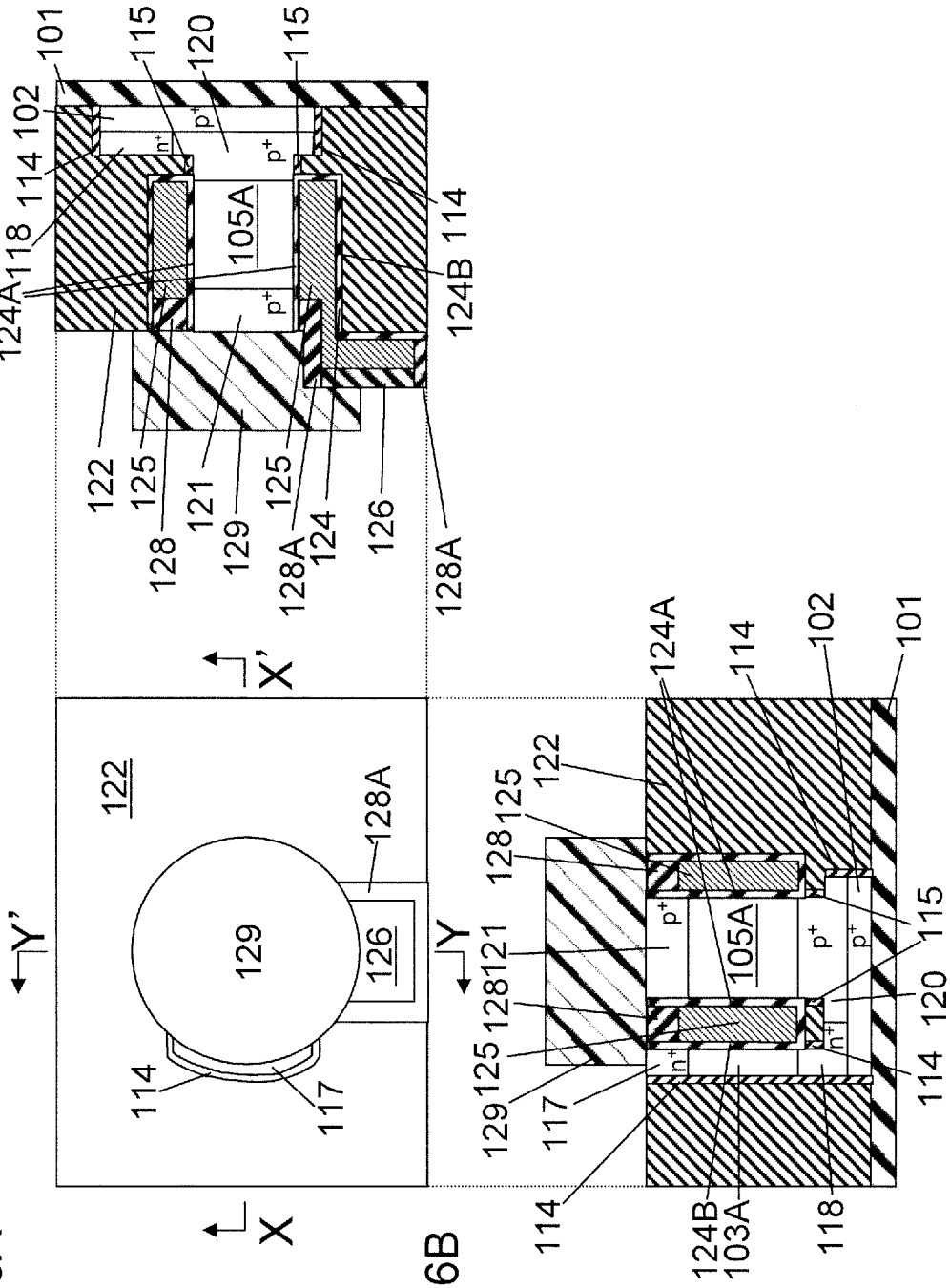

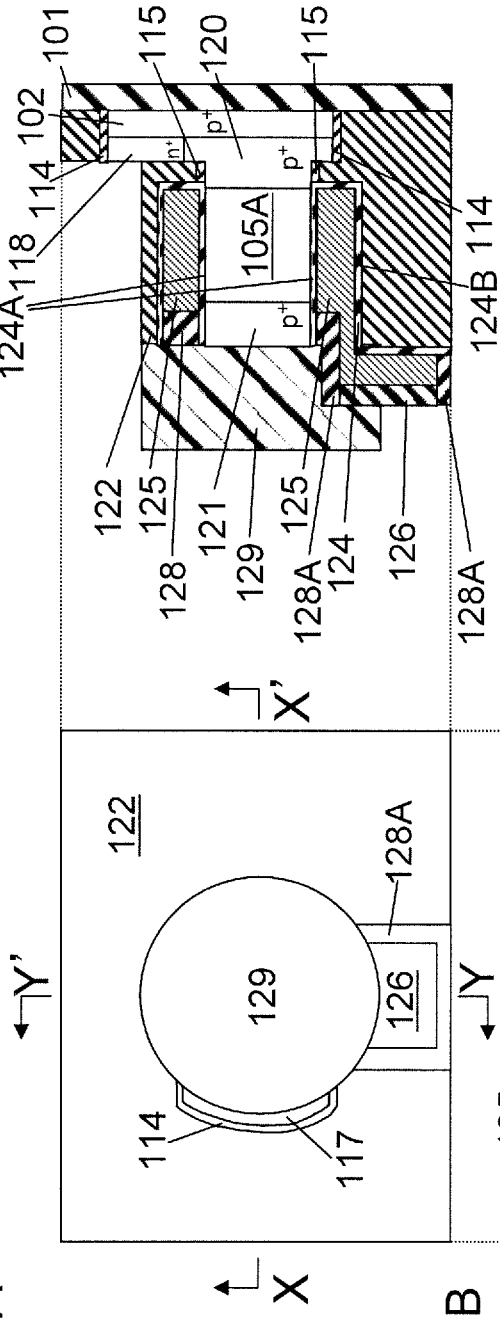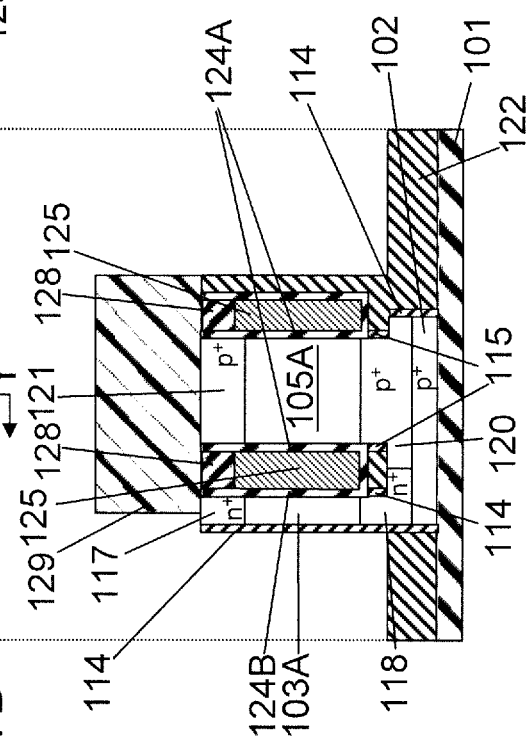

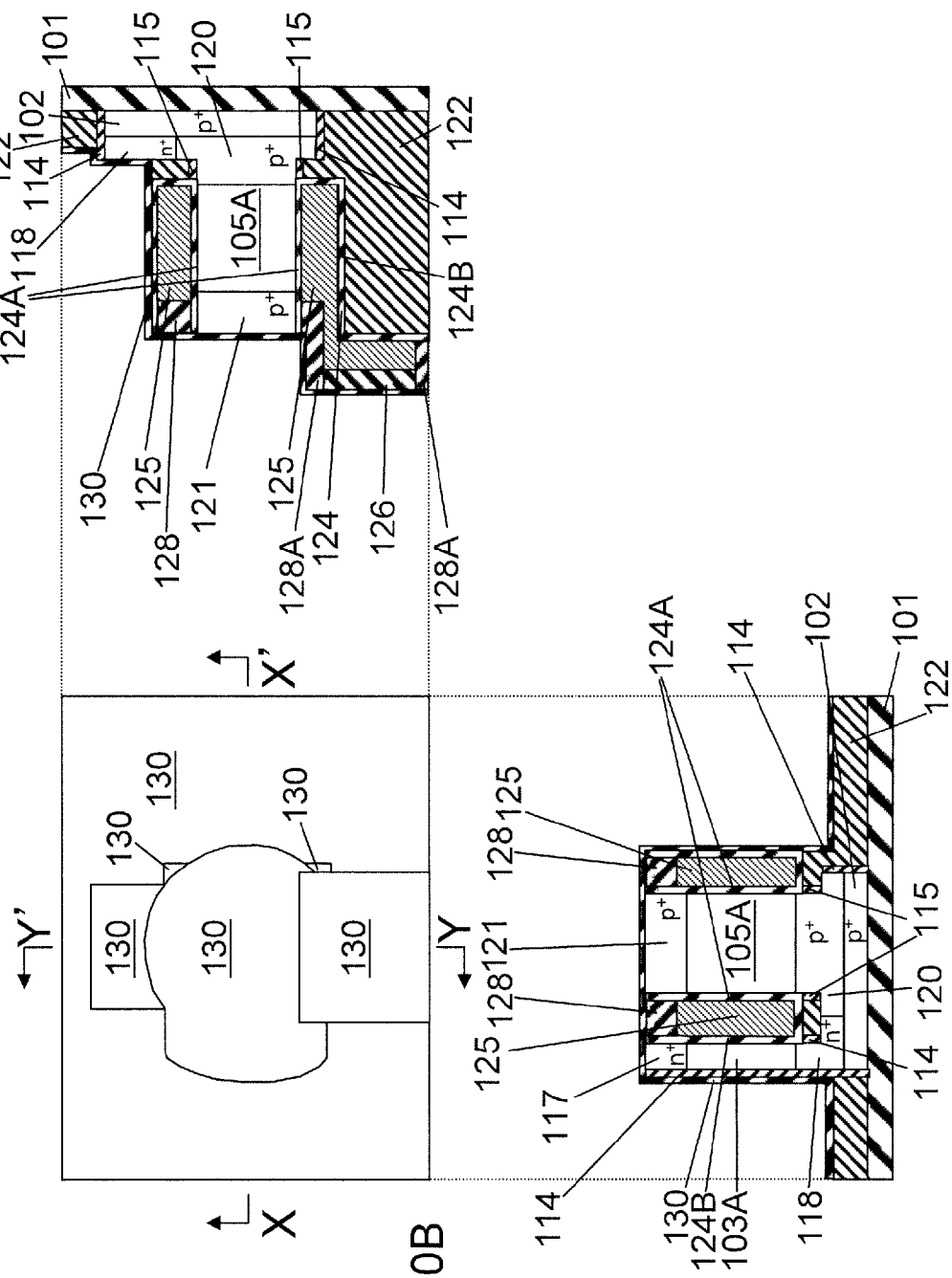
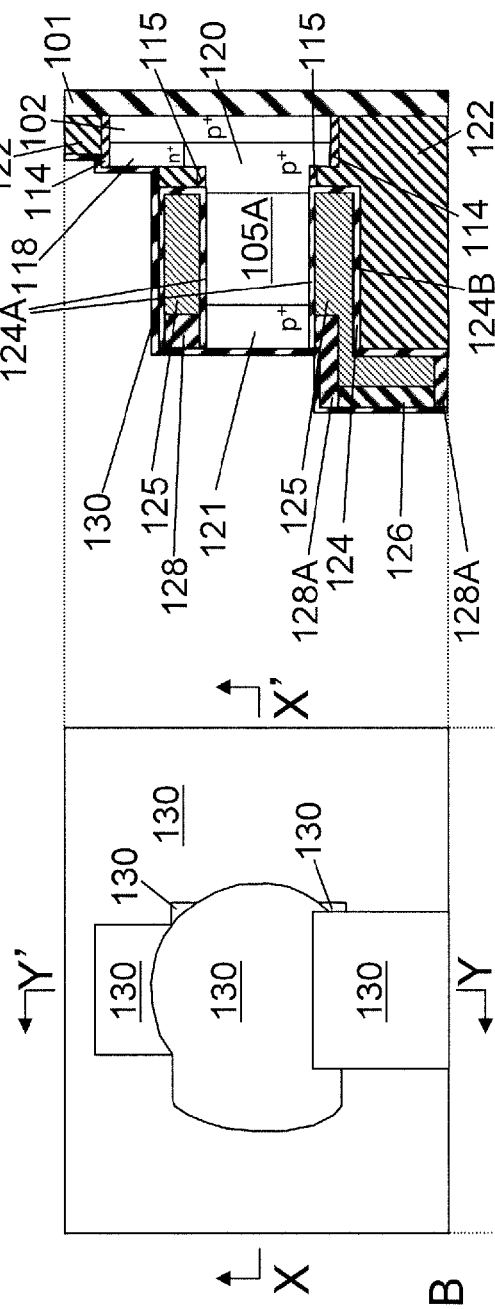
FIG. 50A
FIG. 50B
FIG. 50C

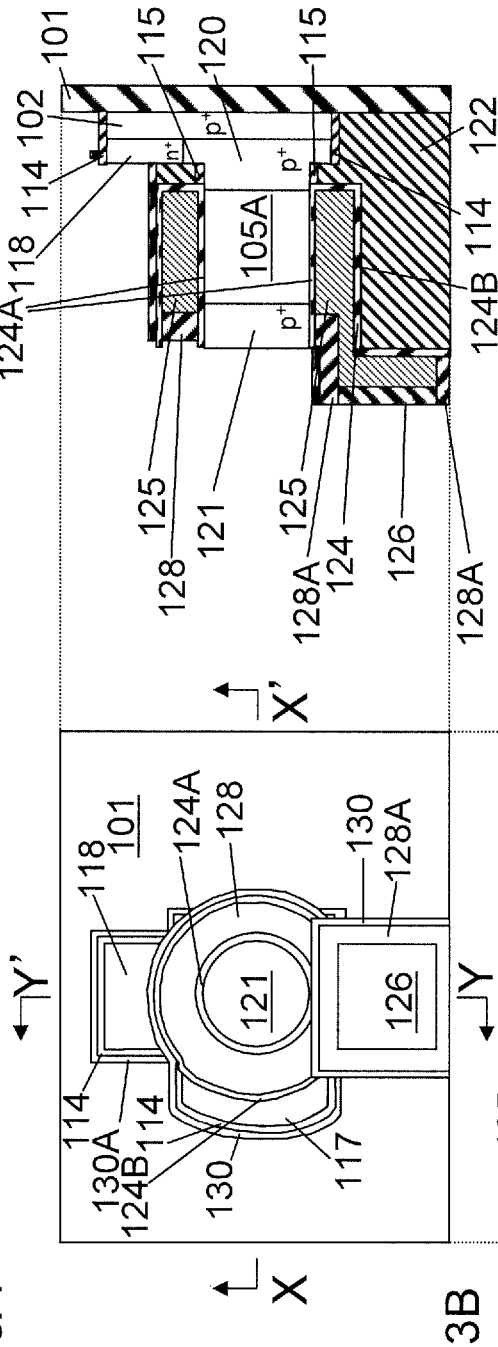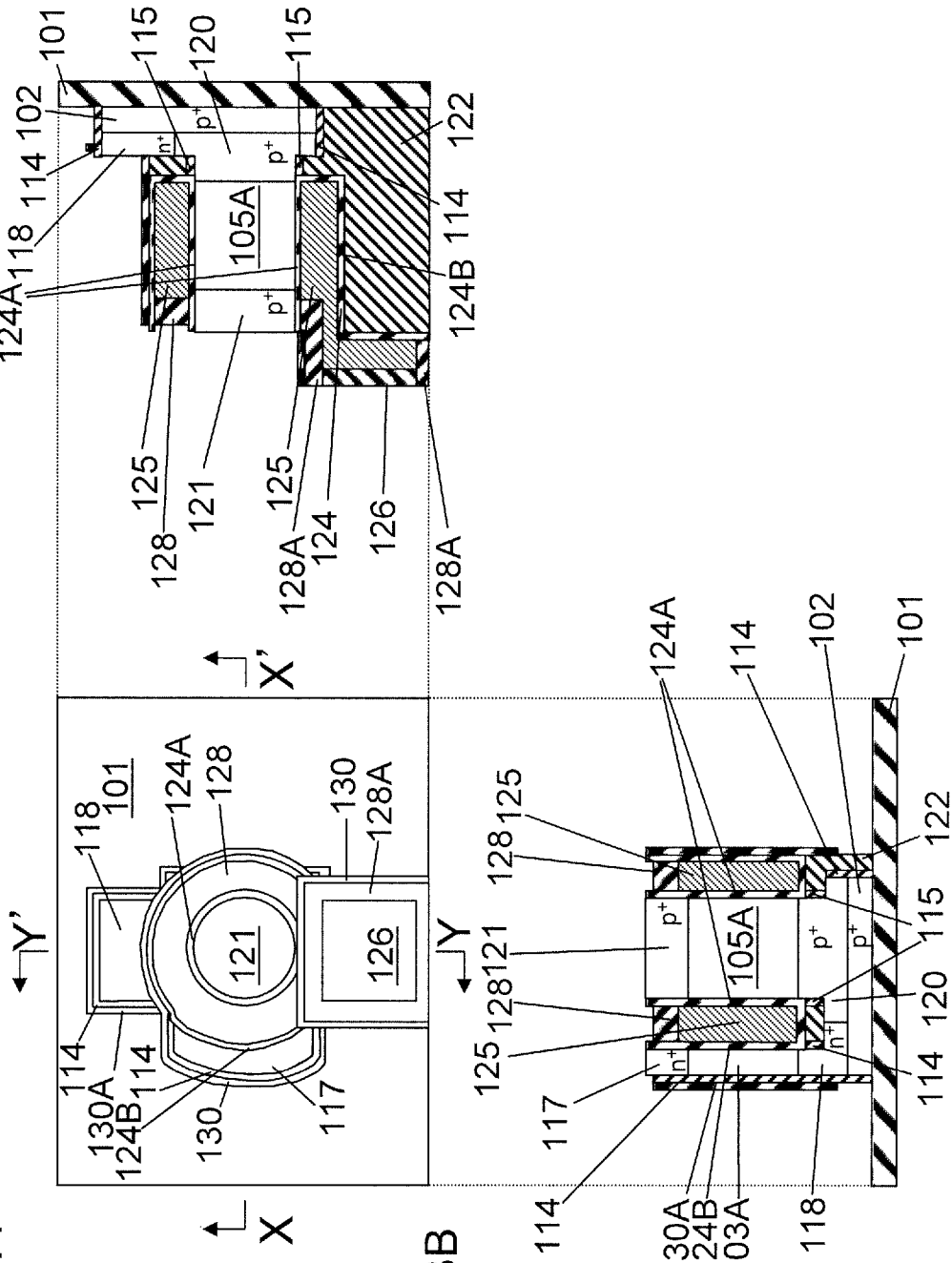

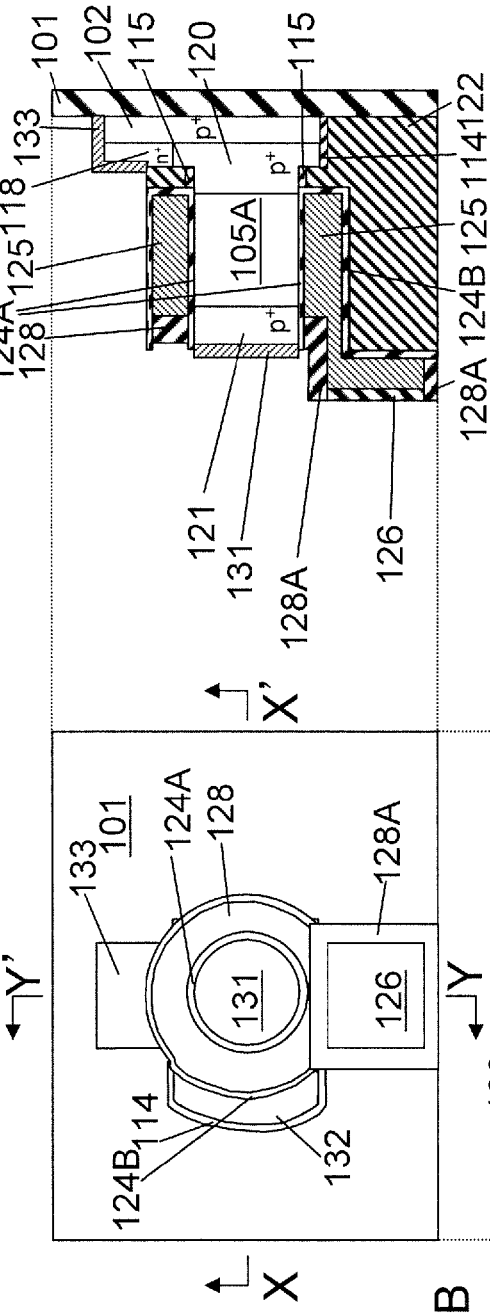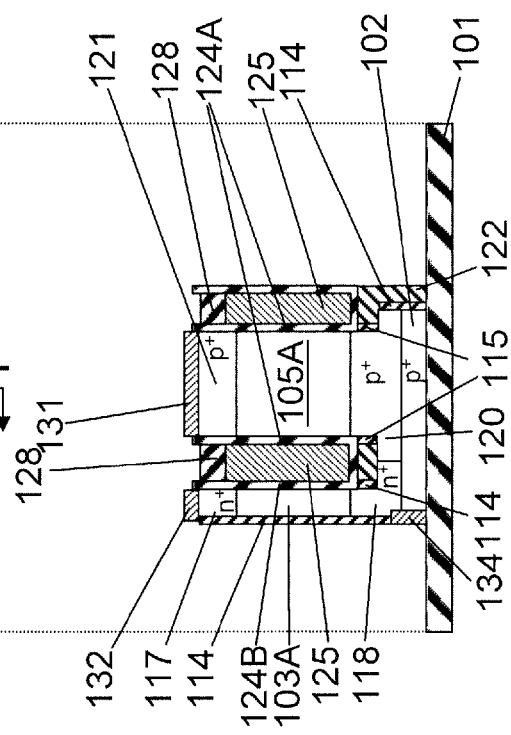

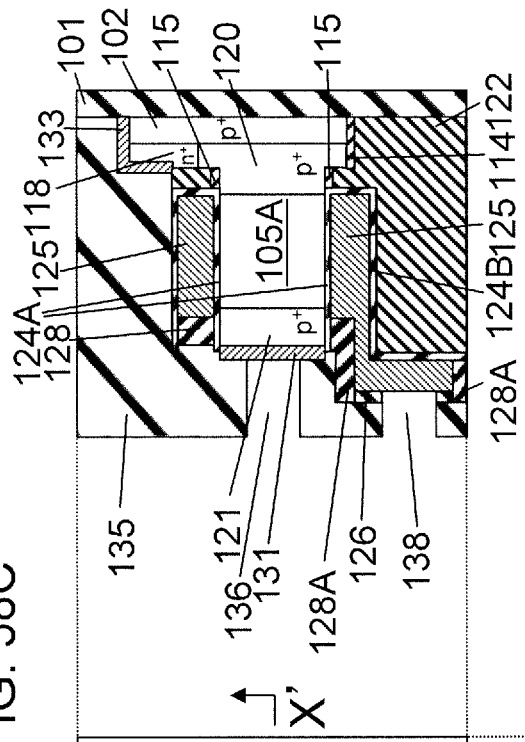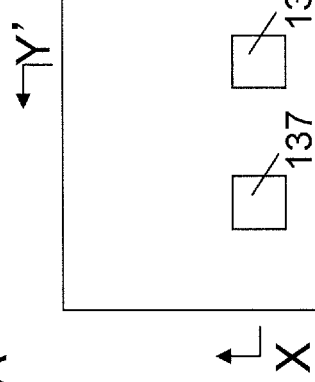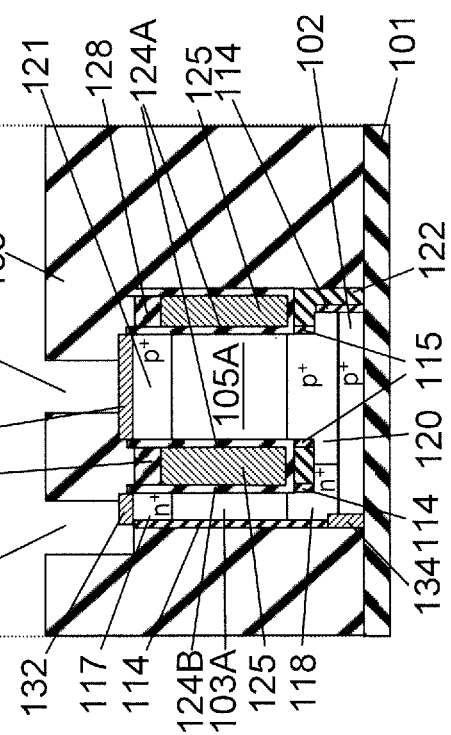

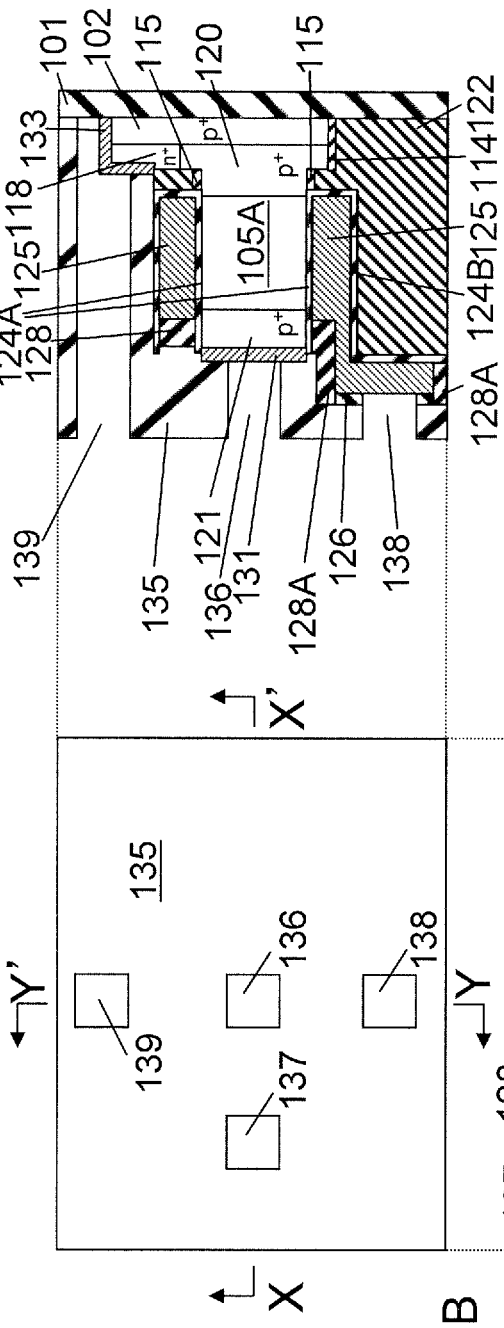
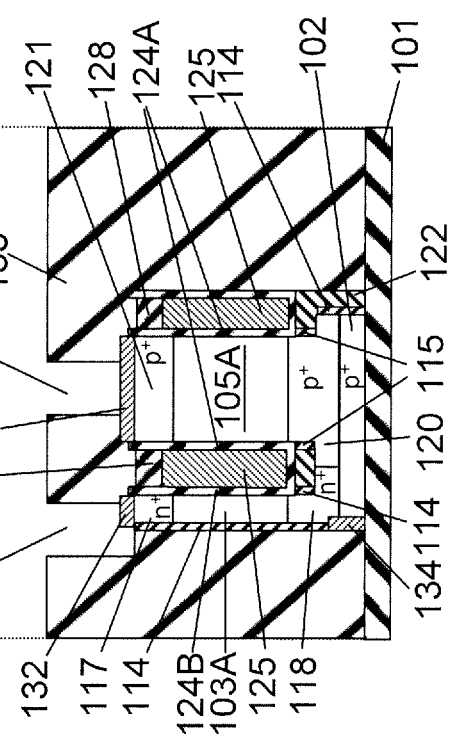
FIG. 59A
FIG. 59B
FIG. 59C

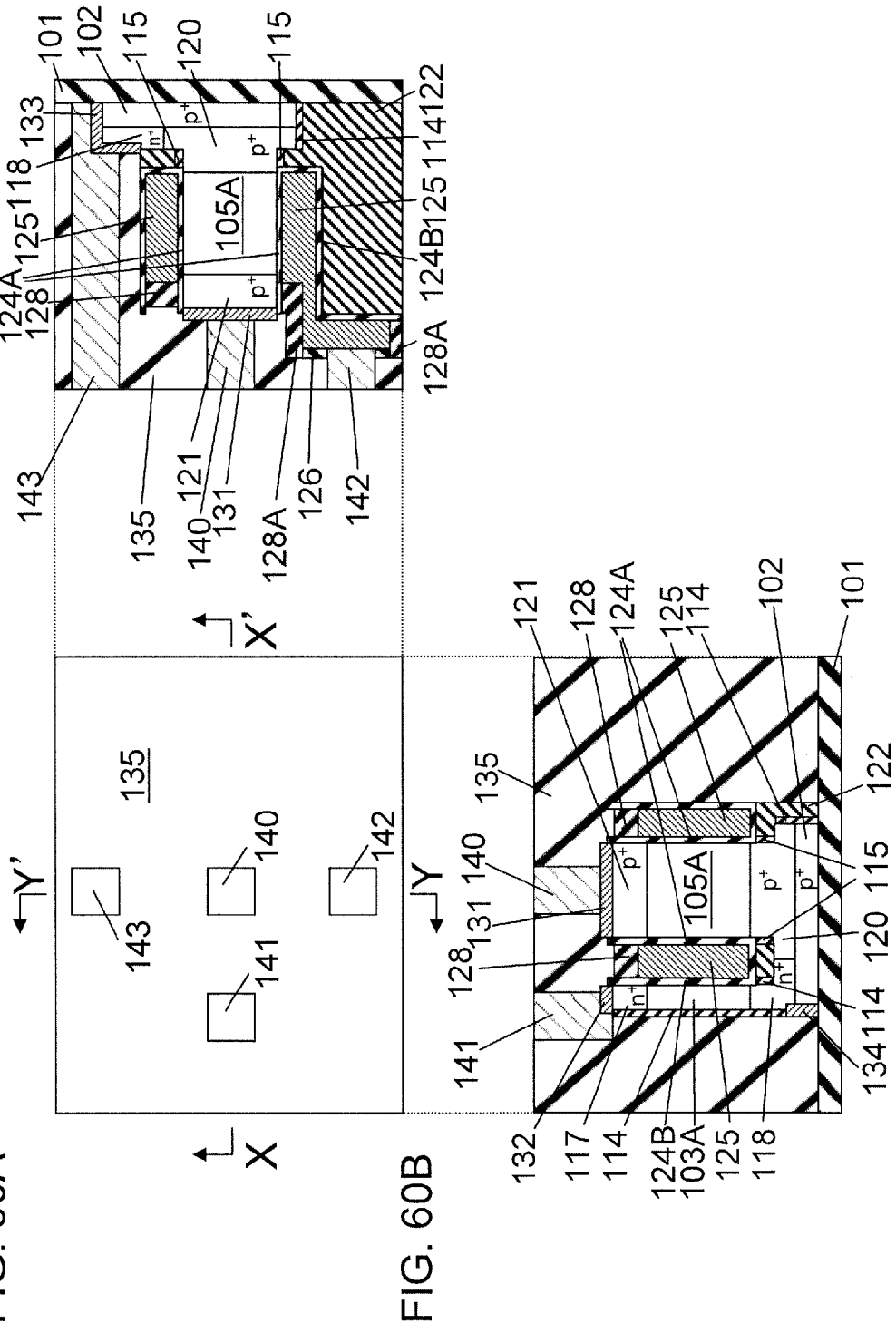

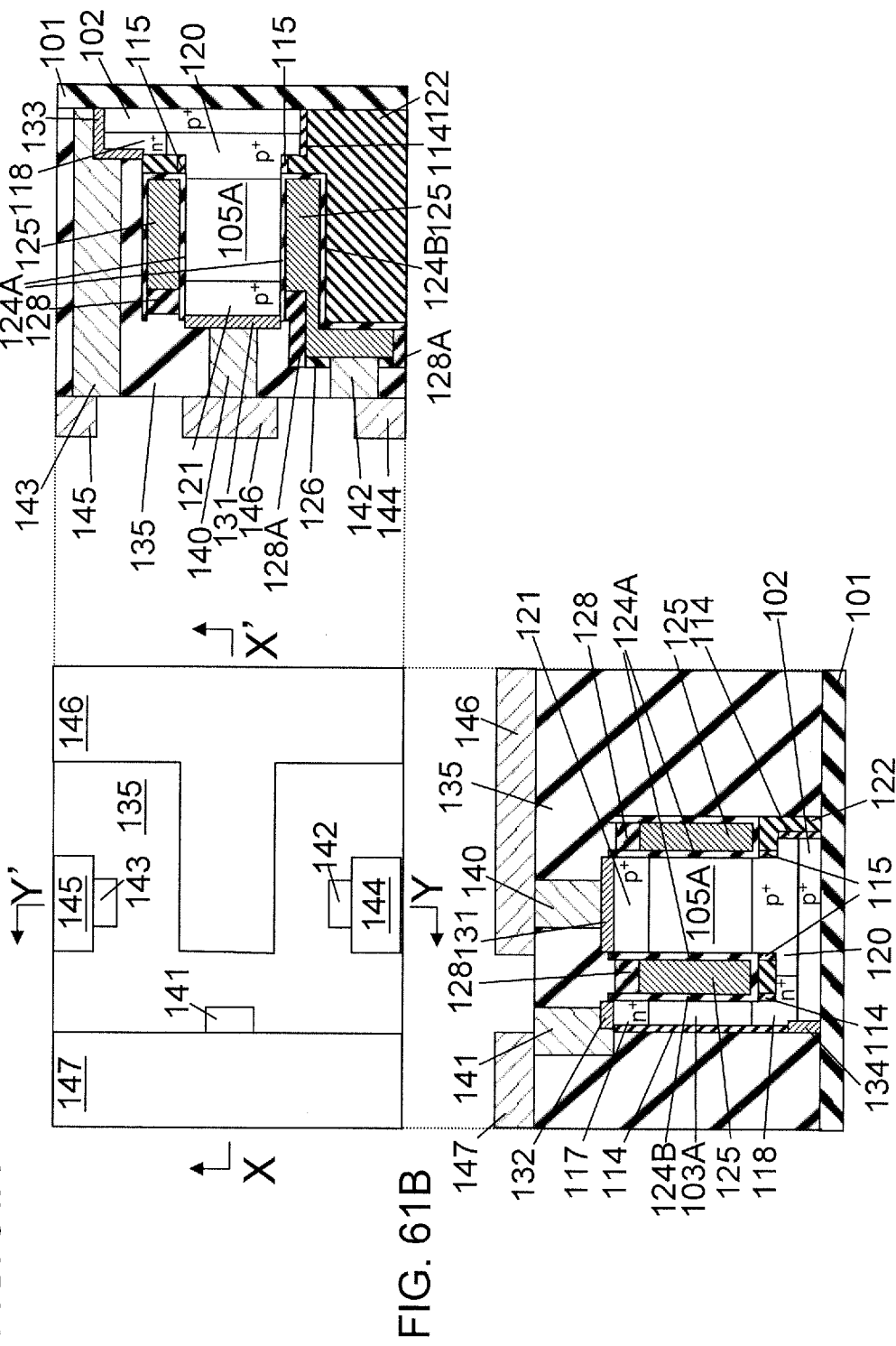
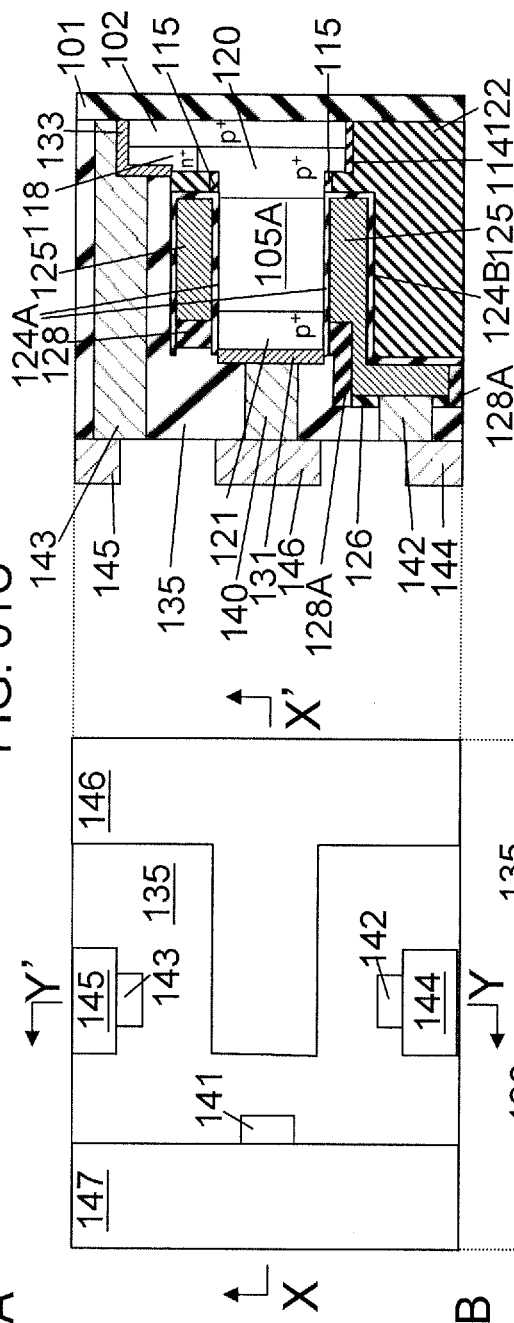
FIG. 61A
FIG. 61B
FIG. 61C

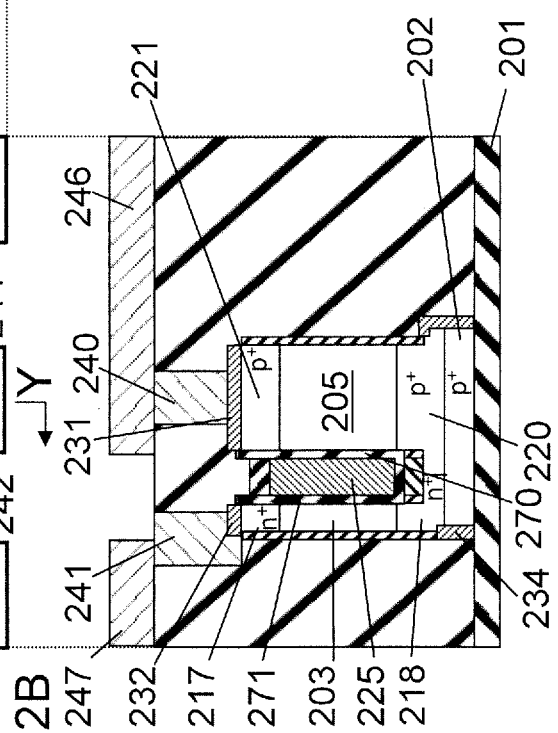
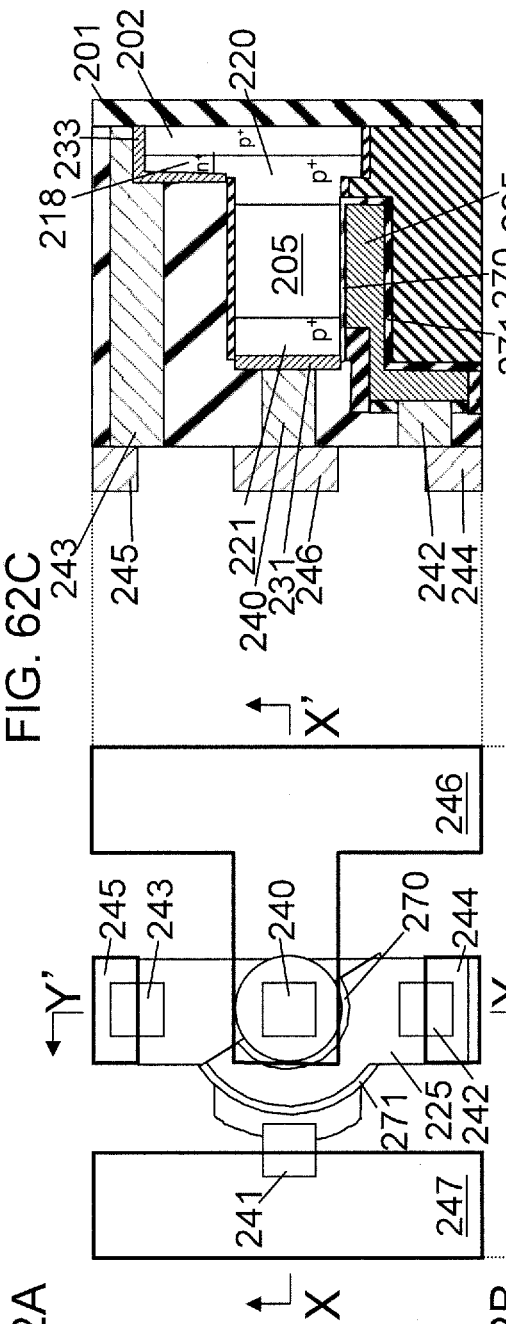
FIG. 62C
FIG. 62A
FIG. 62B

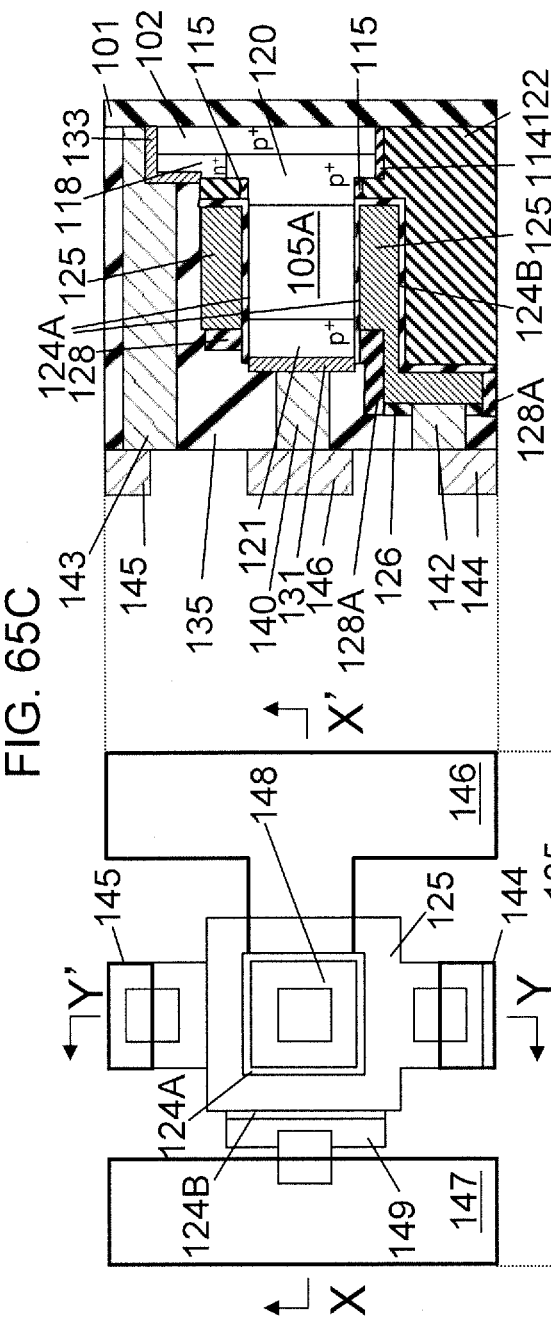

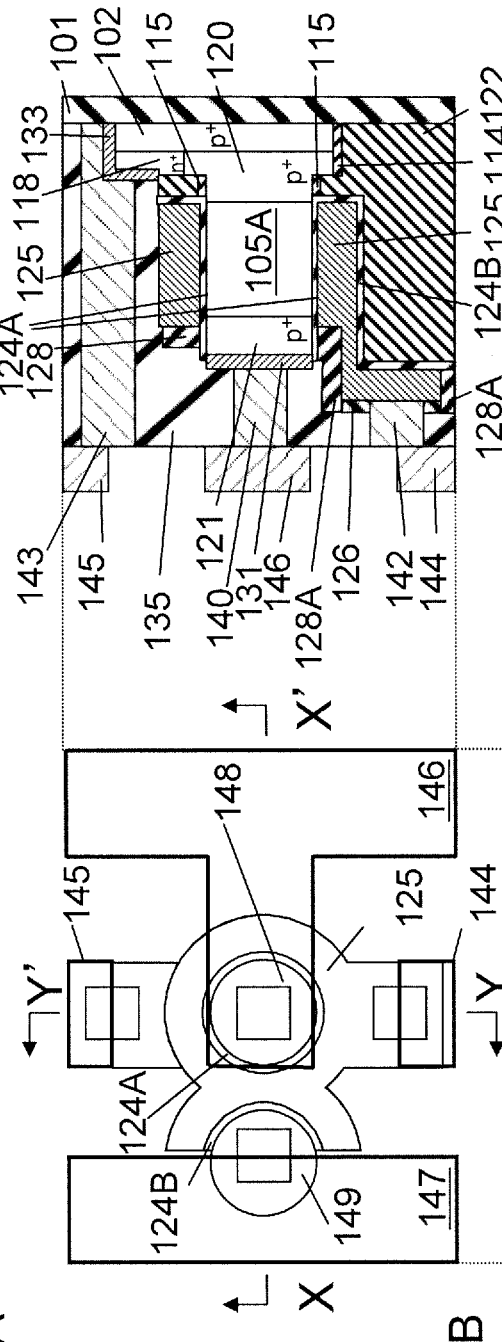
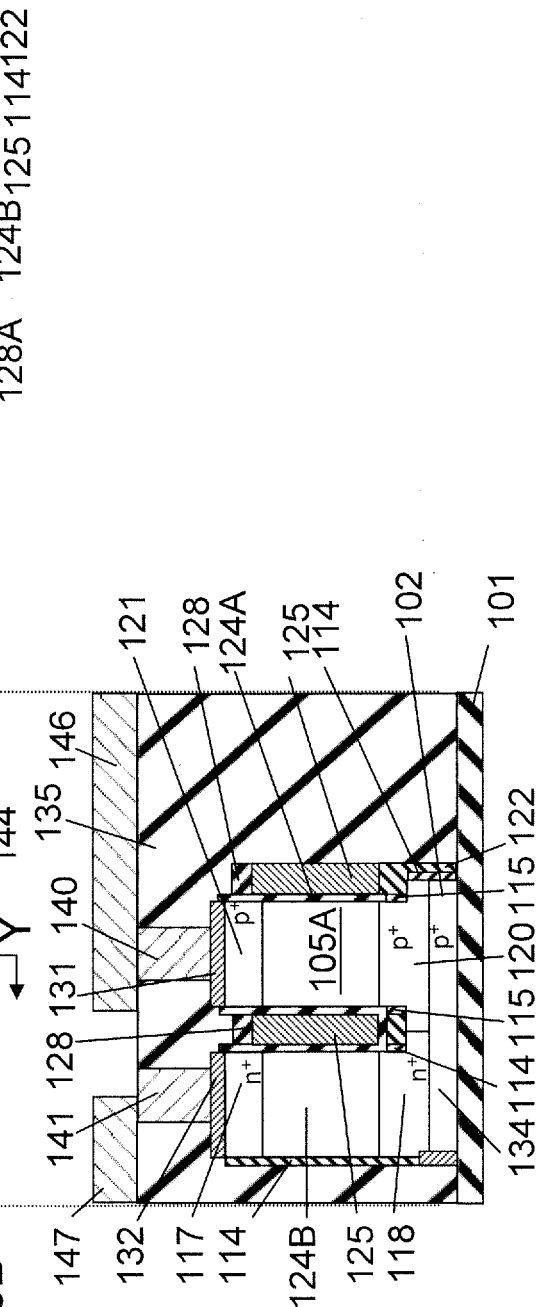
FIG. 66A
FIG. 66B
FIG. 66C

SEMICONDUCTOR DEVICE AND PRODUCTION METHOD

RELATED APPLICATIONS

This application is a divisional patent application of U.S. patent application Ser. No. 14/035,371, filed Sep. 24, 2013, which is a divisional patent application of U.S. patent application Ser. No. 12/854,564, filed Aug. 11, 2010, which claims the benefit of Japanese Patent Application No. 2009-186518, filed Aug. 11, 2009, Japanese Patent Application No. 2009-297210, filed Dec. 28, 2009, U.S. Provisional Application No. 61/274,164, filed Aug. 12, 2009, and U.S. Provisional Application No. 61/335,026, filed Dec. 29, 2009, the entire disclosures of which are incorporated by reference herein.

BACKGROUND OF THE INVENTION

1. Field of the Invention

The present application relates generally to a semiconductor device and method of producing the same.

2. Description of the Related Art

Semiconductor devices, particularly integrated circuits using MOS transistors have increasingly been highly integrated. MOS transistors in integrated circuits have been downsized to nano sizes as the integration level is increased. The basic circuit of digital circuits is an inverter circuit. As MOS transistors constituting an inverter circuit are downsized, problems occur such as difficulty in leaking current control, reduced reliability due to hot carrier effect, and difficulty in reducing the area occupied by circuits while assuring the necessary current quantity. In order to resolve these problems, surrounding gate transistors (SGT) have been proposed in which the source, gate, and drain are provided on a substrate in the vertical direction and the gate surrounds an island-shaped semiconductor, and CMOS inverter circuits using SGTs have been proposed (for example, see S. Watanabe, K. Tsuchida, D. Takashima, Y. Oowaki, A. Nitayama, K. Hieda, H. Takato, K. Sunouchi, F. Horiguchi, K. Ohuchi, F. Masuoka, H. Hara, "A Nobel Circuit Technology with Surrounding Gate Transistors (SGTs) for Ultra High Density DRAMs," IEEE JSSC, Vol. 30, No. 9, 1995).

An inverter is constructed using a pMOS transistor and an nMOS transistor. The mobility of holes is half the mobility of electrons. Therefore, the pMOS transistor must have a gate width double the gate width of the nMOS transistor in an inverter circuit. For this reason, a conventional CMOS inverter circuit using SGTs comprises two pMOS SGTs and one nMOS SGT. In other words, a conventional CMOS inverter circuit using SGTs comprises three island-shaped semiconductors.

SUMMARY OF THE INVENTION

The purpose of the present invention is to provide a semiconductor device consisting of CMOS inverter circuits using highly integrated SGTs.

In order to achieve this object, according to a first aspect of the present invention, there is provided a semiconductor device serving as an inverter, which comprises, a first island-shaped semiconductor layer, a second semiconductor layer, a gate electrode at least a part of which is arranged between the first island-shaped semiconductor layer and the second semiconductor layer, a first gate insulating film at least a part of which is arranged between the first island-shaped semiconductor layer and the gate electrode and is in contact with at least a part of the periphery of the first island-shaped semiconductor layer and a surface of the gate electrode, a second gate insulating film arranged between the second semiconductor layer and gate electrode being in contact with the second semiconductor layer and another surface of the gate electrode, a first first-conductive-type high-concentration semiconductor layer arranged on the top of the first island-shaped semiconductor layer, a second first-conductive-type high-concentration semiconductor layer arranged on the bottom of the island-shaped semiconductor layer and having a polarity identical to that of the first first-conductive-type high-concentration semiconductor layer, a first second-conductive-type high-concentration semiconductor layer arranged on the top of the second semiconductor layer and having a polarity opposite to that of the first first-conductive-type high-concentration semiconductor layer, and a second second-conductive-type high-concentration semiconductor layer arranged on the bottom of the second semiconductor layer and having a polarity opposite to that of the first first-conductive-type high-concentration semiconductor layer.

According to a second aspect of the present invention, there is provided a semiconductor device serving as an inverter, which comprises; a first transistor including; a first island-shaped semiconductor layer; a first gate insulating film surrounding the periphery of the first island-shaped semiconductor layer; a gate electrode surrounding the periphery of the first gate insulting film; a first first-conductive-type high-concentration semiconductor layer arranged on the top of the first island-shaped semiconductor layer; and a second first-conductive-type high-concentration semiconductor layer arranged on the bottom of the island-shaped semiconductor layer and having a polarity identical to that of the first second-conductive-type high-concentration semiconductor layer, and a second transistor including; the gate electrode; a second gate insulating film surrounding a part of the periphery of the gate electrode; a second semiconductor layer in contact with a part of the periphery of the second gate insulating film; a first second-conductive-type high-concentration semiconductor layer arranged on the top of the second semiconductor layer and having a polarity opposite to that of the first second-conductive-type high-concentration semiconductor layer; and a second second-conductive-type high-concentration semiconductor layer arranged on the bottom of the second semiconductor layer and having a polarity opposite to that of the first second-conductive-type high-concentration semiconductor layer.

With the present invention, it is possible to make the semiconductor device finer by using SGTs that can be highly integrated.

BRIEF DESCRIPTION OF THE DRAWINGS

A more complete understanding of this application can be obtained when the following detailed description is considered in conjunction with the following drawings, in which:

FIG. 1A is a plane view of primary elements of a semiconductor device according to a first embodiment of the present invention, FIG. 1B is a cross-sectional view at the line X-X' in FIG. 1A, and FIG. 1C is a cross-sectional view at the line Y-Y' in FIG. 1A;

FIG. 2A is a plane view showing one example of a production process of a semiconductor device according to a first embodiment the present invention, FIG. 2B is a cross-sectional view at the line X-X' in FIG. 2A, and FIG. 2C is a cross-sectional view at the line Y-Y' in FIG. 2A;

FIG. 3A is a plane view showing one example of a production process of a semiconductor device according to a first embodiment the present invention, FIG. 3B is a cross-sectional view at the line X-X' in FIG. 3A, and FIG. 3C is a cross-sectional view at the line Y-Y' in FIG. 3A;

FIG. 4A is a plane view showing one example of a production process of a semiconductor device according to a first embodiment the present invention, FIG. 4B is a cross-sectional view at the line X-X' in FIG. 4A, and FIG. 4C is a cross-sectional view at the line Y-Y' in FIG. 4A;

FIG. 5A is a plane view showing one example of a production process of a semiconductor device according to a first embodiment the present invention, FIG. 5B is a cross-sectional view at the line X-X' in FIG. 5A, and FIG. 5C is a cross-sectional view at the line Y-Y' in FIG. 5A;

FIG. 6A is a plane view showing one example of a production process of a semiconductor device according to a first embodiment the present invention, FIG. 6B is a cross-sectional view at the line X-X' in FIG. 6A, and FIG. 6C is a cross-sectional view at the line Y-Y' in FIG. 6A;

FIG. 7A is a plane view showing one example of a production process of a semiconductor device according to a first embodiment the present invention, FIG. 7B is a cross-sectional view at the line X-X' in FIG. 7A, and FIG. 7C is a cross-sectional view at the line Y-Y' in FIG. 7A;

FIG. 8A is a plane view showing one example of a production process of a semiconductor device according to a first embodiment the present invention, FIG. 8B is a cross-sectional view at the line X-X' in FIG. 8A, and FIG. 8C is a cross-sectional view at the line Y-Y' in FIG. 8A;

FIG. 9A is a plane view showing one example of a production process of a semiconductor device according to a first embodiment the present invention, FIG. 9B is a cross-sectional view at the line X-X' in FIG. 9A, and FIG. 9C is a cross-sectional view at the line Y-Y' in FIG. 9A;

FIG. 10A is a plane view showing one example of a production process of a semiconductor device according to a first embodiment the present invention, FIG. 10B is a cross-sectional view at the line X-X' in FIG. 10A, and FIG. 10C is a cross-sectional view at the line Y-Y' in FIG. 10A;

FIG. 12A is a plane view showing one example of a production process of a semiconductor device according to a first embodiment the present invention, FIG. 12B is a cross-sectional view at the line X-X' in FIG. 12A, and FIG. 12C is a cross-sectional view at the line Y-Y' in FIG. 12A;

FIG. 13A is a plane view showing one example of a production process of a semiconductor device according to a first embodiment the present invention, FIG. 13B is a cross-sectional view at the line X-X' in FIG. 13A, and FIG. 13C is a cross-sectional view at the line Y-Y' in FIG. 13A;

FIG. 14A is a plane view showing one example of a production process of a semiconductor device according to a first embodiment the present invention, FIG. 14B is a cross-sectional view at the line X-X' in FIG. 14A, and FIG. 14C is a cross-sectional view at the line Y-Y' in FIG. 14A;

FIG. 15A is a plane view showing one example of a production process of a semiconductor device according to a first embodiment the present invention, FIG. 15B is a cross-sectional view at the line X-X' in FIG. 15A, and FIG. 15C is a cross-sectional view at the line Y-Y' in FIG. 15A;

FIG. 16A is a plane view showing one example of a production process of a semiconductor device according to a first embodiment the present invention, FIG. 16B is a cross-sectional view at the line X-X' in FIG. 16A, and FIG. 16C is a cross-sectional view at the line Y-Y' in FIG. 16A;

FIG. 17A is a plane view showing one example of a production process of a semiconductor device according to a first embodiment the present invention, FIG. 17B is a cross-sectional view at the line X-X' in FIG. 17A, and FIG. 17C is a cross-sectional view at the line Y-Y' in FIG. 17A;

FIG. 18A is a plane view showing one example of a production process of a semiconductor device according to a first embodiment the present invention, FIG. 18B is a cross-sectional view at the line X-X' in FIG. 18A, and FIG. 18C is a cross-sectional view at the line Y-Y' in FIG. 18A;

FIG. 20A is a plane view showing one example of a production process of a semiconductor device according to a first embodiment the present invention, FIG. 20B is a cross-sectional view at the line X-X' in FIG. 20A, and FIG. 20C is a cross-sectional view at the line Y-Y' in FIG. 20A;

FIG. 22A is a plane view showing one example of a production process of a semiconductor device according to a first embodiment the present invention, FIG. 22B is a cross-sectional view at the line X-X' in FIG. 22A, and FIG. 22C is a cross-sectional view at the line Y-Y' in FIG. 22A;

FIG. 24A is a plane view showing one example of a production process of a semiconductor device according to a first embodiment the present invention, FIG. 24B is a cross-sectional view at the line X-X' in FIG. 24A, and FIG. 24C is a cross-sectional view at the line Y-Y' in FIG. 24A;

FIG. 25A is a plane view showing one example of a production process of a semiconductor device according to a first embodiment the present invention, FIG. 25B is a cross-sectional view at the line X-X' in FIG. 25A, and FIG. 25C is a cross-sectional view at the line Y-Y' in FIG. 25A;

FIG. 27A is a plane view showing one example of a production process of a semiconductor device according to a first embodiment the present invention, FIG. 27B is a cross-sectional view at the line X-X' in FIG. 27A, and FIG. 27C is a cross-sectional view at the line Y-Y' in FIG. 27A;

FIG. 30A is a plane view showing one example of a production process of a semiconductor device according to a first embodiment the present invention, FIG. 30B is a cross-sectional view at the line X-X' in FIG. 30A, and FIG. 30C is a cross-sectional view at the line Y-Y' in FIG. 30A;

FIG. 31A is a plane view showing one example of a production process of a semiconductor device according to a first embodiment the present invention, FIG. 31B is a cross-sectional view at the line X-X' in FIG. 31A, and FIG. 31C is a cross-sectional view at the line Y-Y' in FIG. 31A;

FIG. 33A is a plane view showing one example of a production process of a semiconductor device according to a first embodiment the present invention, FIG. 33B is a cross-sectional view at the line X-X' in FIG. 33A, and FIG. 33C is a cross-sectional view at the line Y-Y' in FIG. 33A;

FIG. 34A is a plane view showing one example of a production process of a semiconductor device according to a first embodiment the present invention, FIG. 34B is a cross-sectional view at the line X-X' in FIG. 34A, and FIG. 34C is a cross-sectional view at the line Y-Y' in FIG. 34A;

FIG. 36A is a plane view showing one example of a production process of a semiconductor device according to a first embodiment the present invention, FIG. 36B is a cross-sectional view at the line X-X' in FIG. 36A, and FIG. 36C is a cross-sectional view at the line Y-Y' in FIG. 36A;

FIG. 37A is a plane view showing one example of a production process of a semiconductor device according to a first embodiment the present invention, FIG. 37B is a cross-sectional view at the line X-X' in FIG. 37A, and FIG. 37C is a cross-sectional view at the line Y-Y' in FIG. 37A;

FIG. 40A is a plane view showing one example of a production process of a semiconductor device according to a first embodiment the present invention, FIG. 40B is a cross-sectional view at the line X-X' in FIG. 40A, and FIG. 40C is a cross-sectional view at the line Y-Y' in FIG. 40A;

FIG. 42A is a plane view showing one example of a production process of a semiconductor device according to a first embodiment the present invention, FIG. 42B is a cross-sectional view at the line X-X' in FIG. 42A, and FIG. 42C is a cross-sectional view at the line Y-Y' in FIG. 42A;

FIG. 45A is a plane view showing one example of a production process of a semiconductor device according to a first embodiment the present invention, FIG. 45B is a cross-sectional view at the line X-X' in FIG. 45A, and FIG. 45C is a cross-sectional view at the line Y-Y' in FIG. 45A;

FIG. 46A is a plane view showing one example of a production process of a semiconductor device according to a first embodiment the present invention, FIG. 46B is a cross-sectional view at the line X-X' in FIG. 46A, and FIG. 46C is a cross-sectional view at the line Y-Y' in FIG. 46A;

FIG. 47A is a plane view showing one example of a production process of a semiconductor device according to a first embodiment the present invention, FIG. 47B is a cross-sectional view at the line X-X' in FIG. 47A, and FIG. 47C is a cross-sectional view at the line Y-Y' in FIG. 47A;

FIG. 50A is a plane view showing one example of a production process of a semiconductor device according to a first embodiment the present invention, FIG. 50B is a cross-sectional view at the line X-X' in FIG. 50A, and FIG. 50C is a cross-sectional view at the line Y-Y' in FIG. 50A;

FIG. 53A is a plane view showing one example of a production process of a semiconductor device according to a first embodiment the present invention, FIG. 53B is a cross-sectional view at the line X-X' in FIG. 53A, and FIG. 53C is a cross-sectional view at the line Y-Y' in FIG. 53A;

FIG. 55A is a plane view showing one example of a production process of a semiconductor device according to a first embodiment the present invention, FIG. 55B is a cross-sectional view at the line X-X' in FIG. 55A, and FIG. 55C is a cross-sectional view at the line Y-Y' in FIG. 55A;

FIG. 58A is a plane view showing one example of a production process of a semiconductor device according to a first embodiment the present invention, FIG. 58B is a cross-sectional view at the line X-X' in FIG. 58A, and FIG. 58C is a cross-sectional view at the line Y-Y' in FIG. 58A;

FIG. 59A is a plane view showing one example of a production process of a semiconductor device according to a first embodiment the present invention, FIG. 59B is a cross-sectional view at the line X-X' in FIG. 59A, and FIG. 59C is a cross-sectional view at the line Y-Y' in FIG. 59A;

FIG. 60A is a plane view showing one example of a production process of a semiconductor device according to a first embodiment the present invention, FIG. 60B is a cross-sectional view at the line X-X' in FIG. 60A, and FIG. 60C is a cross-sectional view at the line Y-Y' in FIG. 60A;

FIG. 61A is a plane view showing one example of a production process of a semiconductor device according to a first embodiment the present invention, FIG. 61B is a cross-sectional view at the line X-X' in FIG. 61A, and FIG. 61C is a cross-sectional view at the line Y-Y' in FIG. 61A;

FIG. 62A is a plane view of primary elements of a semiconductor device according to a second embodiment of the present invention, FIG. 62B is a cross-sectional view at the line X-X' in FIG. 62A, and FIG. 62C is a cross-sectional view at the line Y-Y' in FIG. 62A;

FIG. 65A is a plane view of primary elements of a semiconductor device according to a fifth embodiment of the present invention, FIG. 65B is a cross-sectional view at the line X-X' in FIG. 65A, and FIG. 65C is a cross-sectional view at the line Y-Y' in FIG. 65A; and FIG. 66A is a plane view of primary elements of a semiconductor device according to a sixth embodiment of the present invention, FIG. 66B is a cross-sectional view at the line X-X' in FIG. 66A, and FIG. 66C is a cross-sectional view at the line Y-Y' in FIG. 66A.

DETAILED DESCRIPTION OF THE PREFERRED EMBODIMENTS

Embodiment 1

Figure 11A:
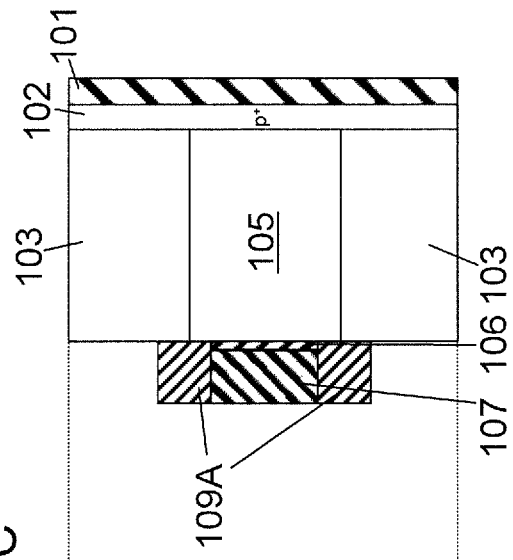
FIG. 11A is a plane view showing one example of a production process of a semiconductor device according to a first embodiment the present invention.

FIG. 1A is a plane view of an inverter consisting of an nMOS transistor and a pMOS transistor according to a first embodiment of the present invention, FIG. 1B is a cross-sectional view at the line X-X' in FIG. 1A, and FIG. 1C is a cross-sectional view at the line Y-Y' in FIG. 1A.

The inverter according to the first embodiment is described below with reference to FIGS. 1A to 1C. The inverter according to the first embodiment has a pMOS SGT 148 and an nMOS transistor 149. The nMOS transistor 149 is formed so as to surround the pMOS SGT 148.

The pMOS SGT 148 includes an island-shaped silicon layer 105. A first gate insulating film 124A is formed so as to surround the periphery of the island-shaped silicon layer 105. The first gate insulating film 124A is a high-K film, for example a silicon oxide film, a silicon nitride film, hafnium oxide, hafnium oxynitride, lanthanum oxide or the like. In addition, a gate electrode 125 is formed so as to surround the periphery of the first gate insulating film 124A. The gate electrode 125 is, for example, titanium, titanium nitride, tantalum, tantalum nitride, tungsten or the like. In addition, a first p+ type silicon layer 121 is formed on the top of the island-shaped silicon layer 105 and a second p+ type silicon layer 120 is formed on the bottom of the island-shaped silicon layer 105. In this embodiment, the first p+ type silicon layer 121 serves as the source scattering layer and the second p+ type silicon layer 120 serves as a drain scattering layer. In addition, the island-shaped silicon layer 105 serves as a channel area. In the present embodiment, a channel is formed in the island-shaped silicon layer 105 by a voltage being impressed on the gate electrode 125 during operation.

The nMOS transistor 149 includes a second silicon layer 103. The nMOS transistor 149 shares the gate electrode 125 with the pMOS SGT 148. A second gate insulating film 124B is formed so as to contact the second silicon layer 103 while surrounding a part of the periphery of the gate electrode 125 of this pMOS transistor. The second gate insulating film 124B is a high-K film, similar to the first gate insulating film 124A. In addition, a first n+ type silicon layer 117 is formed on the top of the second silicon layer 103 and a second n+ type silicon layer 118 is formed on the bottom of the second silicon layer 103. In this embodiment, the first n+ type silicon layer 117 serves as a source scattering layer and the second n+ type silicon layer 118 serves as a drain scattering layer 118. In addition, the second silicon layer 103 serves as a channel area. In the present embodiment, a channel is formed in the second silicon layer 103 by a voltage being impressed on the gate electrode 125 during operation.

In addition, the nMOS transistor 149 and the pMOS SGT 148 share the gate electrode 125 and the distance between the two transistors is extremely short due to the nMOS transistor surrounding a part of the periphery of the pMOS SGT 148.

In addition, a third p+ type silicon layer 102 is formed on the bottom of the second n+ type silicon layer 118 and the second p+ type silicon layer 120.

Furthermore, a first silicon-metal compound layer 133 and a fourth silicon-metal compound layer 134 are formed on a part of the side wall of the second n+ type silicon layer 118 and the third p+ type silicon layer 102, a second silicon-metal compound layer 132 is formed on the top of the first n+ type silicon layer 117 and a third silicon-metal compound layer 131 is formed on the top of the first p+ type silicon layer. As the metal comprising the silicon-metal compound layers, nickel or cobalt may be used, for example. Through these silicon-metal compound layers, the second n+ type silicon layer 118, the third p+ type silicon layer 102, the first n+ type silicon layer 117 and the first p+ type silicon layer are connected to the below-described contacts. Through this, the resistances of the gate, source and drain are reduced.

A contact 142 is formed so as to connect to the gate electrode 125, and an input terminal line 144 is formed so as to connect to that contact 142. In addition, a contact 143 is formed so as to connect to the first silicon-metal compound layer 133 and an output terminal line 145 is formed so as to connect to that contact 143. A contact 141 is formed so as to connect to the second silicon-metal compound layer 132 and a VSS power line 147 is formed so as to connect to that contact 141. A contact 140 is formed so as to connect to the third silicon-metal compound layer 131 and a VDD power line 146 is formed so as to connect to that contact 140.

In addition, an interlayer film 135 such as an oxide film is formed around the periphery of the pMOS SGT 148 and the nMOS transistor 149.

Furthermore, it is preferable for Wp≈2 Wn, where Wn is the length of an arc along which the second semiconductor layer 103 is in contact with a part of the periphery of the second gate insulating film 124 and Wp is the outer peripheral length of the island-shaped semiconductor layer 105. In this case, it is possible for the gate width of the pMOS transistor 149 to be double the gate width of the nMOS SGT 148.

In such a case, it is preferable that Lp≈Ln in which Ln is the channel length of the second silicon layer and Lp is the channel length of the island-shaped silicon layer.

Through the above, it is possible for the inverter circuit to be composed of only the pMOS SGT 148 and the nMOS transistor 149.

Through the above, the inverter circuit is composed of the pMOS SGT 148 and the nMOS transistor 149.

Through the above composition, the inverter according to the present invention is composed of SGTs that can be highly integrated. Through this, it is possible to make semiconductor devices finer by using this inverter.

An exemplary production process for forming the inverter equipped with an SGT according to this embodiment of the present invention will be described hereafter with reference to FIGS. 2A to 61C. In these figures, the same components are referred to by the same reference numbers. In each figure, part A is a planar view, part B is a cross-sectional view at a line X-X', and part C is a cross-sectional view at a line Y-Y'.

Referring to FIGS. 2A to 2C, a p type or non-doped silicon layer 103 is formed on an oxide film 101 and a dopant such as boron is implanted on the bottom of this silicon layer 103 to form a third p+ type silicon layer 102.

Referring to FIGS. 3A to 3C, a resist 104 for forming an n type silicon layer is formed on the p type or non-doped silicon layer 103. When a non-doped silicon layer is used as the silicon layer 103, this step is unnecessary.

Referring to FIGS. 4A to 4C, a dopant such as phosphorus is implanted in an area where an nMOS is slated to be formed to form an n type silicon layer 105. When a non-doped silicon layer is used as the silicon layer 103, this step is unnecessary. In this case, the silicon layer 105 is not an n type but a non-doped silicon layer.

Referring to FIGS. 5A to 5C, the resist 104 is removed and heat treatment is performed. When a non-doped silicon layer is used as the silicon layer 103, this step is unnecessary.

Referring to FIGS. 6A to 6C, an oxide film 106 is deposited on the result of the above steps, and on top of that a nitride film 107 is formed.

Referring to FIGS. 7A to 7C, a resist 108 for forming an island-shaped silicon layer 105 is formed on the nitride film 107 above the silicon layer 105.

Referring to FIGS. 8A to 8C, the nitride film 107 and oxide film 106 are etched and the parts not covered by the resist 108 are removed.

Referring to FIGS. 9A to 9C, the resist 108 is removed.

Referring to FIGS. 10A to 10C, an oxide film 109 is formed on the result of the above steps.

Figure 11B:
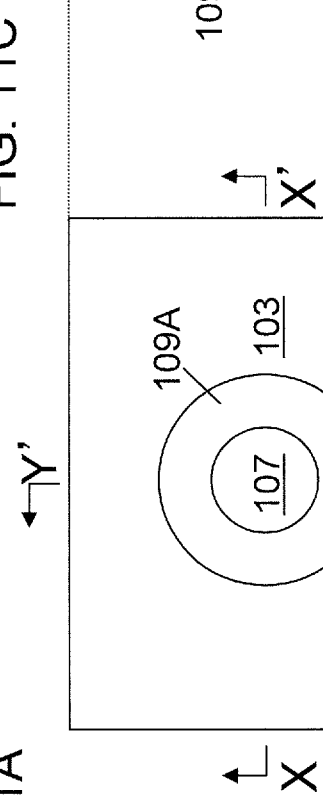
FIG. 11B is a cross-sectional view at the line X-X' in FIG. 11A.
Figure 11C:
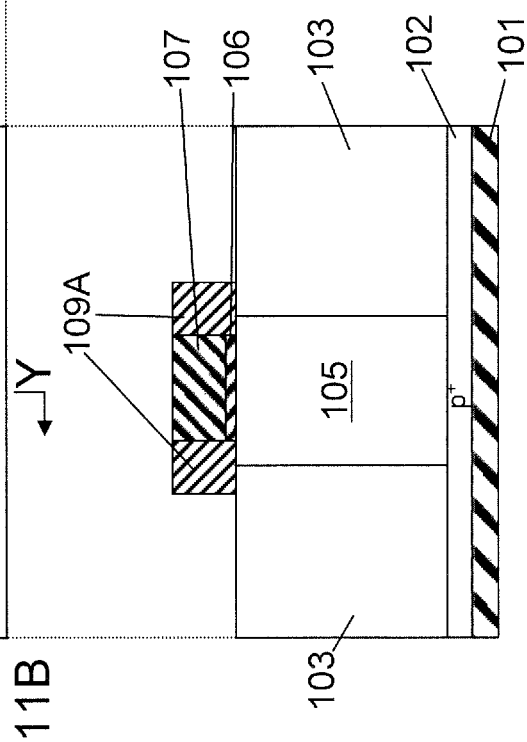
FIG. 11C is a cross-sectional view at the line Y-Y' in FIG. 11A.

Referring to FIGS. 11A to 11C, the oxide film 109 is partially removed through etching and left in a sidewall shape on the side wall of the nitride film 107 and the oxide film 106 to form a nitride film sidewall 109A.

Referring to FIGS. 12A to 12C, a nitride film 110 is formed on the result of the above steps.

Referring to FIGS. 13A to 13C, the nitride film 110 is partially removed through etching and left in a sidewall shape on the side wall of the oxide film sidewall 109A to form a nitride film sidewall 110A.

Referring to FIGS. 14A to 14C, a resist 111 for forming a second silicon layer is formed.

Referring to FIGS. 15A to 15C, the nitride film sidewall 110A is partially removed through etching to form a nitride film hard mask 110B for forming a second silicon layer.

Referring to FIGS. 16A to 16C, the oxide film sidewall 109A is partially removed through etching.

Referring to FIGS. 17A to 17C, the resist 111 is removed.

Referring to FIGS. 18A to 18C, a resist 112 for an output terminal 501 (see FIGS. 1A to 1C) is formed.

Figures 19A, 19B, 19C:
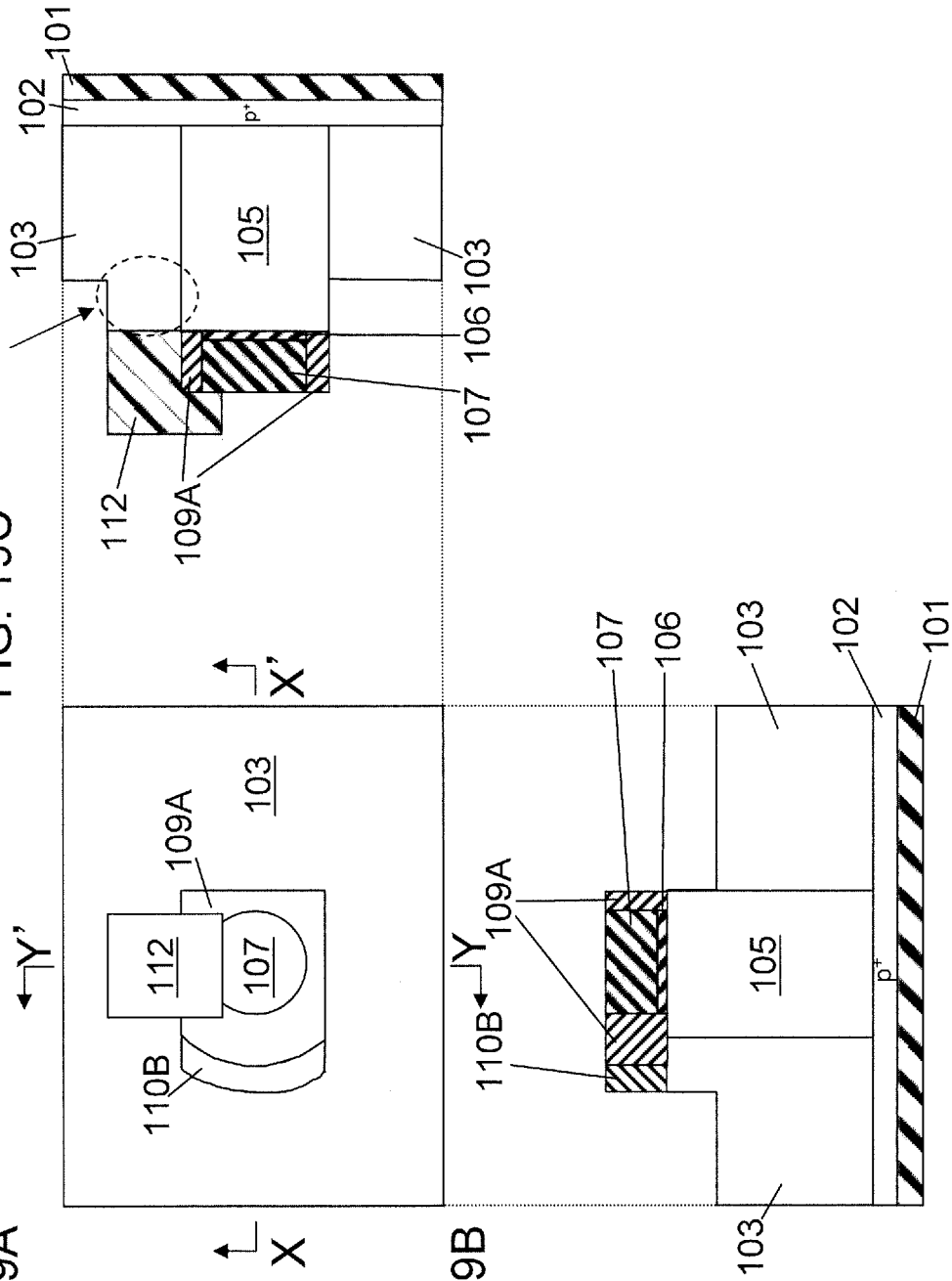
FIG. 19A is a plane view showing one example of a production process of a semiconductor device according to a first embodiment the present invention.
FIG. 19B is a cross-sectional view at the line X-X' in FIG. 19A.
FIG. 19C is a cross-sectional view at the line Y-Y' in FIG. 19A.

Referring to FIGS. 19A to 19C, the silicon layer 103 is partially removed through etching to form an output terminal part 502.

Referring to FIGS. 20A to 20C, the resist 112 is removed.

Figure 21A:
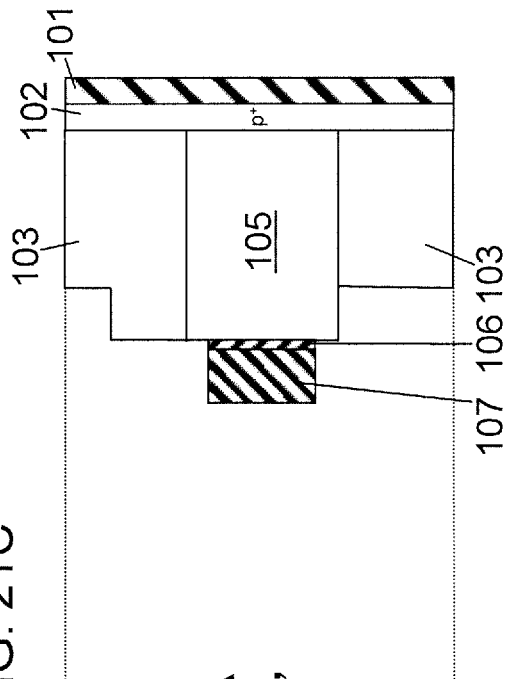
FIG. 21A is a plane view showing one example of a production process of a semiconductor device according to a first embodiment the present invention.
Figure 21B:
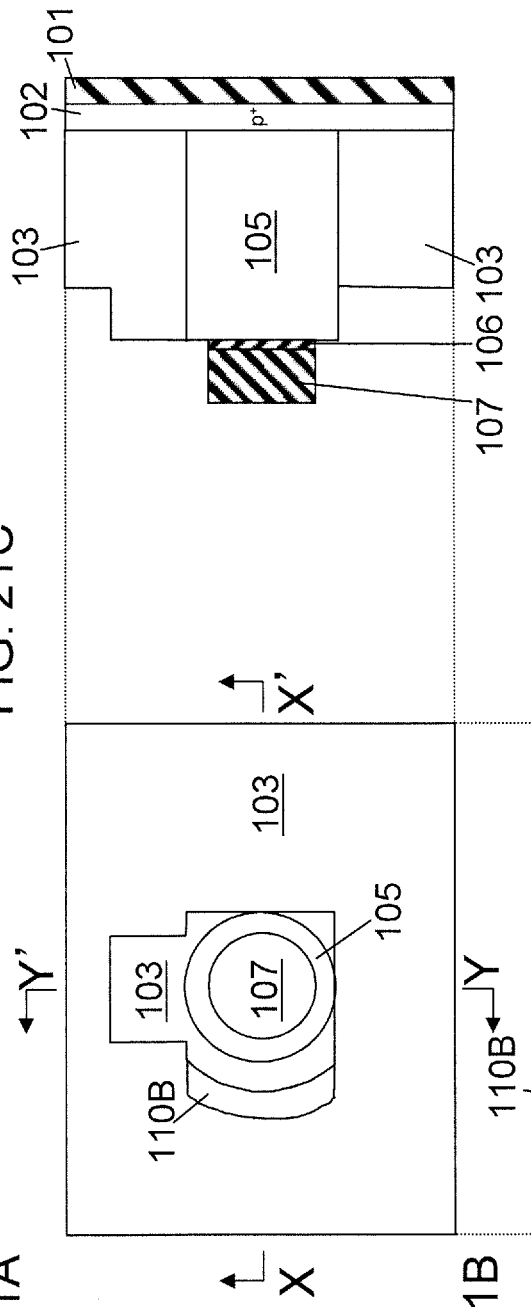
FIG. 21B is a cross-sectional view at the line X-X' in FIG. 21A.
Figure 21C:
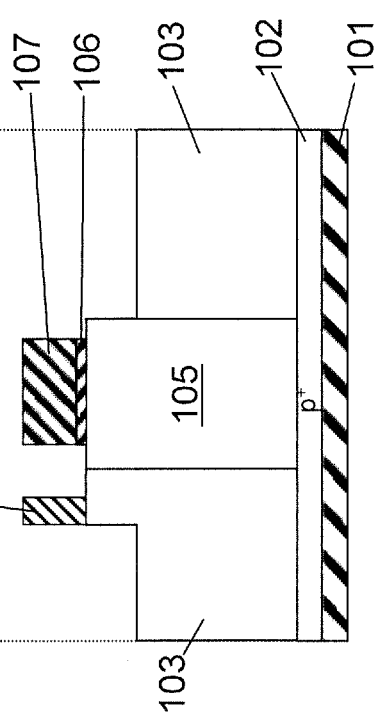
FIG. 21C is a cross-sectional view at the line Y-Y' in FIG. 21A.

Referring to FIGS. 21A to 21C, the oxide film 109 is removed through etching.

Referring to FIGS. 22A to 22C, the silicon layers 103 and 105 are partially removed through etching to form an island-shaped silicon layer 105A and a second silicon layer 103A.

Figures 23A, 23B, 23C:
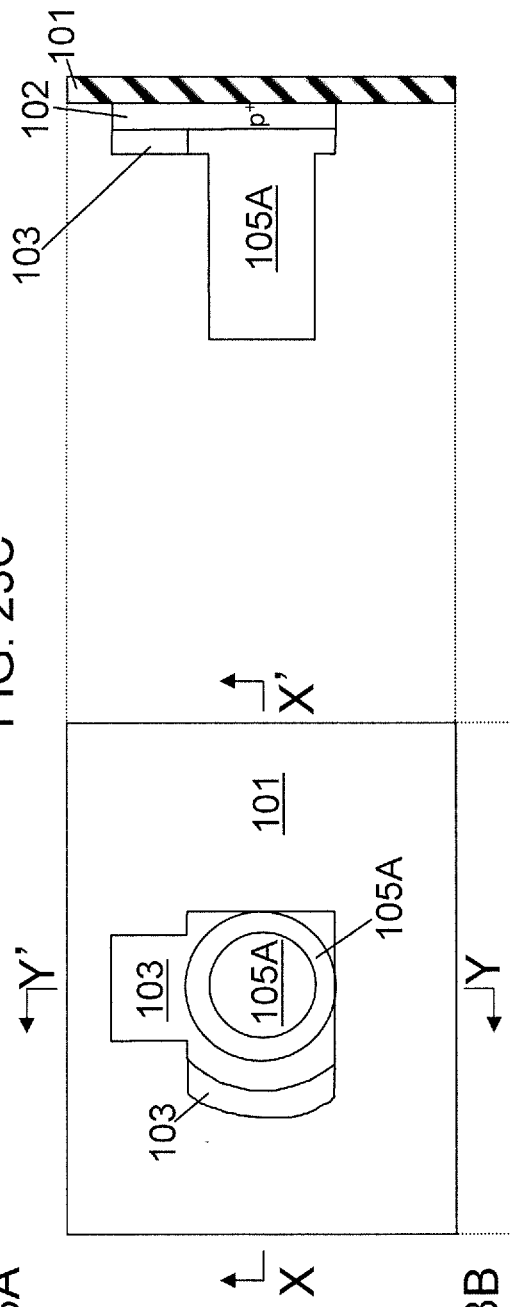
FIG. 23A is a plane view showing one example of a production process of a semiconductor device according to a first embodiment the present invention.
FIG. 23B is a cross-sectional view at the line X-X' in FIG. 23A.
FIG. 23C is a cross-sectional view at the line Y-Y' in FIG. 23A.

Referring to FIGS. 23A to 23C, the nitride film 107 and oxide film 106 are removed Referring to FIGS. 24A to 24C, a nitride film 113 is formed on the surface of the result of the above steps.

Referring to FIGS. 25A to 25C, the nitride film 113 is partially removed through etching, and nitride film sidewalls 114 and 115 for protecting the channels during later ion implantation are formed on the sidewalls of the second silicon layer 103A and the island-shaped silicon layer 105A, respectively.

Figure 26A:
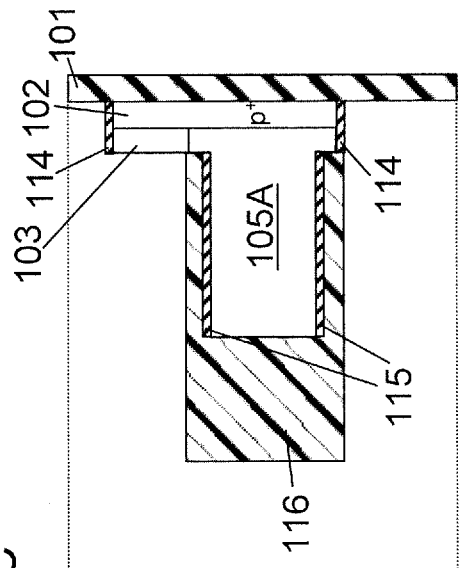
FIG. 26A is a plane view showing one example of a production process of a semiconductor device according to a first embodiment the present invention.
Figure 26B:
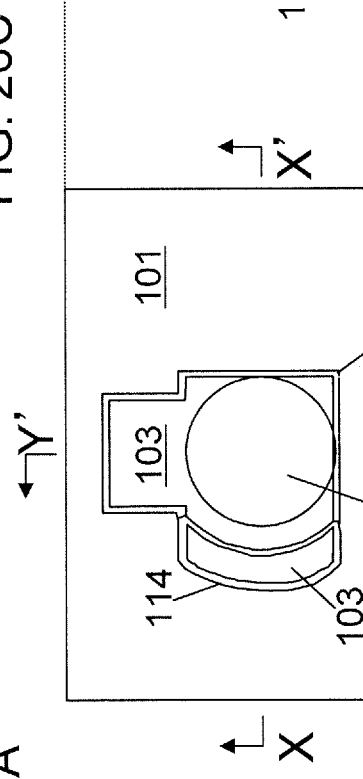
FIG. 26B is a cross-sectional view at the line X-X' in FIG. 26A.
Figure 26C:
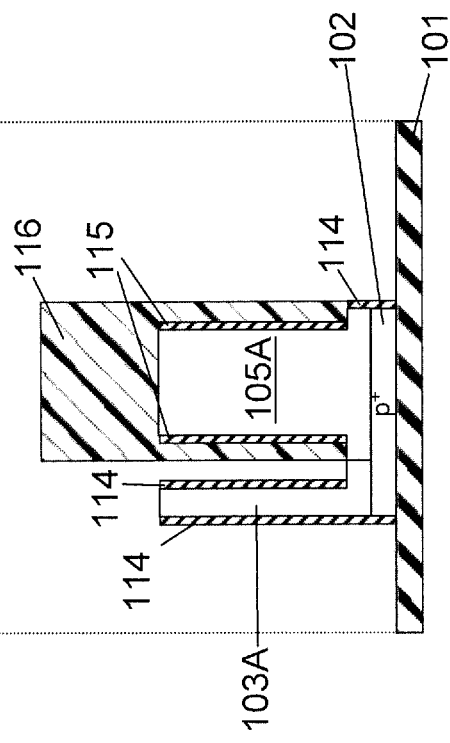
FIG. 26C is a cross-sectional view at the line Y-Y' in FIG. 26A.

Referring to FIGS. 26A to 26C, a resist 116 for forming an n+ type silicon layer is formed at the periphery of the island-shaped silicon layer 105A.

Referring to FIGS. 27A to 27C, a dopant such as arsenic is implanted on the top and bottom of the second silicon layer 103A to form a first n+ type silicon layer 117 and a second n+ type silicon layer 118, respectively.

Figures 28A, 28B, 28C:
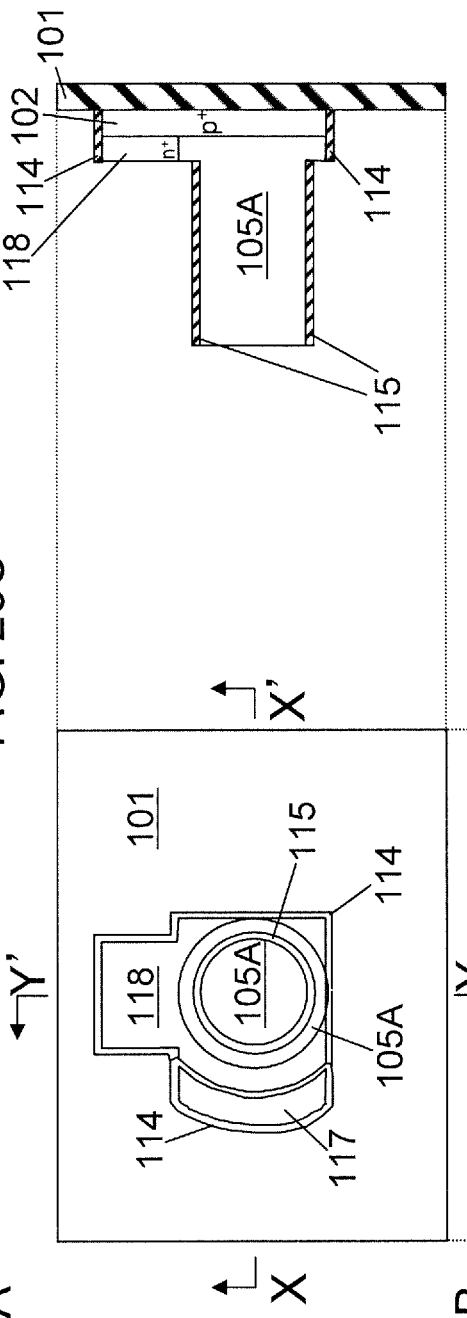
FIG. 28A is a plane view showing one example of a production process of a semiconductor device according to a first embodiment the present invention.
FIG. 28B is a cross-sectional view at the line X-X' in FIG. 28A.
FIG. 28C is a cross-sectional view at the line Y-Y' in FIG. 28A.

Referring to FIGS. 28A to 28C, the resist 116 is removed.

Figures 29A, 29B, 29C:
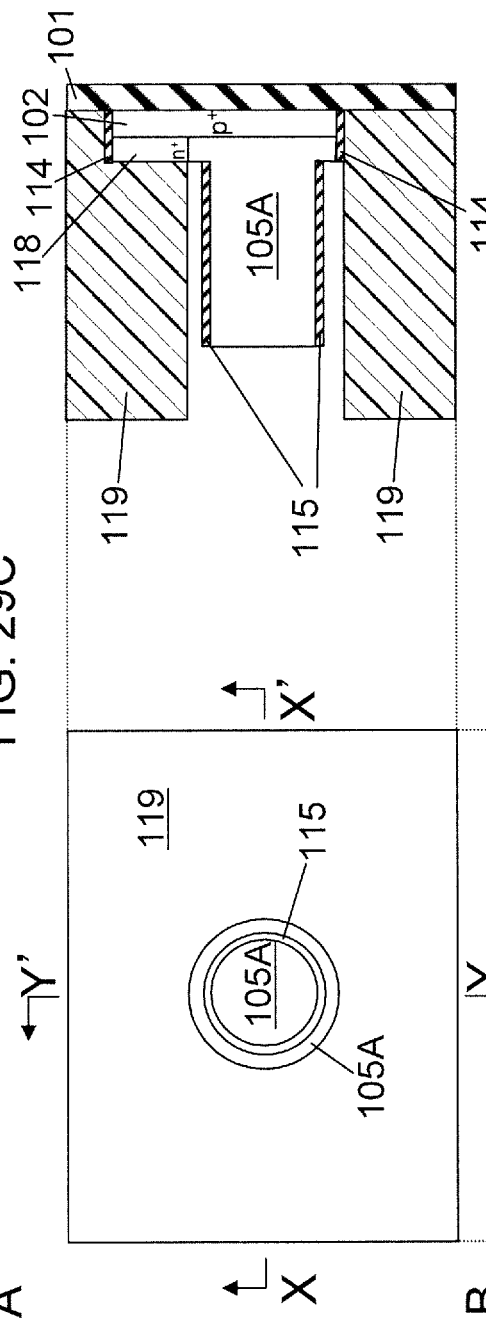
FIG. 29A is a plane view showing one example of a production process of a semiconductor device according to a first embodiment the present invention.
FIG. 29B is a cross-sectional view at the line X-X' in FIG. 29A.
FIG. 29C is a cross-sectional view at the line Y-Y' in FIG. 29A.

Referring to FIGS. 29A to 29C, a resist 119 for forming a p+ type silicon layer is formed on the result of the above steps except the surroundings of the island-shaped silicon layer 105A.

Referring to FIGS. 30A to 30C, a dopant such as boron is implanted on the top and bottom of the island-shaped silicon layer 105A to form a first p+ type silicon layer 121 and a second p+ type silicon layer 120, respectively.

Referring to FIGS. 31A to 31C, the resist 119 is removed and heat treatment is performed.

Figures 32A, 32B, 32C:
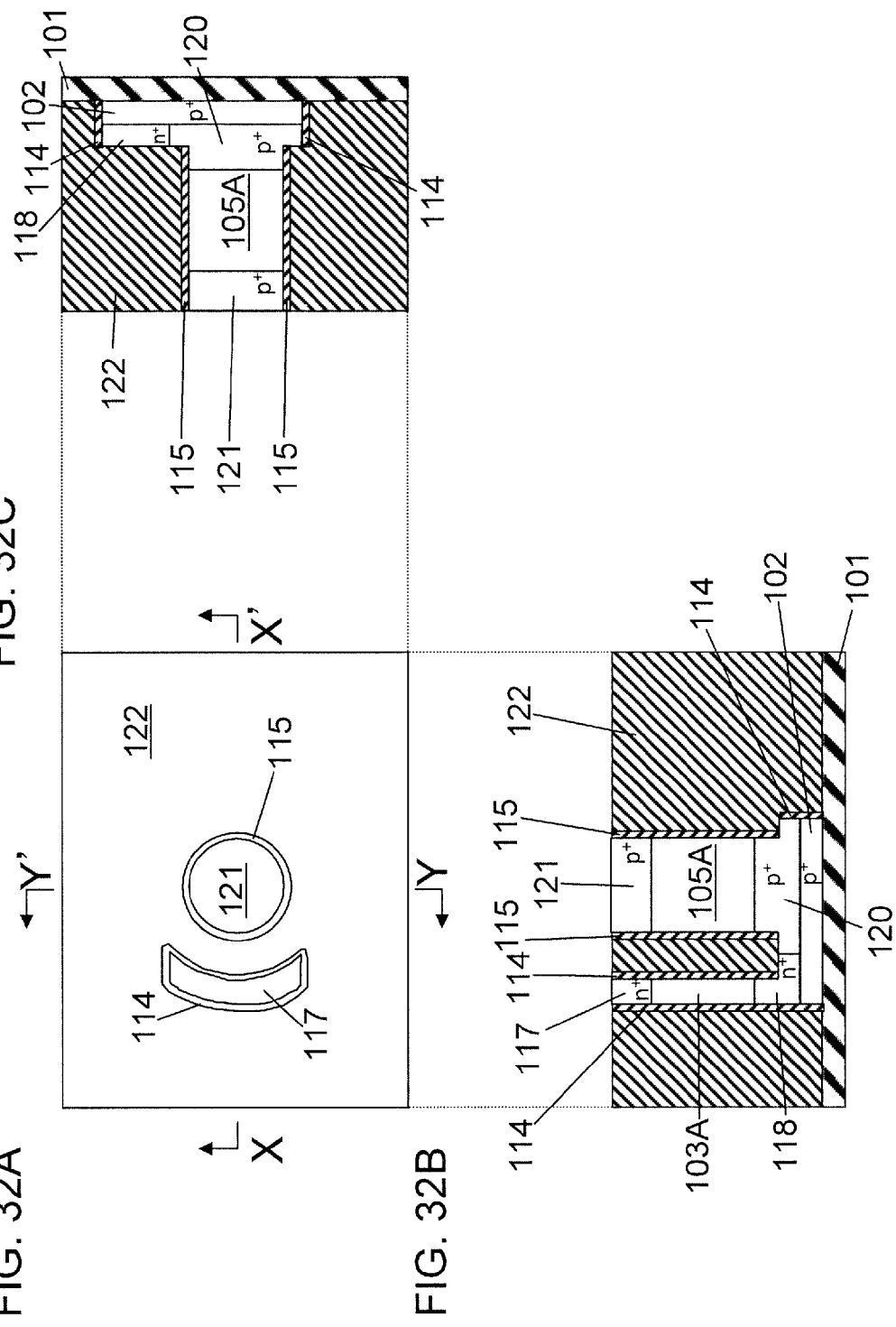
FIG. 32A is a plane view showing one example of a production process of a semiconductor device according to a first embodiment the present invention.
FIG. 32B is a cross-sectional view at the line X-X' in FIG. 32A.
FIG. 32C is a cross-sectional view at the line Y-Y' in FIG. 32A.

Referring to FIGS. 32A to 32C, an oxide film 122 is formed on the result of the above steps, then flattened and etched back to expose the first n+ type silicon layer 117 and first p+ type silicon layer 121.

Referring to FIGS. 33A to 33C, a resist 123 for forming a gate part 503 (see FIGS. 42A to 42C) is formed.

Referring to FIGS. 34A to 34C, the oxide film 122 of the area where gate part formation is slated is removed through etching.

Figures 35A, 35B, 35C:
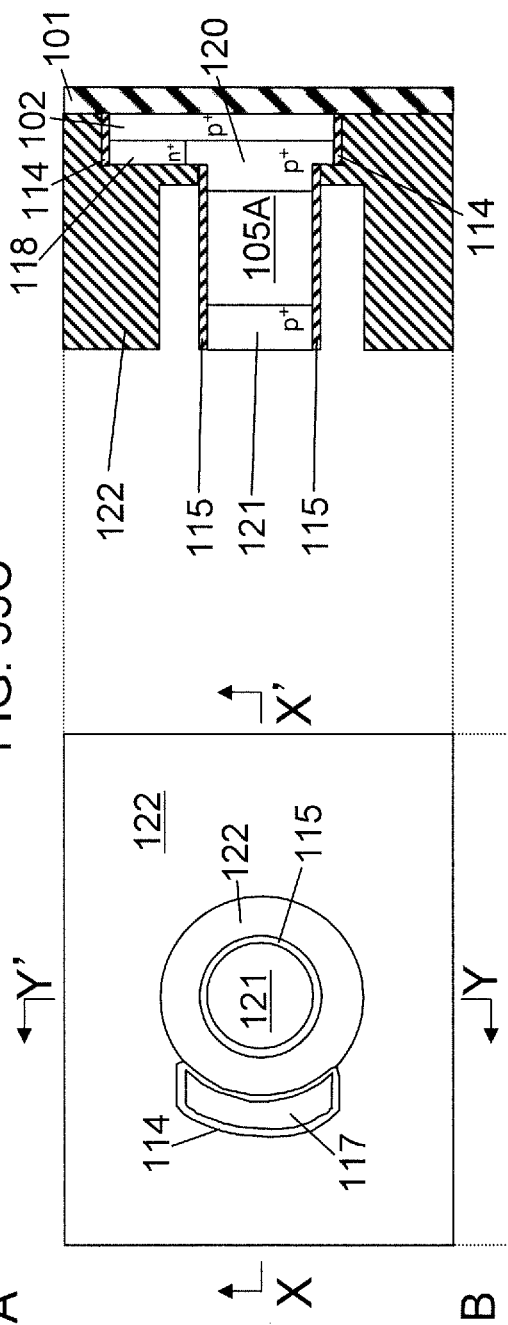
FIG. 35A is a plane view showing one example of a production process of a semiconductor device according to a first embodiment the present invention.
FIG. 35B is a cross-sectional view at the line X-X' in FIG. 35A.
FIG. 35C is a cross-sectional view at the line Y-Y' in FIG. 35A.

Referring to FIGS. 35A to 35C, the resist 123 is removed.

Referring to FIGS. 36A to 36C, the nitride films 114 and 115 are etched and removed from the sidewall surface of the island-shaped silicon layer 105A and the sidewall surface of the second silicon layer 103A facing this sidewall surface.

Figures 38A, 38B, 38C:
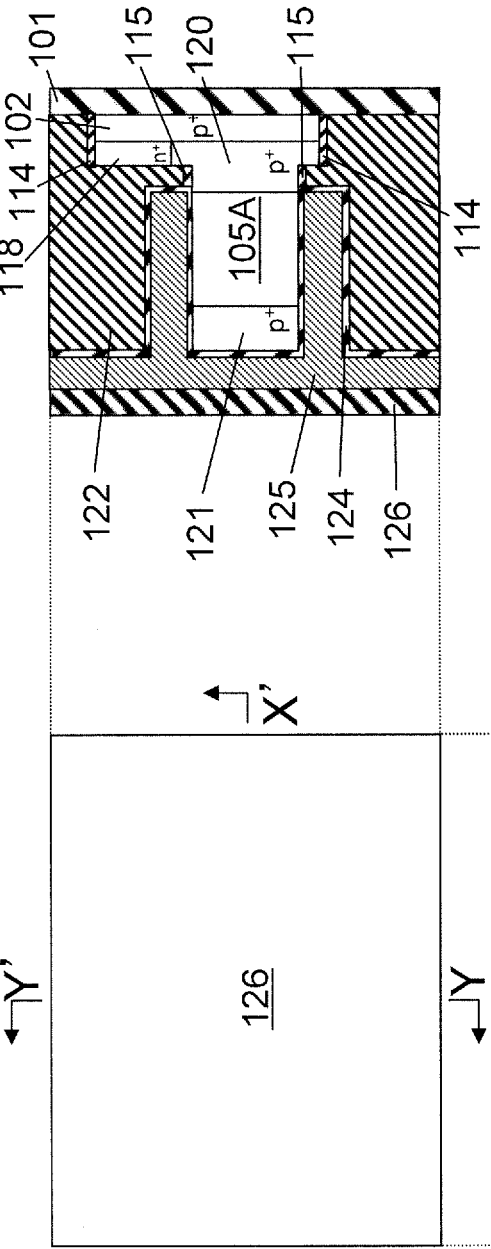
FIG. 38A is a plane view showing one example of a production process of a semiconductor device according to a first embodiment the present invention.
FIG. 38B is a cross-sectional view at the line X-X' in FIG. 38A.
FIG. 38C is a cross-sectional view at the line Y-Y' in FIG. 38A.

Referring to FIGS. 37A to 37C, a high-K film 124 is formed on the surface of the result of the above steps. The high-K film 124 contains at least one of the following substances: silicon oxynitride film, silicon nitride film, hafnium oxide, hafnium oxynitride, and lanthanum oxide. Then, a metal layer 125 is formed. The metal layer 125 contains at least one of the following substances: titanium, titanium nitride, tantalum, tantalum nitride, and tungsten Referring to FIGS. 38A to 38C, a nitride film 126 is formed on the result of the above steps.

Figure 39A:
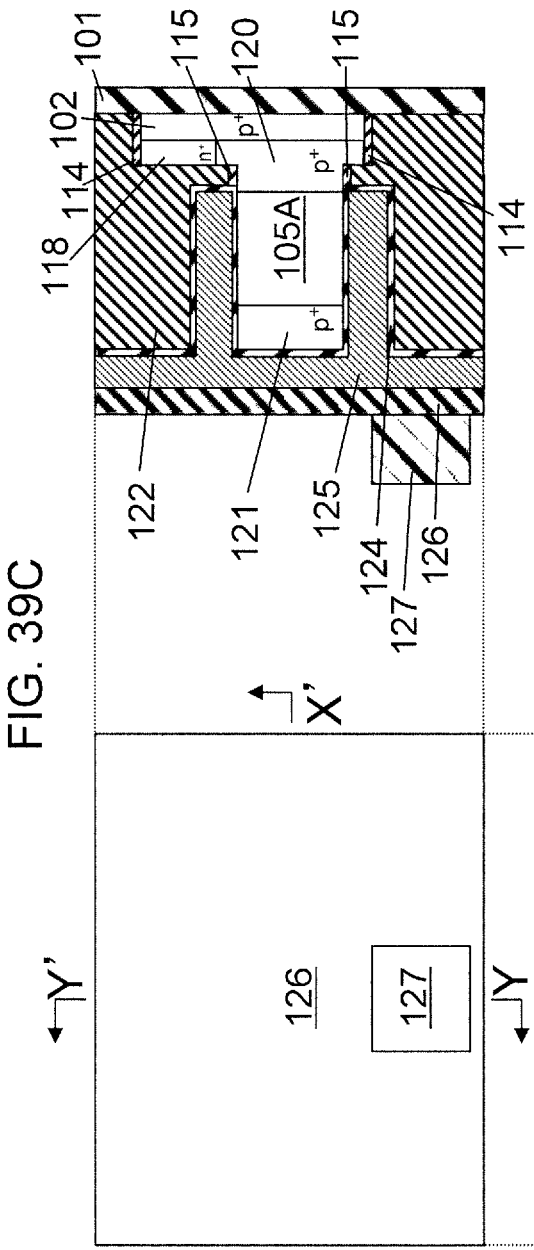
FIG. 39A is a plane view showing one example of a production process of a semiconductor device according to a first embodiment the present invention.
Figure 39C:
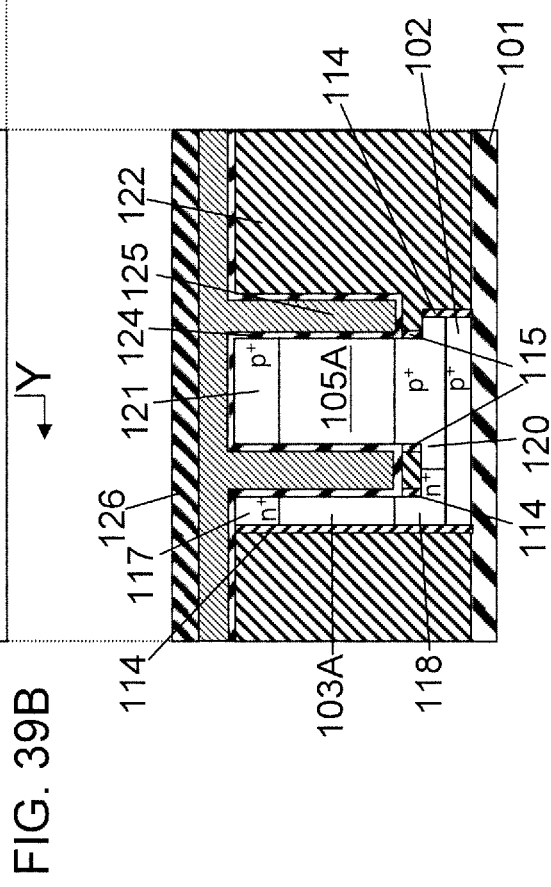
FIG. 39C is a cross-sectional view at the line Y-Y' in FIG. 39A.
Figure 39B:
FIG. 39B is a cross-sectional view at the line X-X' in FIG. 39A.

Referring to FIGS. 39A to 39C, a resist 127 for a gate pad 504 (see FIGS. 42A to 42C) is formed.

Referring to FIGS. 40A to 40C, the nitride film 126 is partially removed through etching.

Figure 41C:
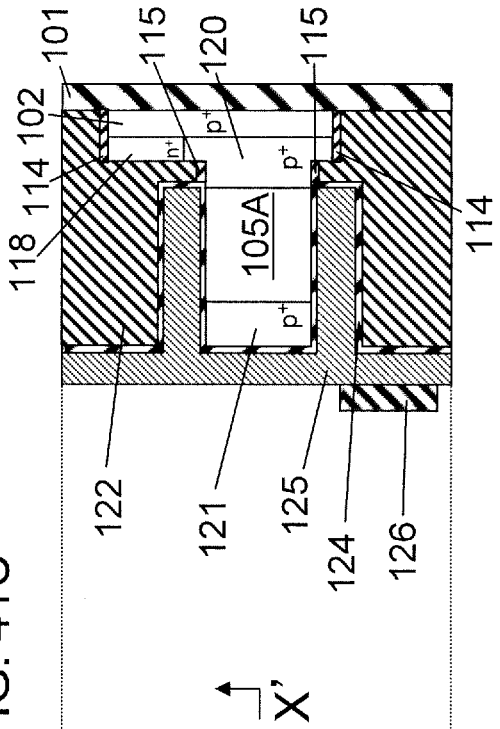
FIG. 41C is a cross-sectional view at the line Y-Y' in FIG. 41A.
Figure 41A:
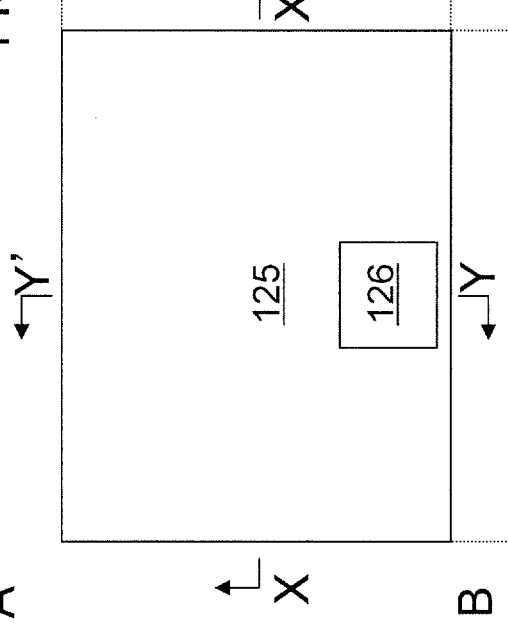
FIG. 41A is a plane view showing one example of a production process of a semiconductor device according to a first embodiment the present invention.
Figure 41B:
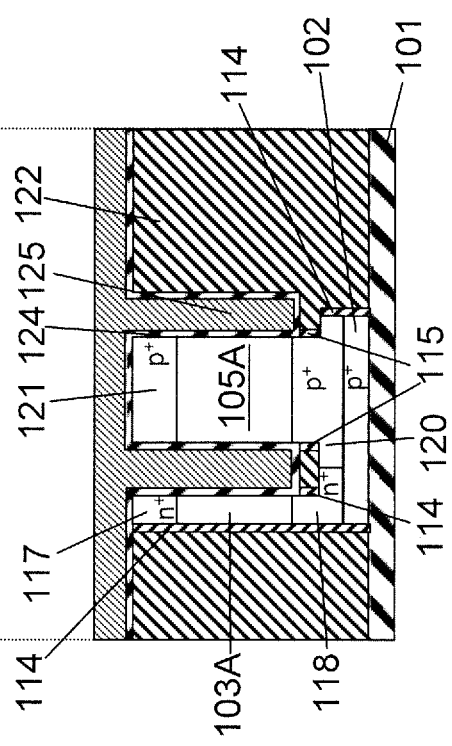
FIG. 41B is a cross-sectional view at the line X-X' in FIG. 41A.

Referring to FIGS. 41A to 41C, the resist 127 is removed.

Referring to FIGS. 42A to 42C, the metal layer 125 is partially removed through etching to form a gate electrode 125A.

Figure 43C:
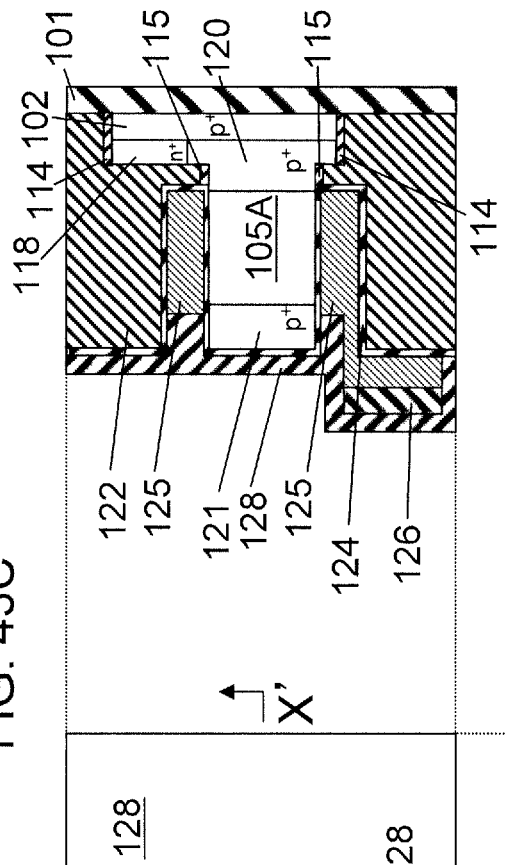
FIG. 43C is a cross-sectional view at the line Y-Y' in FIG. 43A.
Figure 43A:
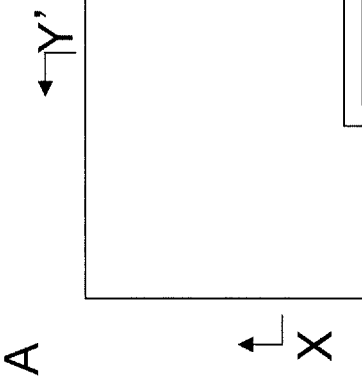
FIG. 43A is a plane view showing one example of a production process of a semiconductor device according to a first embodiment the present invention.
Figure 43B:
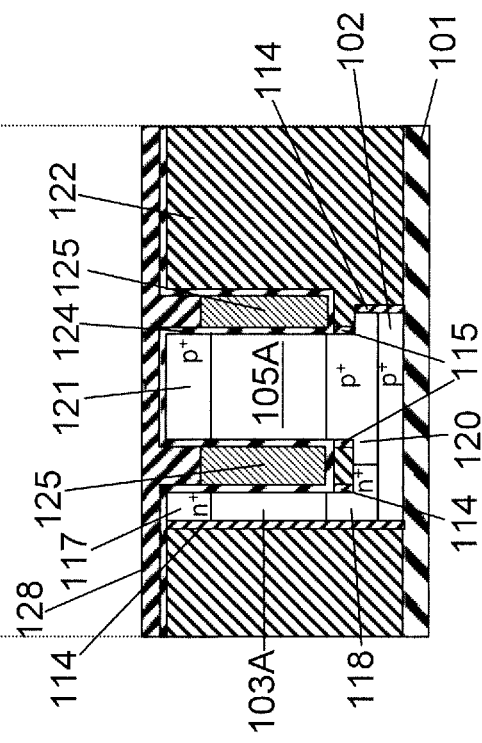
FIG. 43B is a cross-sectional view at the line X-X' in FIG. 43A.

Referring to FIGS. 43A to 43C, a nitride film 128 is formed on the result of the above step.

Figure 44A:
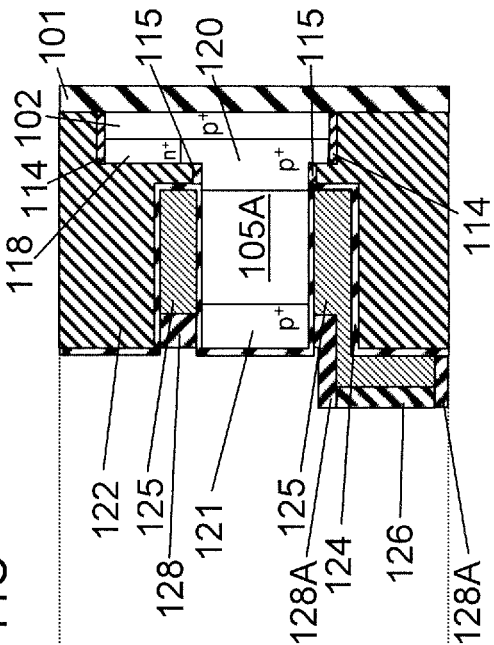
FIG. 44A is a plane view showing one example of a production process of a semiconductor device according to a first embodiment the present invention.
Figure 44B:
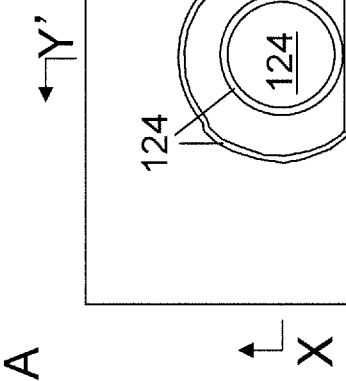
FIG. 44B is a cross-sectional view at the line X-X' in FIG. 44A.
Figure 44C:
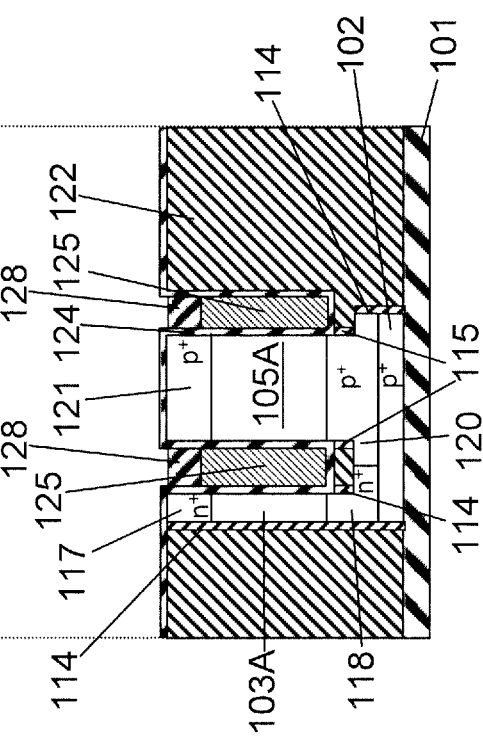
FIG. 44C is a cross-sectional view at the line Y-Y' in FIG. 44A.

Referring to FIGS. 44A to 44C, the nitride film 128 is partially removed through etching to form a nitride film sidewall 128A.

Referring to FIGS. 45A to 45C, the part of the high-K film 124 on the top surface of the above result is removed through etching. The part of the high-K film 124 remaining on the sidewall of the island-shaped silicon layer 105A is the first gate insulating film 124A, and the part of the high-K film remaining on the sidewall of the second silicon layer 103A is the second gate insulating film 124B.

Referring to FIGS. 46A to 46C, a resist 129 for etching the oxide film 122 is formed Referring to FIGS. 47A to 47C, the oxide film 122 is partially removed through dry etching.

Figure 48A:
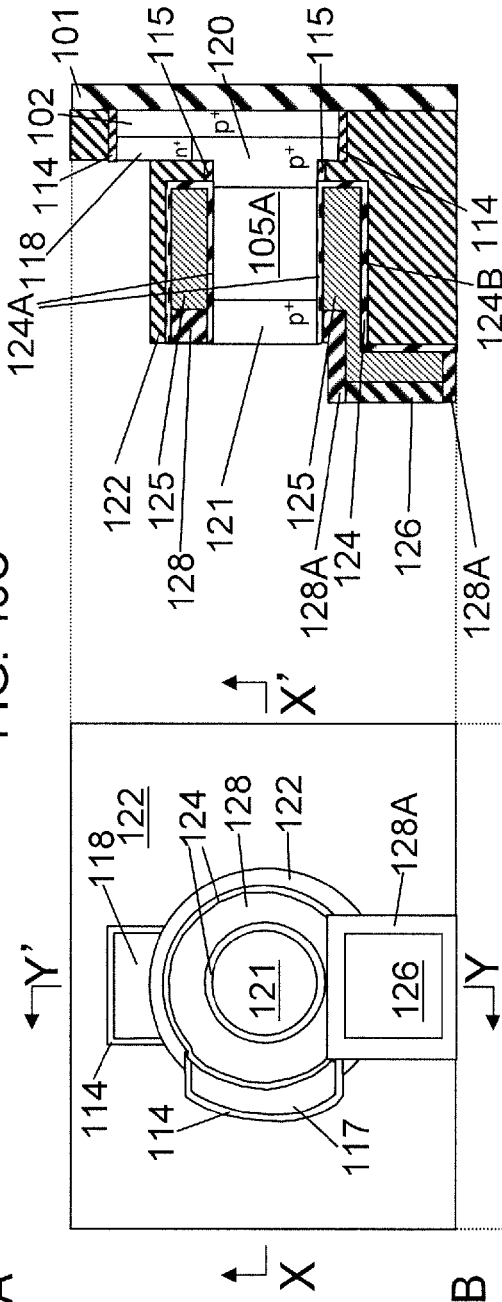
FIG. 48A is a plane view showing one example of a production process of a semiconductor device according to a first embodiment the present invention.
Figure 48C:
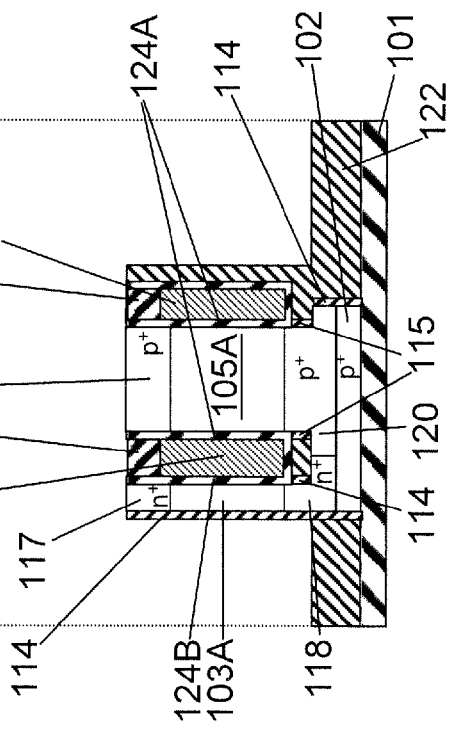
FIG. 48C is a cross-sectional view at the line Y-Y' in FIG. 48A.
Figure 48B:
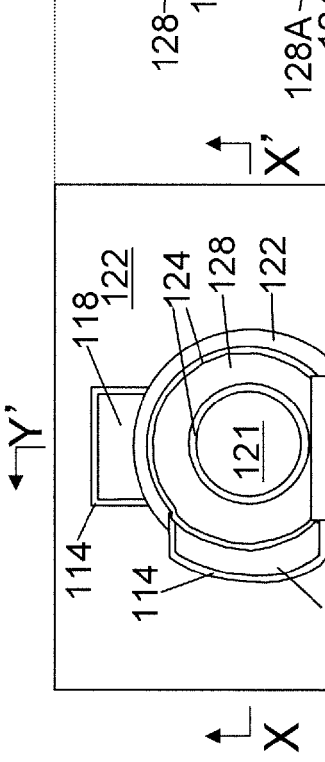
FIG. 48B is a cross-sectional view at the line X-X' in FIG. 48A.

Referring to FIGS. 48A to 48C, the resist 129 is removed.

Figures 49A, 49B, 49C:
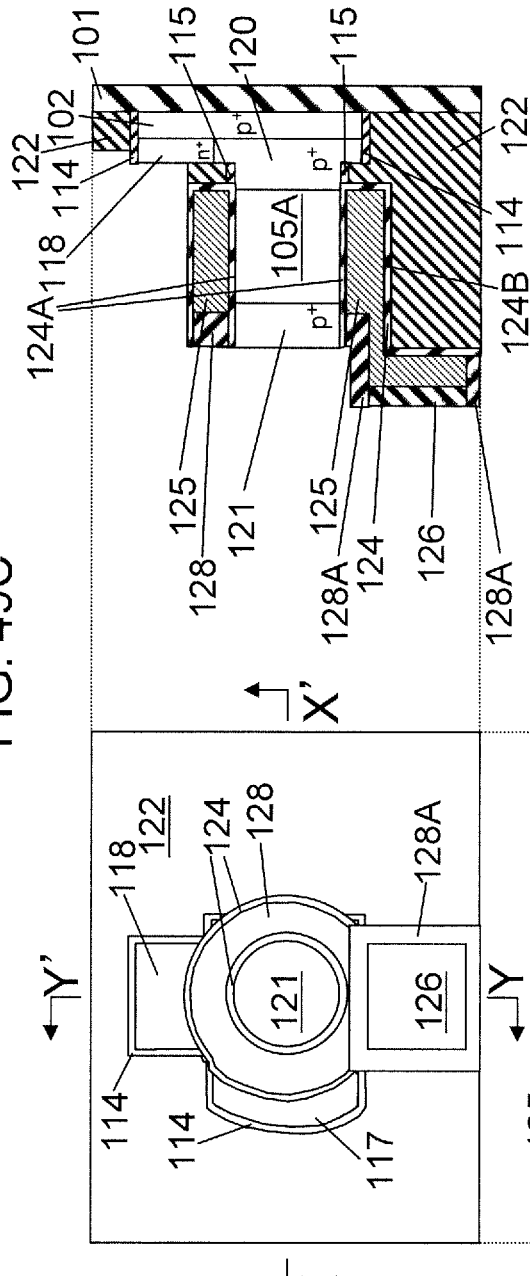
FIG. 49A is a plane view showing one example of a production process of a semiconductor device according to a first embodiment the present invention.
FIG. 49B is a cross-sectional view at the line X-X' in FIG. 49A.
FIG. 49C is a cross-sectional view at the line Y-Y' in FIG. 49A.

Referring to FIGS. 49A to 49C, the oxide film 122 is partially removed through wet etching.

Referring to FIGS. 50A to 50C, a nitride film 130 is formed on the result of the above steps.

Figures 51A, 51B, 51C:
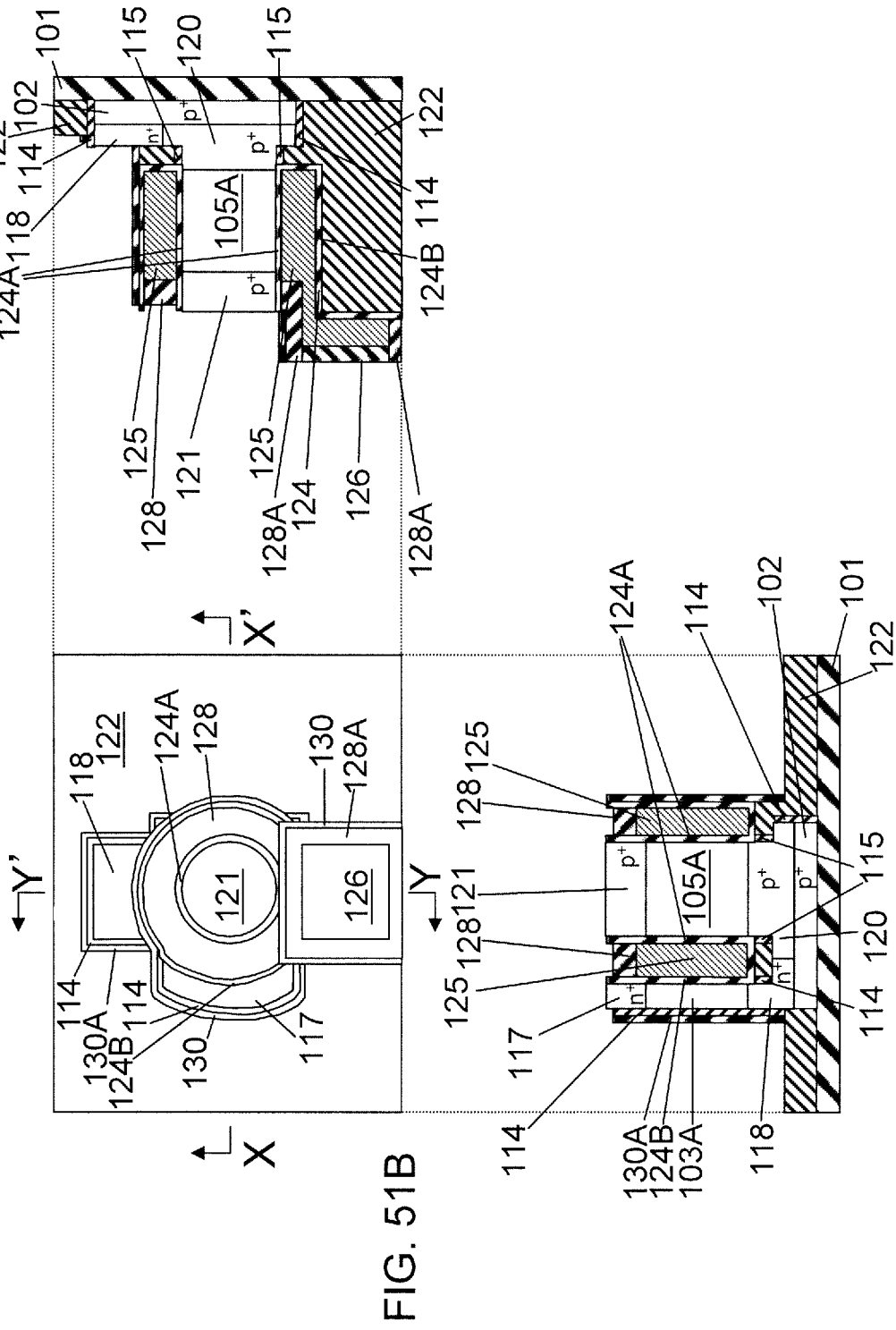
FIG. 51A is a plane view showing one example of a production process of a semiconductor device according to a first embodiment the present invention.
FIG. 51B is a cross-sectional view at the line X-X' in FIG. 51A.
FIG. 51C is a cross-sectional view at the line Y-Y' in FIG. 51A.

Referring to FIGS. 51A to 51C, the nitride film 130 is partially removed through etching to form a nitride film sidewall 130A.

Figure 52C:
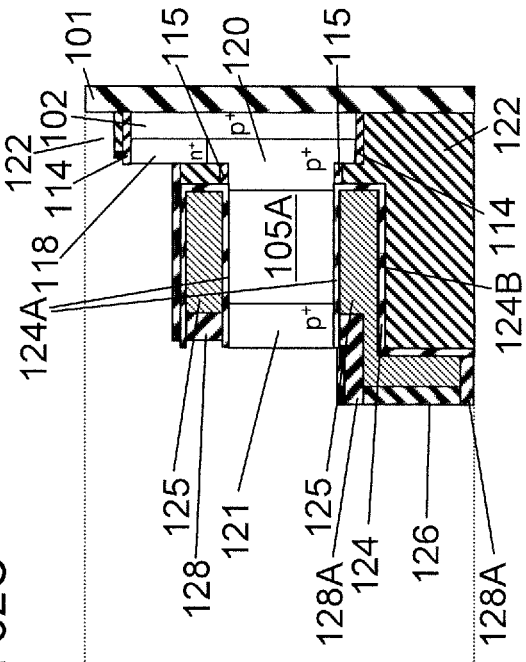
FIG. 52C is a cross-sectional view at the line Y-Y' in FIG. 52A.
Figure 52A:
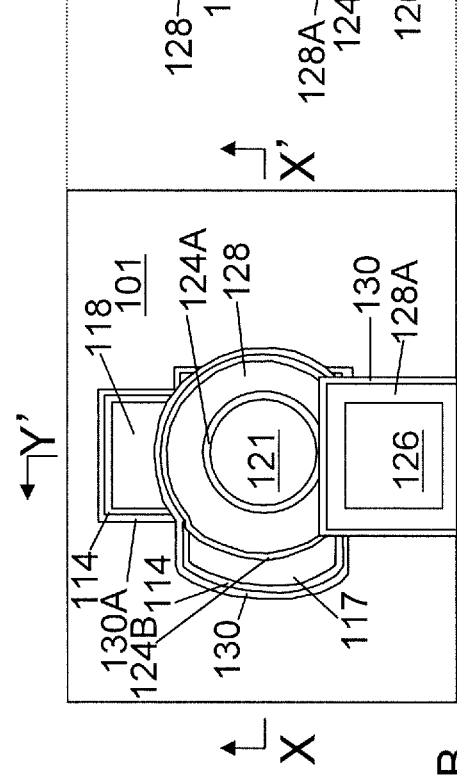
FIG. 52A is a plane view showing one example of a production process of a semiconductor device according to a first embodiment the present invention.
Figure 52B:
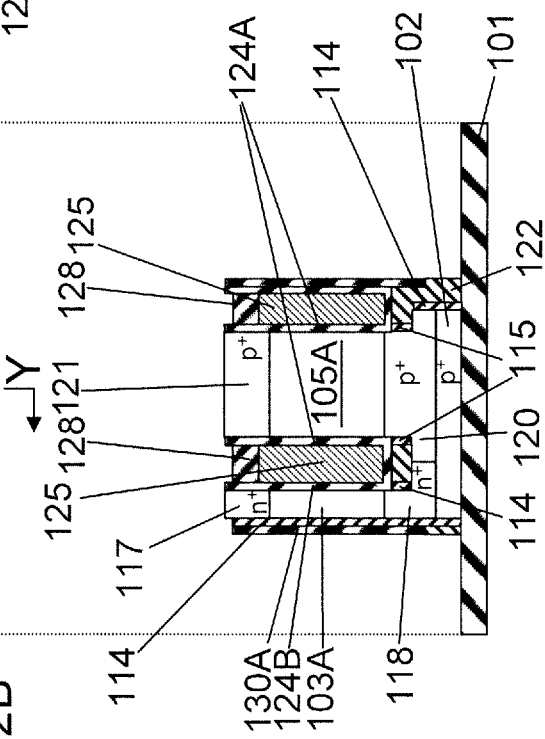
FIG. 52B is a cross-sectional view at the line X-X' in FIG. 52A.

Referring to FIGS. 52A to 52C, the oxide film 122 is partially removed through dry etching.

Referring to FIGS. 53A to 53C, the oxide film 122 is wet-etched to expose the nitride film 114.

Figure 54A:
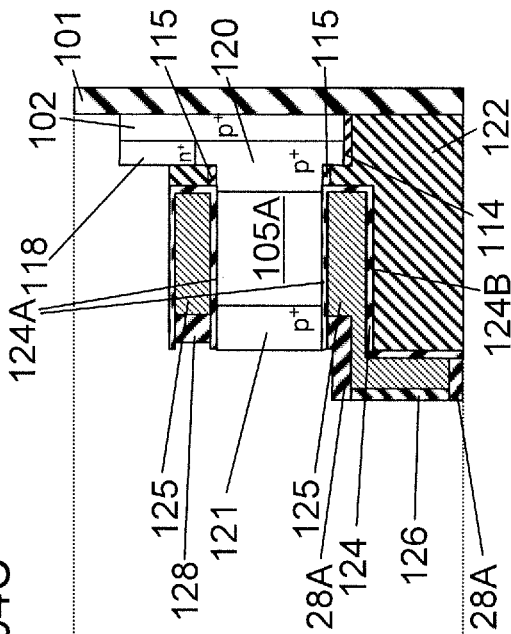
FIG. 54A is a plane view showing one example of a production process of a semiconductor device according to a first embodiment the present invention.
Figure 54B:
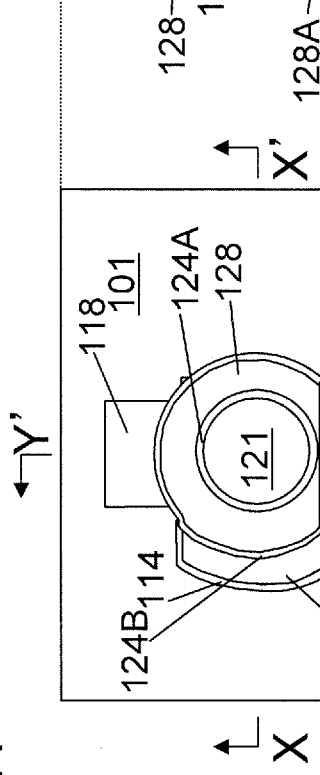
FIG. 54B is a cross-sectional view at the line X-X' in FIG. 54A.
Figure 54C:
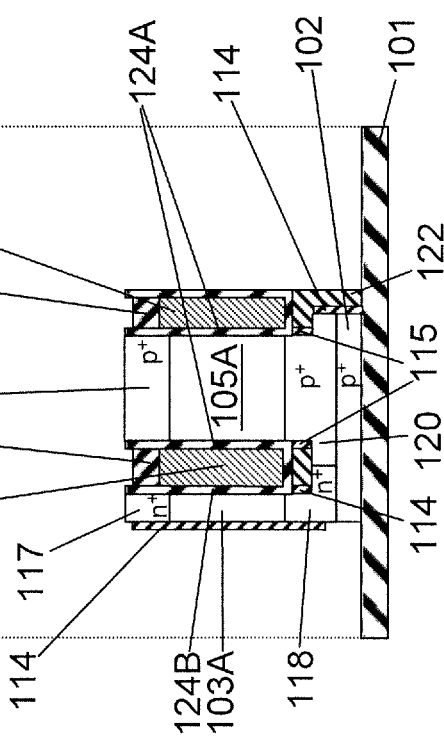
FIG. 54C is a cross-sectional view at the line Y-Y' in FIG. 54A.

Referring to FIGS. 54A to 54C, the nitride film sidewall 130A and part of the nitride film 114 are removed through etching to expose parts of the sidewalls of the second n+ type silicon layer 118 and third p+ type silicon layer 102.

Referring to FIGS. 55A to 55C, a metal film such as nickel and cobalt is deposited on parts of the sidewalls of the second n+ type silicon layer 118 and third p+ type silicon layer 102, above the first n+ type silicon layer 117, and above the first p+ type silicon layer 121, heat treatment is performed, this metal and the silicon with which it is contact are reacted and any unreacted metal film is removed. Through this, a first silicon-metal compound layer 133 and a fourth silicon-metal compound layer 134 are formed on parts of the sidewalls of the second n+ type silicon layer 118 and third p+ type silicon layer 102, a second silicon-metal compound layer 132 is formed above the first n+ type silicon layer 117, and a third silicon-metal compound layer 131 is formed above the first p+ type silicon layer 121.

Figure 56A:
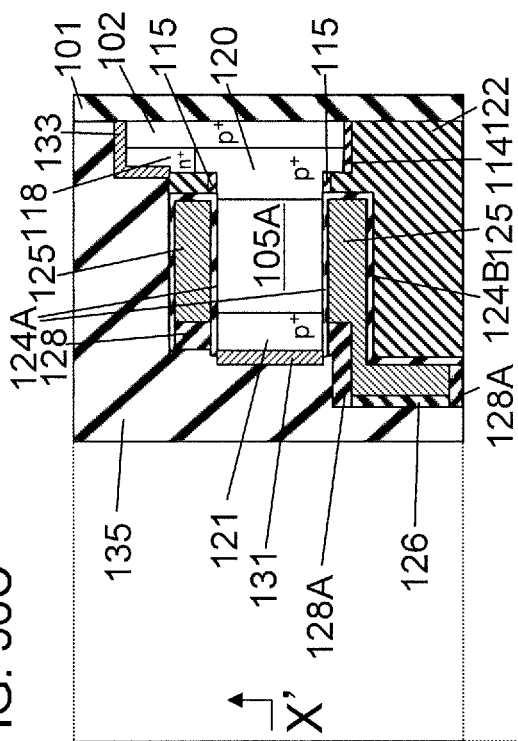
FIG. 56A is a plane view showing one example of a production process of a semiconductor device according to a first embodiment the present invention.
Figure 56C:
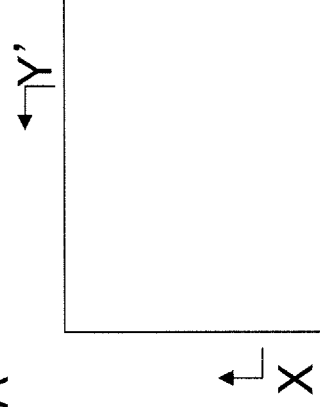
FIG. 56C is a cross-sectional view at the line Y-Y' in FIG. 56A.
Figure 56B:
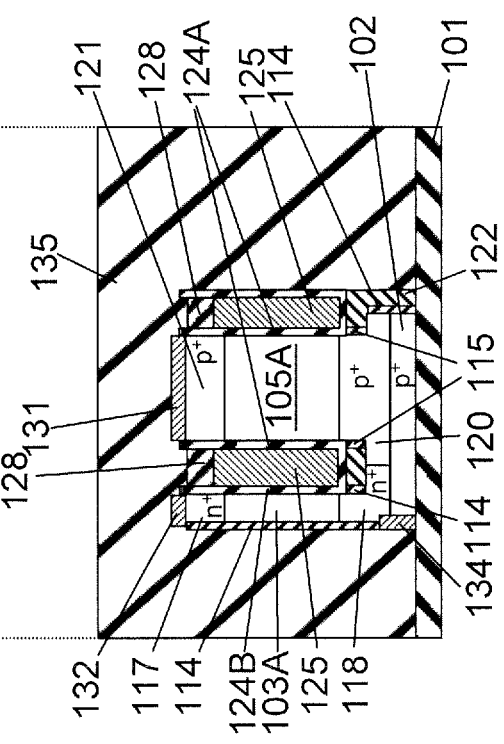
FIG. 56B is a cross-sectional view at the line X-X' in FIG. 56A.

Referring to FIGS. 56A to 56C, an interlayer film 135 composed of an oxide film or the like is formed on the result of the above steps.

Figure 57A:
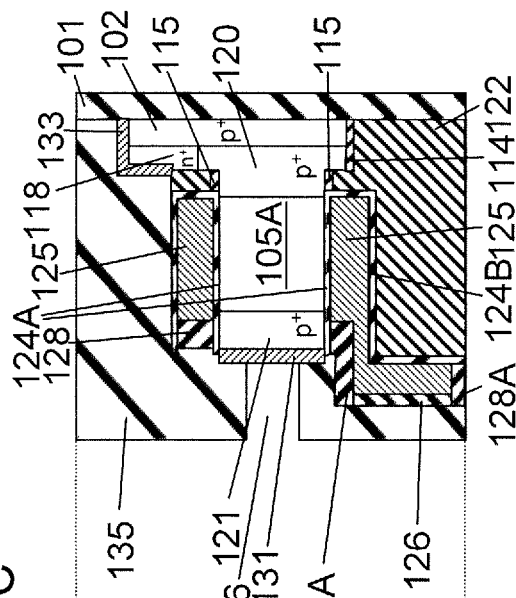
FIG. 57A is a plane view showing one example of a production process of a semiconductor device according to a first embodiment the present invention.
Figure 57B:
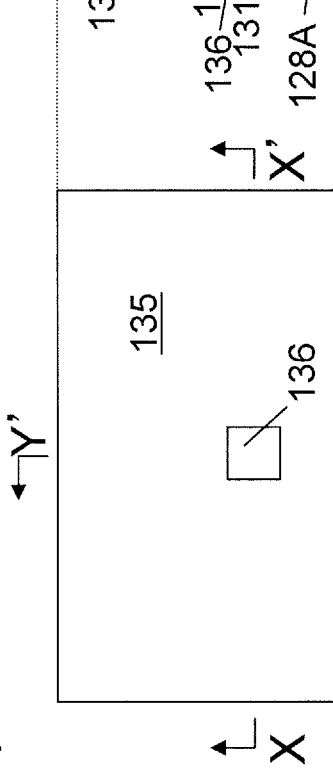
FIG. 57B is a cross-sectional view at the line X-X' in FIG. 57A.
Figure 57C:
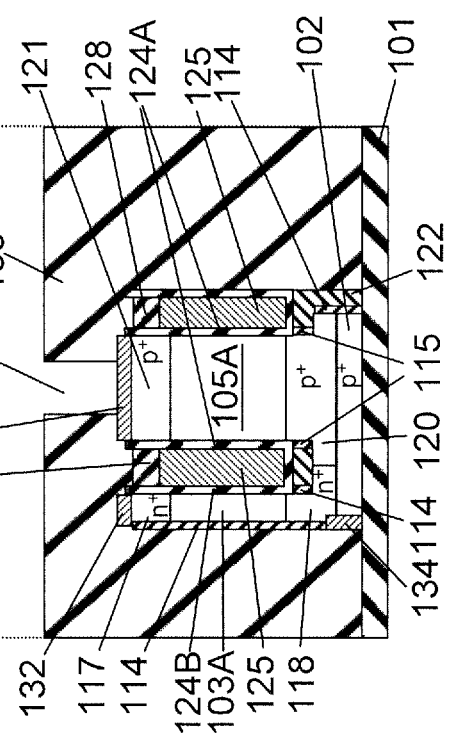
FIG. 57C is a cross-sectional view at the line Y-Y' in FIG. 57A.

Referring to FIGS. 57A to 57C, a contact hole 136 is formed above the third silicon-metal compound layer 131.

Referring to FIGS. 58A to 58C, a contact hole 137 is formed above the second silicon-metal compound layer 132 and a contact hole 138 is formed above the gate electrode 125.

Referring to FIGS. 59A to 59C, a contact hole 139 is formed so as to expose the first silicon-metal compound layer 133.

Referring to FIGS. 60A to 60C, a metal film composed of tungsten or the like is deposited in the contact holes 136, 137, 138 and 139 to form contacts 140, 141, 142, and 143.

Referring to FIG. 61A to 61C, an input terminal line 144, an output terminal line 145, a VDD power line 146, and a VSS power line 147 are formed on the result of the above steps.

FIGS. 62A, 62B, and 62C show the planar and cross-sectional structures of another embodiment of the semiconductor device of the present invention. FIG. 62A is a plane view, FIG. 62B is a cross-sectional view at the line X-X', and FIG. 62C is a cross-sectional view at the line Y-Y'.

In this embodiment, the following is formed: a first gate insulating film 270 in contact with at least a part of an island-shaped semiconductor 205; a gate electrode 225 having a surface in contact with the first gate insulating film 270; a second gate insulating film 271 in contact with another surface of the gate electrode 225; a second silicon layer 203 in contact with the second gate insulating film 271; a first p+ type silicon layer 221 arranged on the top of the island-shaped silicon layer 205; a second p+ type silicon layer 220 arranged on the bottom of the island-shaped silicon layer 205; a first n+ type silicon layer 217 arranged on the top of the second silicon layer 203; a second n+ type silicon layer 218 arranged on the bottom of the second silicon layer 203; a third p+ type silicon layer 202 arranged on the bottom of the second n+ type silicon layer 218 and second p+ type silicon layer 220; a first silicon-metal compound layer 233 formed on parts of the sidewalls of the second n+ type silicon layer 218 and third p+ type silicon layer 202, and a fourth silicon-metal compound layer 234; a second silicon-metal compound layer 232 formed on the top of the first n+ type silicon layer 217; and a third silicon-metal compound layer 231 formed on the top of the first p+ type silicon layer 221.

A contact 242 is so formed as to be connected to the gate electrode 225. An input terminal line 244 is so formed as to be connected to the contact 242.

A contact 243 is so formed as to be connected to the first silicon-metal compound layer 233. An output terminal line 245 is so formed as to be connected to the contact 243.

A contact 241 is so formed as to be connected to the second silicon-metal compound layer 232. A VSS power line 247 is so formed as to be connected to the contact 241.

A contact 240 is so formed as to be connected to the third silicon-metal compound layer 231. A VDD power line 246 is so formed as to be connected to the contact 240

FIGS. 63 to 66 show modifications of the semiconductor device of the present invention. Each of FIGS. 63 to 66 shows planar structures in part A and cross-sectional structures in parts B and C. In each figure, part A is a plane view, part B is a cross-sectional view at a line X-X', and part C is a cross-sectional view at a line Y-Y'

(Modification 1)

Figures 63A, 63B, 63C:
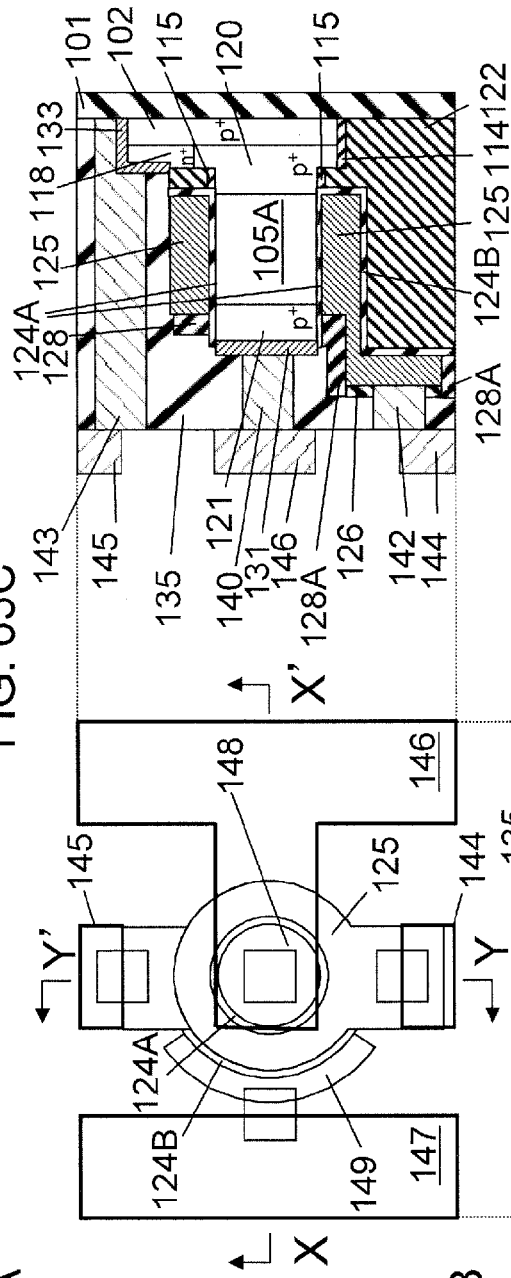
FIG. 63A is a plane view of primary elements of a semiconductor device according to a third embodiment of the present invention.
FIG. 63B is a cross-sectional view at the line X-X' in FIG. 63A.
FIG. 63C is a cross-sectional view at the line Y-Y' in FIG. 63A.

In this modification as shown in FIG. 63A, the second gate insulating film 124B is arranged between the nMOS transistor 149 and gate electrode 125 in the area where the nMOS transistor 149 having an arc-shaped cross-section surrounds the gate electrode 125. In this point, the embodiment in FIG. 63 is different from the embodiment in FIG. 1. In this way, the gate insulating film can be minimized insofar as the nMOS transistor does not make contact with the gate electrode.

(Modification 2)

Figure 64C:
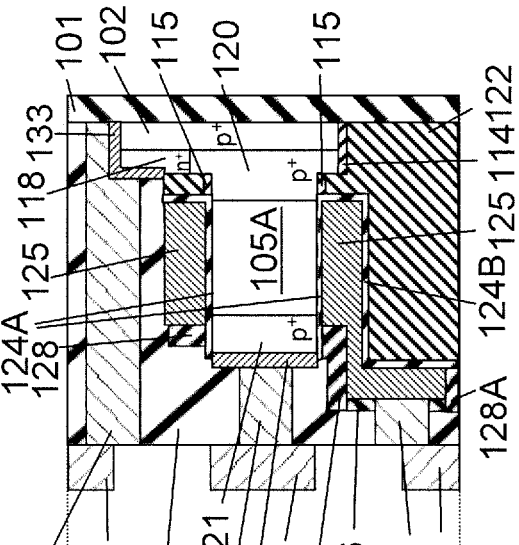
FIG. 64C is a cross-sectional view at the line Y-Y' in FIG. 64A.
Figure 64A:
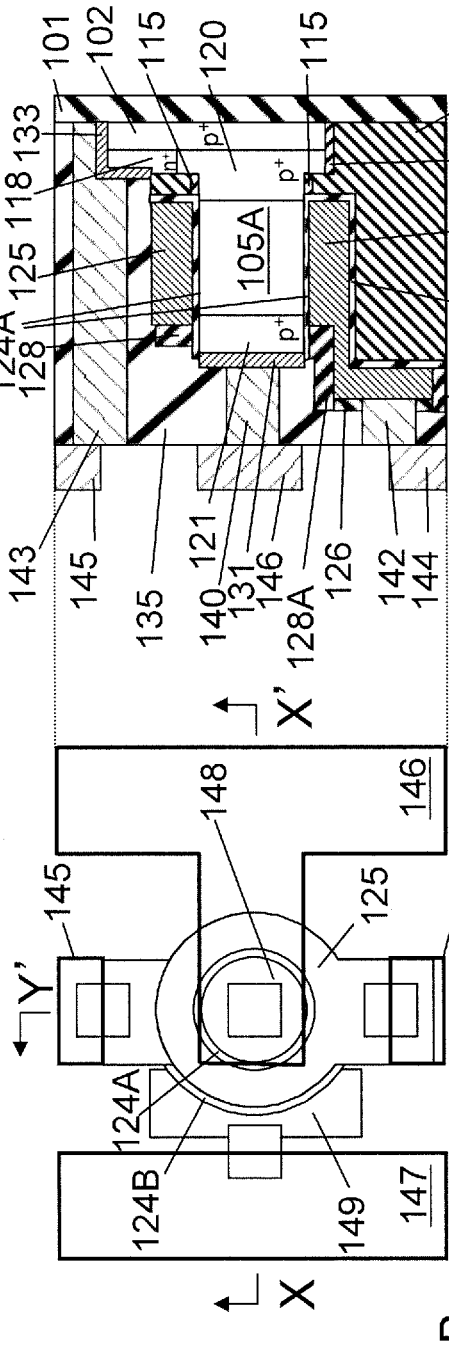
FIG. 64A is a plane view of primary elements of a semiconductor device according to a fourth embodiment of the present invention.
Figure 64B:
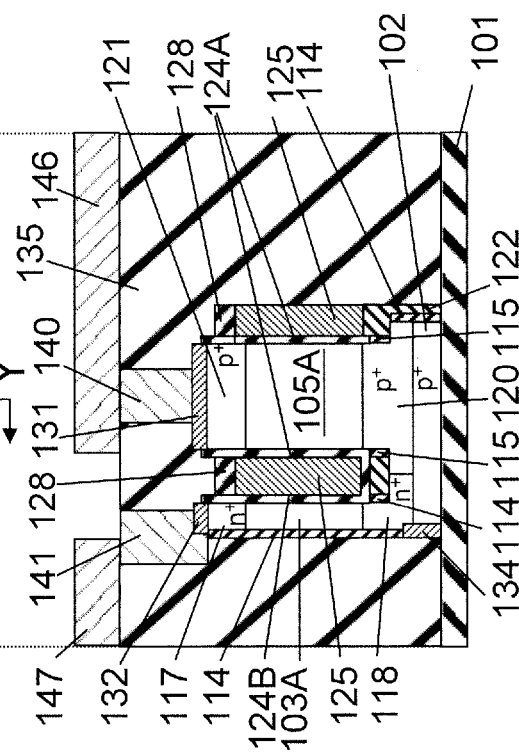
FIG. 64B is a cross-sectional view at the line X-X' in FIG. 64A.

In the modification, as shown in FIG. 64A, the nMOS transistor 149 has a rectangular cross-section. Furthermore, the second gate insulating film 124B is arranged between the nMOS transistor 149 and gate electrode 125 in the area where the nMOS transistor 149 surrounds the gate electrode 125. In these points, the embodiment in FIG. 64 is different from the embodiment in FIG. 1

(Modification 3)

In this modification, as shown in FIG. 65A, the pMOS transistor 148 and gate electrode 125 have a square cross-section, not a circular cross-section. Furthermore, the second gate insulating film 124B is arranged between the nMOS transistor 149 and gate electrode 125 in the area where the nMOS transistor 149 surrounds the gate electrode 125. In these points, the embodiment in FIG. 65 is different from the embodiment in FIG. 1. Here, the pMOS transistor 148 and gate electrode 125 can have a polygonal cross-section besides the aforementioned square.

(Modification 4)

In this modification, as shown in FIG. 66A, the nMOS transistor 149 has a circular cross-section. Furthermore, the second gate insulating film 124B is arranged between the nMOS transistor 149 and gate electrode 125 in the area where the nMOS transistor 149 surrounds the gate electrode 125. In these points, the embodiment in FIG. 66 is different from the embodiment in FIG. 1.

In the above embodiments, an inverter was described as an example of the semiconductor device using SGTs of the present invention, but the present invention is not limited to this and can be applied to other types of semiconductor devices.

In addition, the shapes of the members are arbitrary, and naturally appropriate variations to the specific structure of parts are possible.

Having described and illustrated the principles of this application by reference to one (or more) preferred embodiment(s), it should be apparent that the preferred embodiment(s) may be modified in arrangement and detail without departing from the principles disclosed herein and that it is intended that the application be construed as including all such modifications and variations insofar as they come within the spirit and scope of the subject matter disclosed herein.

What is claimed is:

1. A method of producing a semiconductor device serving as an inverter, the device comprising a first transistor and a second transistor, wherein the first transistor includes:
   an island-shaped silicon layer comprising an n-type or non-doped silicon layer;
   a first gate insulating film surrounding the periphery of the island-shaped silicon layer;
   a gate electrode surrounding the periphery of the first gate insulting film;
   a first p+ silicon layer on a top of the island-shaped silicon layer; and
   a second p+ silicon layer arranged on a bottom of the island-shaped silicon layer, and
   the second transistor includes:
   the gate electrode;
   a second gate insulating film surrounding a part of the periphery of the gate electrode;
   a second silicon layer in contact with only a part of the periphery of the second gate insulating film, the second silicon layer comprising a p-type or non-doped silicon layer;
   a first n+ silicon layer on a top of the second silicon layer; and
   a second n+ silicon layer on a bottom of the second silicon layer;
   the method comprising implanting boron in to form a third p+ type silicon layer below the second n+type layer and the second p+ type silicon layer.

2. The method according to claim 1, wherein implanting boron further includes implanting phosphorus in the p-type or non-doped silicon layer to form an area that supports the island-shaped silicon layer.

3. The method according to claim 1, further including:
   forming a first oxide film and forming a first nitride film, etching the first nitride film and the first oxide film and leaving a residue thereof above an area that supports the island-shaped silicon layer;
   forming a second oxide film and etching the second oxide film to leave a portion of the second oxide film in a sidewall shape on sidewalls of the first oxide film and the first nitride film;
   forming a second nitride film and etching the second nitride film to leave a portion of the second nitride film in a sidewall shape on a sidewall of the second oxide film;
   etching the second nitride film and leaving a residue thereof as a hard mask above the area that supports the second silicon layer; and
   etching the second oxide film to leave a part thereof above an area that supports the first transistor and the second transistor.

4. The method according to claim 3, further including etching an area that supports the p-type or non-doped silicon layer and the area that supports the island-shaped silicon layer to form an output terminal, the island-shaped silicon layer, and the second silicon layer.

5. The method according to claim 4, further including:
   removing the second nitride film and the second oxide film;
   forming a third nitride film, and etching the third nitride film to leave the a portion of the third nitride film in a sidewall shape on sidewalls of the island-shaped silicon layer and the second silicon layer, respectively;
   implanting arsenic to form a first n+ type silicon layer and a second n+ type silicon layer, respectively, on the top and the bottom of the second silicon layer; and
   implanting boron to form a first p+ type silicon layer and a second p+ type silicon layer, respectively, on the top and the bottom of the island-shaped silicon layer.

6. The method according to claim 5, further including:

forming, flattening and etching a third oxide film to expose the first n+ type silicon layer and the first p+ type silicon layer;

etching the third oxide film in an area that supports the gate part;

etching the third nitride film from the sidewall of the island-shaped silicon layer and the sidewall of the second silicon layer facing the sidewall;

forming a high-K film and forming a metal layer on a top of the high-K film;

forming a forth nitride film above the metal film; and etching the forth nitride film and the metal film to form a gate pad and the gate electrode.

7. The method according to claim 6, further including:

forming a fifth nitride film and etching the fifth nitride film to leave a portion of the fifth nitride film in a sidewall shape;

etching the high-K film to leave a portion of the high-K film on sidewalls of the island-shaped silicon layer and the second silicon layer;

etching the third oxide film to remove a part thereof;

forming a sixth nitride film and etching the sixth nitride film to leave a portion of the sixth nitride film in a sidewall shape;

etching the third nitride film to expose the third nitride film left in the sidewall on the second silicon layer;

etching a part of the third nitride film on the second silicon layer to expose parts of the sidewalls of the second n+ type silicon layer and the third p+ type silicon layer; and depositing a metal film of nickel or cobalt above parts of the sidewalls of the second n+ type silicon layer and the third p+ type silicon layer, above the first n+ type silicon layer and above the first p+ type silicon layer, and performing a heat treatment, causing a reaction between the metal film of nickel or cobalt and the silicon in contact therewith, and removing the unreacted the metal film of nickel or cobalt, thereby forming a first silicon-metal compound layer and a fourth silicon-metal compound layer on parts of the sidewalls of the second n+ type silicon layer and the third p+ type silicon layer, forming a second silicon-metal compound layer on the top of the first n+ type silicon layer, and forming a third silicon-metal compound layer on the top of the first p+ type silicon layer.

8. The method according claim 7, further including:

forming a forth oxide film as an interlayer film;

forming a first contact hole above the third silicon-metal compound layer, forming a second contact hole above the second silicon-metal compound layer and a third contact hole above the gate electrode;

forming a fourth contact hole to expose the first silicon-metal compound layer;

depositing a tungsten film in the first to fourth contact holes to form contacts; and forming an input terminal line, an output terminal line, a VDD power line, and a VSS power line.

* * * * *